(12) United States Patent
Muto et al.

(10) Patent No.: US 9,153,563 B2
(45) Date of Patent: Oct. 6, 2015

(54) ELECTRONIC DEVICE

(71) Applicant: Renesas Electronics Corporation, Kawasaki-shi, Kanagawa (JP)

(72) Inventors: Akira Muto, Kanagawa (JP); Takafumi Furukawa, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/472,814

(22) Filed: Aug. 29, 2014

(65) Prior Publication Data

US 2015/0060940 A1  Mar. 5, 2015

(30) Foreign Application Priority Data

Sep. 2, 2013 (JP) ................................. 2013-181591

(51) Int. Cl.
*H01L 25/16* (2006.01)
*H01L 27/06* (2006.01)
(Continued)

(52) U.S. Cl.
CPC ........ *H01L 25/162* (2013.01); *H01L 23/49524* (2013.01); *H01L 23/49562* (2013.01); *H01L 23/49568* (2013.01); *H01L 23/49575* (2013.01); *H01L 24/34* (2013.01); *H01L 25/115* (2013.01);
(Continued)

(58) Field of Classification Search
CPC . H01L 27/0635; H01L 29/861; H01L 29/739; H01L 23/49575; H01L 23/49562; H01L 23/49524; H01L 23/49568; H01L 23/49541; H01L 24/34; H01L 25/115; H01L 25/18; H01L 25/165; H01L 25/162; H01L 2224/40137; H01L 2224/48091; H01L 2224/48247; H01L 2224/73265; H01L 2224/40245; H01L 2224/73221; H01L 2224/73263; H01L 2224/92246; H01L 2224/92247; H01L 2924/1305; H01L 2924/13091; H01L 2924/00014; H01L 2924/00; H02M 7/003
See application file for complete search history.

(56) References Cited

U.S. PATENT DOCUMENTS 7,710,739 B2 *  5/2010  Kimura et al. ................. 361/767
8,017,440 B2 *  9/2011  Machida ....................... 438/109
(Continued)

FOREIGN PATENT DOCUMENTS

EP    2 190 015 A1    5/2010
JP    2008-021796 A   1/2008
(Continued)

OTHER PUBLICATIONS

Extended European Search Report issued Jul. 23, 2015, in European Patent Application No. EP14180144.9.

*Primary Examiner* — Nikolay Yushin
(74) *Attorney, Agent, or Firm* — Miles & Stockbridge P.C.

(57) ABSTRACT

An improvement is achieved in the performance of an electronic device. A first semiconductor device and a second semiconductor device are mounted over the upper surface of a wiring board such that, e.g., in plan view, the orientation of the second semiconductor device intersects the orientation of the first semiconductor device. That is, the first semiconductor device is mounted over the upper surface of the wiring board such that a first emitter terminal and a first signal terminal are arranged along an x-direction in which the pair of shorter sides of the wiring board extend. On the other hand, the second semiconductor device is mounted over the upper surface of the wiring board such that a second emitter terminal and a second signal terminal are arranged along a y-direction in which the pair of longer sides of the wiring board extend.

18 Claims, 32 Drawing Sheets

(51) Int. Cl.
*H01L 29/739* (2006.01)
*H01L 29/861* (2006.01)
*H01L 23/495* (2006.01)
*H01L 25/11* (2006.01)
*H01L 25/18* (2006.01)
*H02M 7/00* (2006.01)
*H01L 23/00* (2006.01)

(52) U.S. Cl.
CPC .............. *H01L 25/165* (2013.01); *H01L 25/18* (2013.01); *H01L 27/0635* (2013.01); *H01L 29/739* (2013.01); *H01L 29/861* (2013.01); *H02M 7/003* (2013.01); *H01L 23/49541* (2013.01); *H01L 2224/40137* (2013.01); *H01L 2224/40245* (2013.01); *H01L 2224/48091* (2013.01); *H01L 2224/48247* (2013.01); *H01L 2224/73221* (2013.01); *H01L 2224/73263* (2013.01); *H01L 2224/73265* (2013.01); *H01L 2224/92246* (2013.01); *H01L 2224/92247* (2013.01); *H01L 2924/1305* (2013.01); *H01L 2924/13055* (2013.01); *H01L 2924/13091* (2013.01)

(56) References Cited

U.S. PATENT DOCUMENTS

| | | | |
|---|---|---|---|
| 8,138,600 | B2 | 3/2012 | Muto et al. |
| 8,232,629 | B2 | 7/2012 | Koike et al. |
| 8,339,079 | B2 | 12/2012 | Yamada |
| 2002/0195286 | A1 | 12/2002 | Shirakawa et al. |
| 2006/0244741 | A1* | 11/2006 | Kimura et al. ................. 345/204 |
| 2007/0246812 | A1 | 10/2007 | Zhuang |
| 2008/0012045 | A1 | 1/2008 | Muto et al. |
| 2010/0124027 | A1 | 5/2010 | Handelsman et al. |
| 2011/0081750 | A1* | 4/2011 | Machida ........................ 438/123 |
| 2011/0089558 | A1 | 4/2011 | Muto et al. |

FOREIGN PATENT DOCUMENTS

| | | |
|---|---|---|
| JP | 2008-060256 A | 3/2008 |
| JP | 2009-158787 A | 7/2009 |
| JP | 2011-086889 A | 4/2011 |
| WO | WO 2012/051704 A1 | 4/2012 |

\* cited by examiner

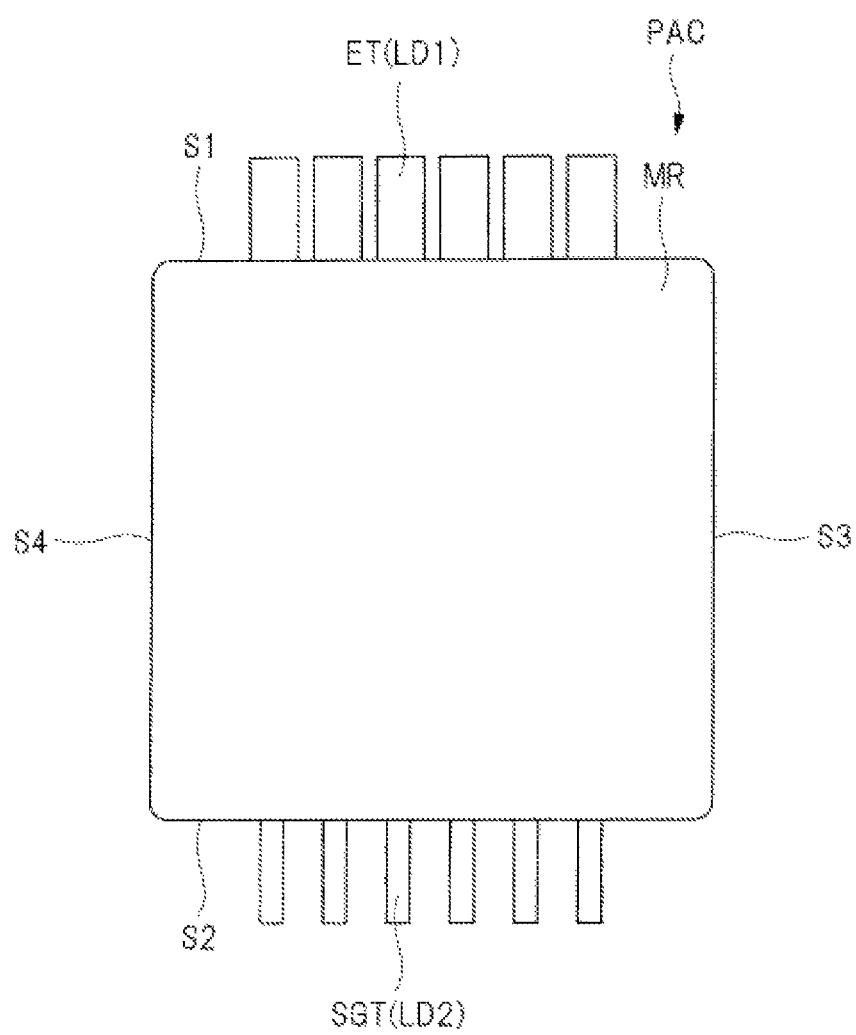

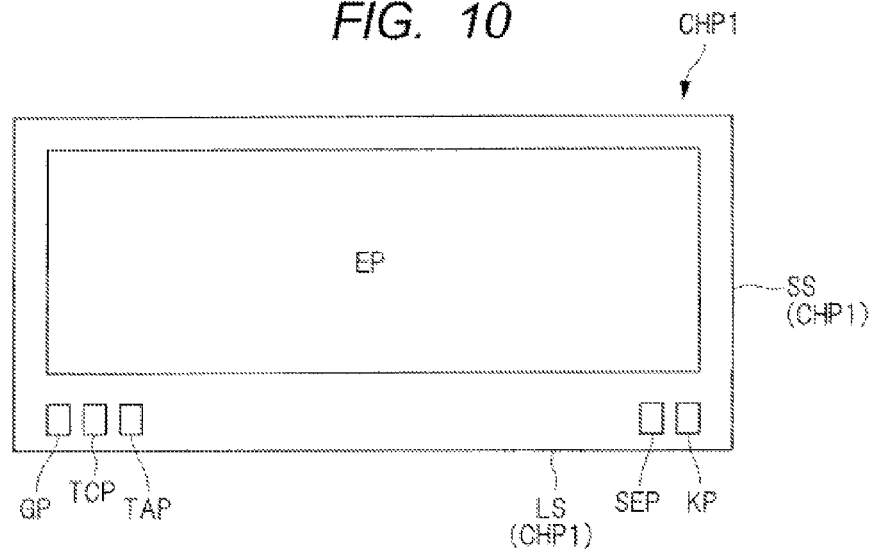
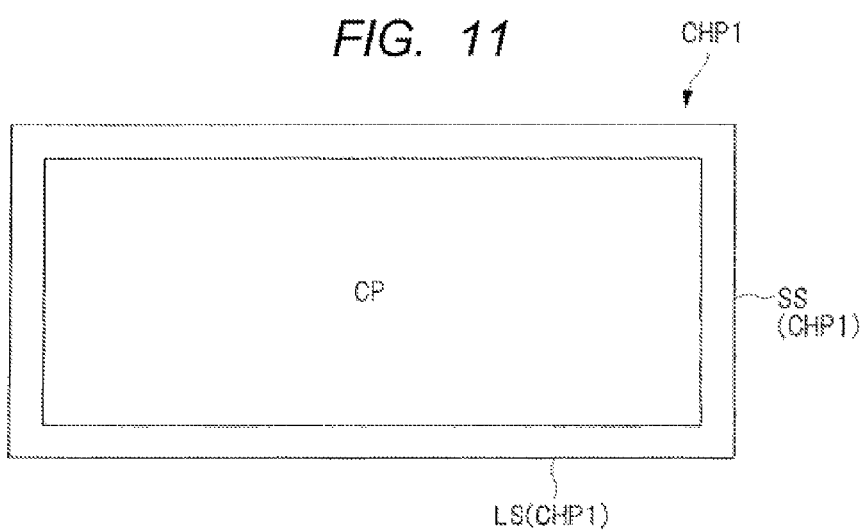

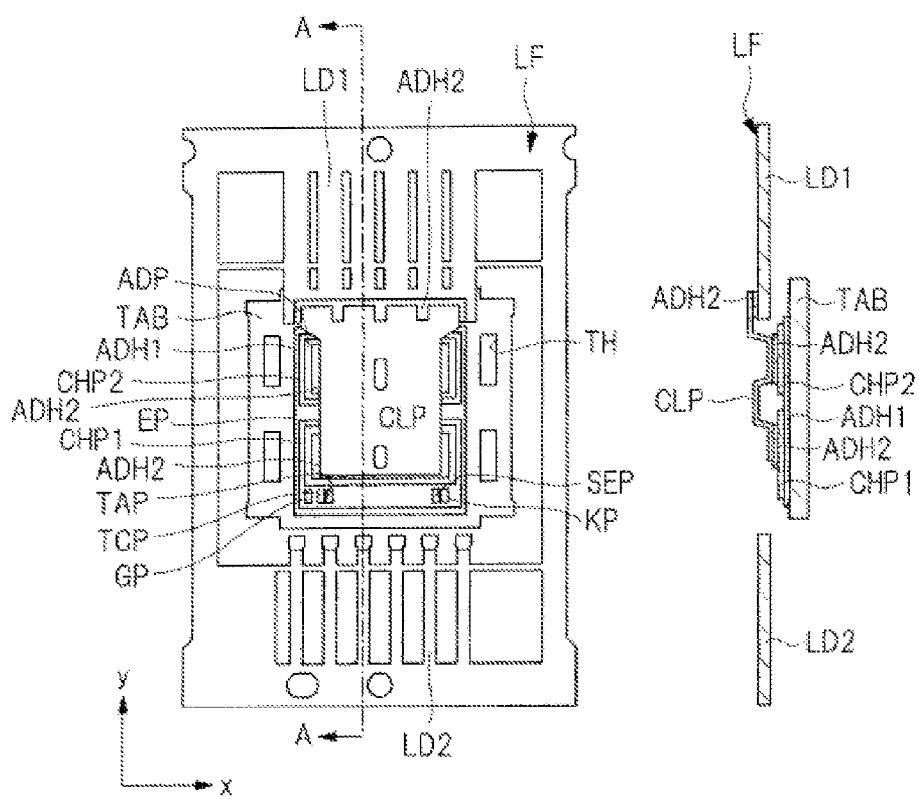

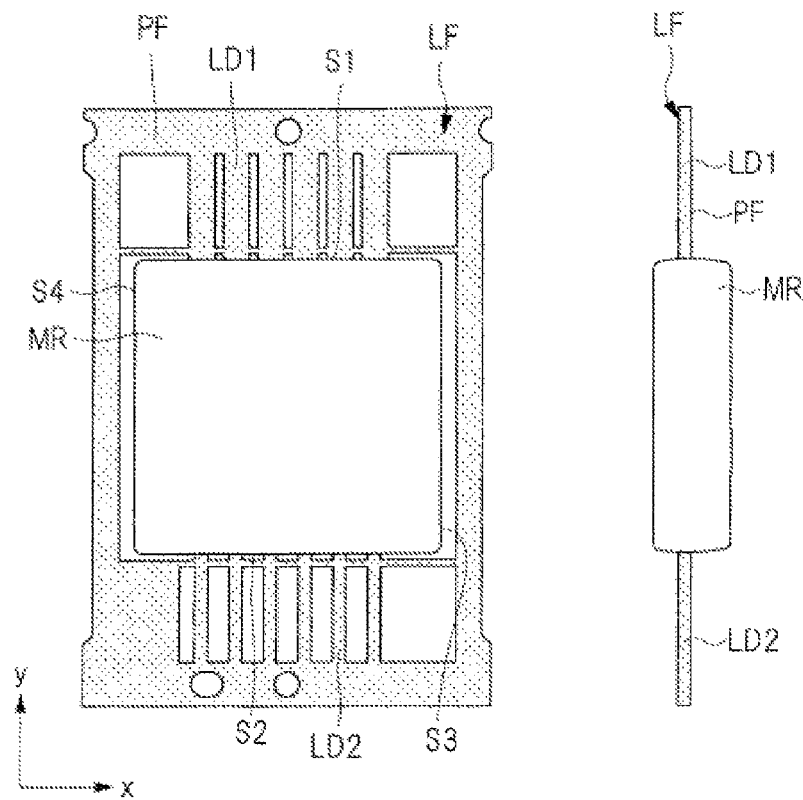

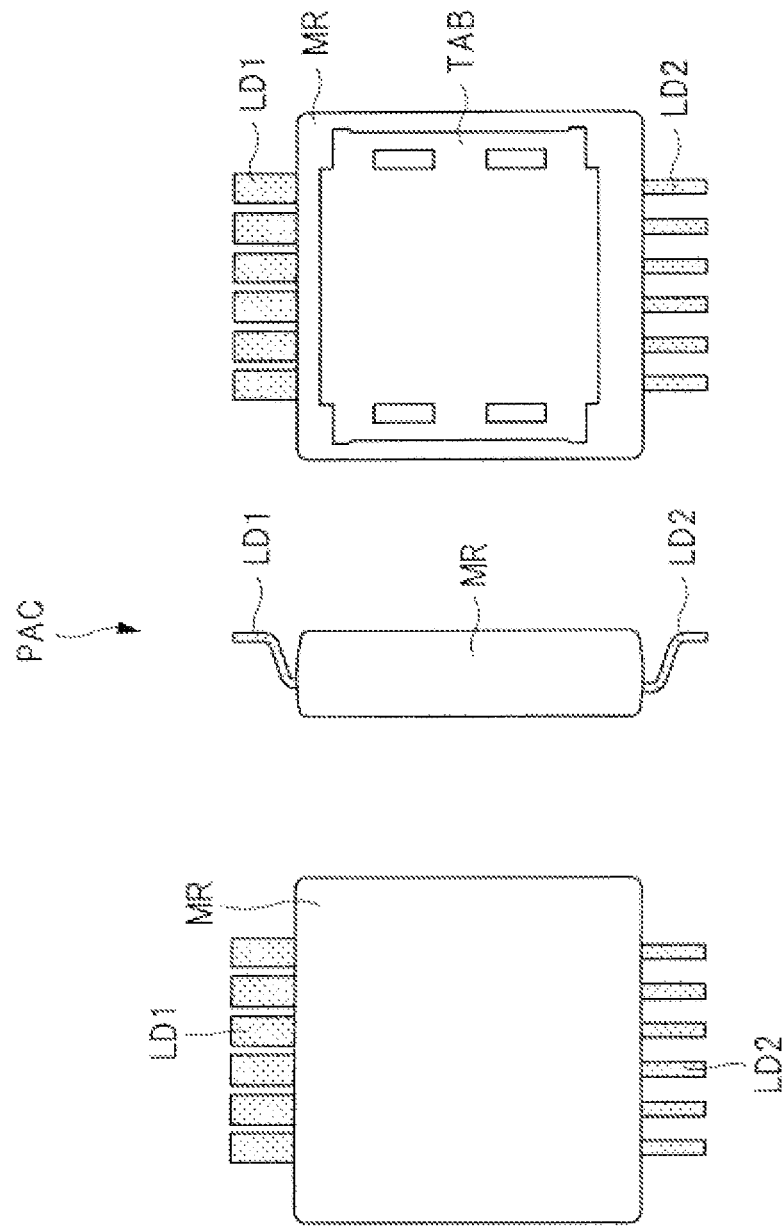

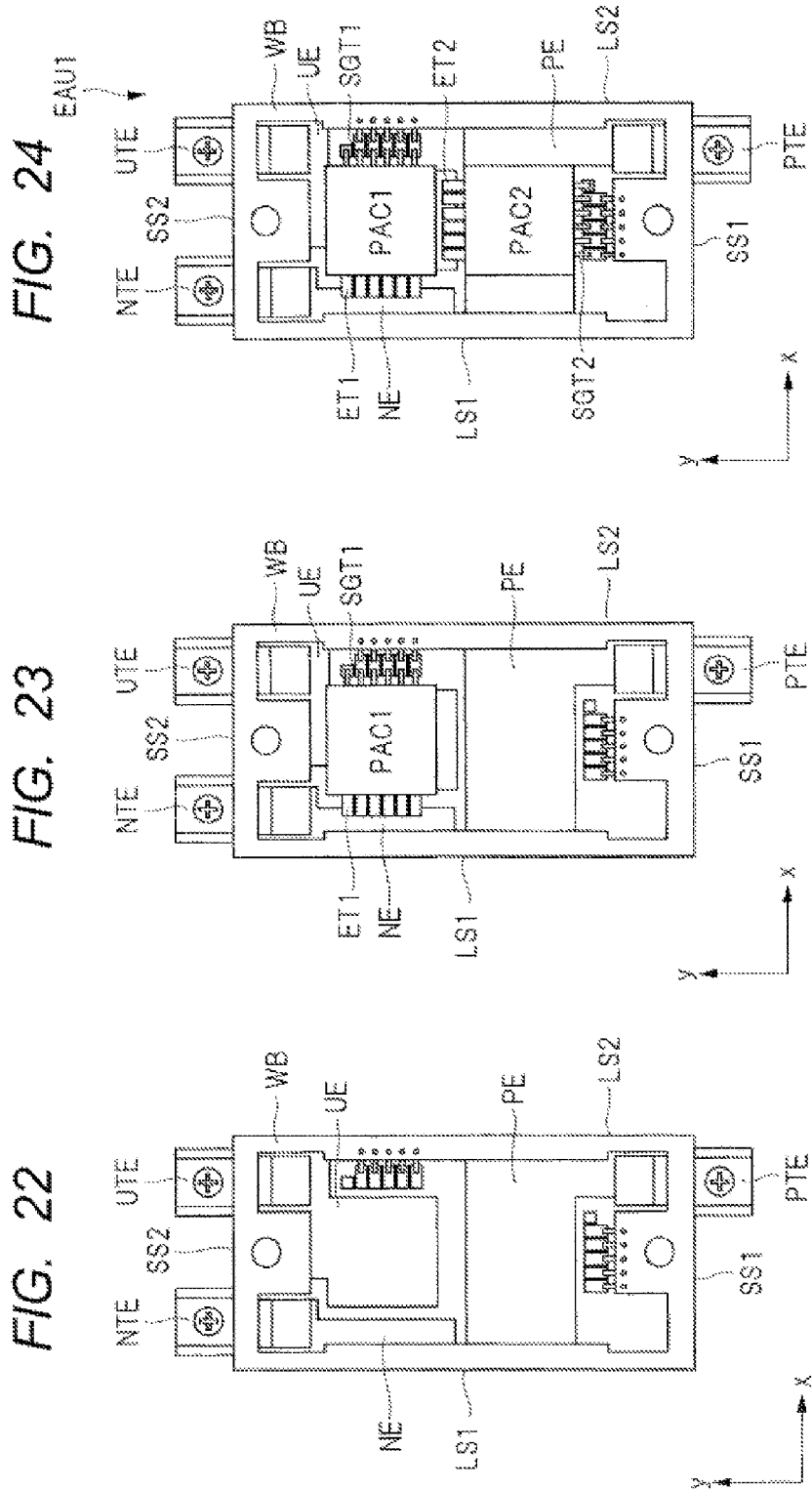

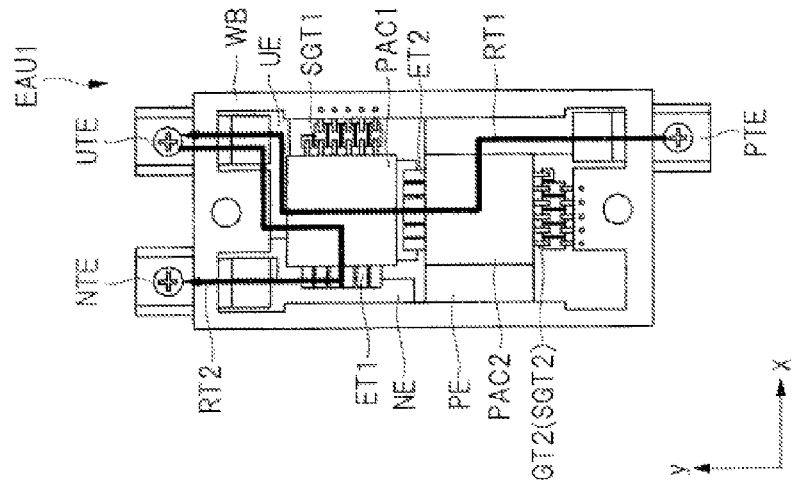
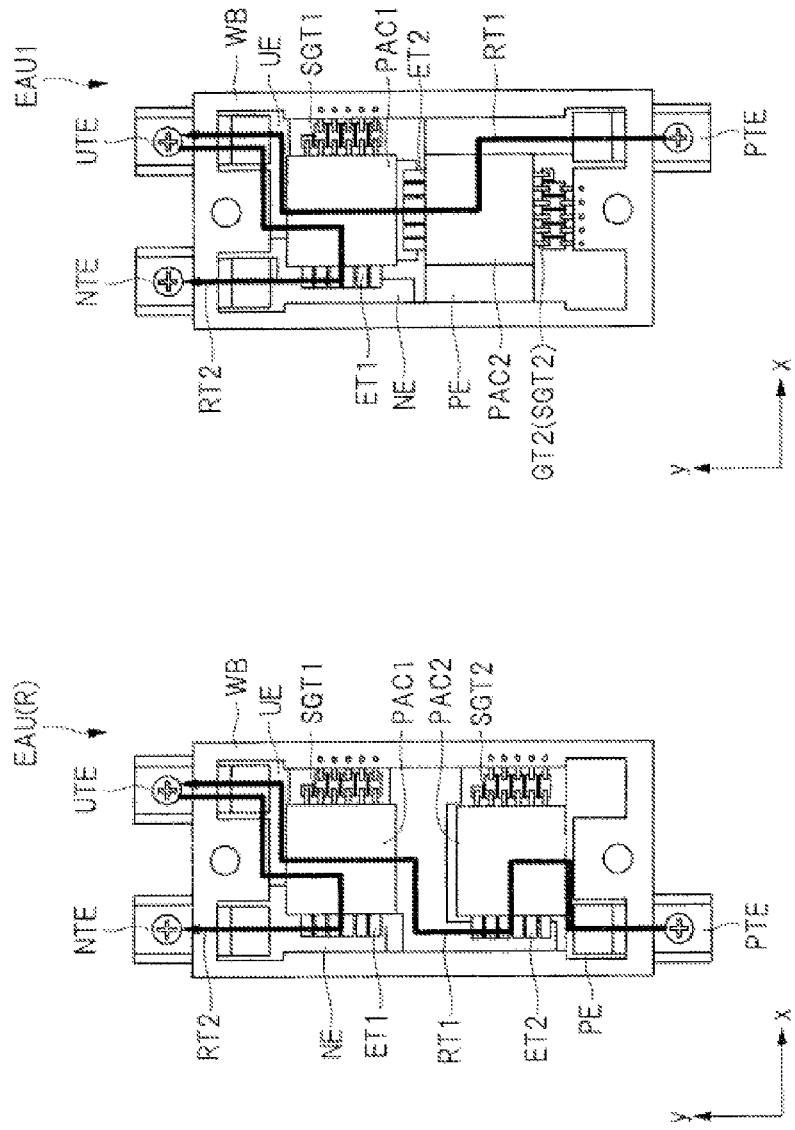

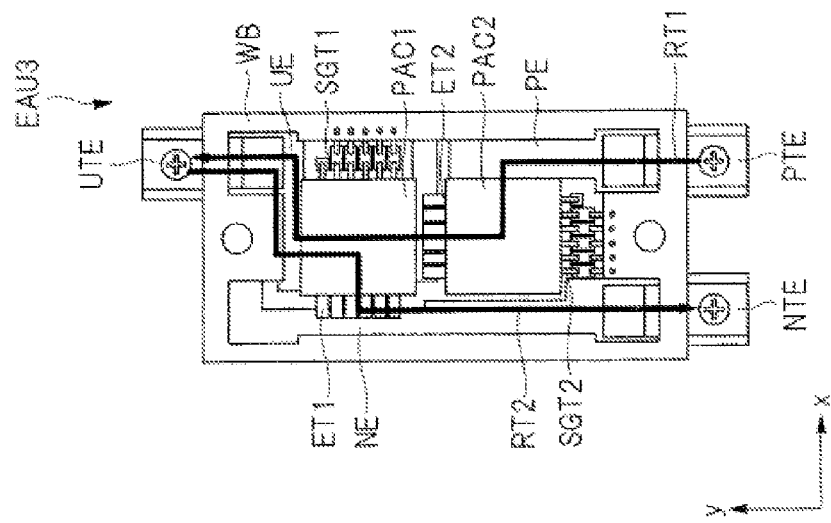
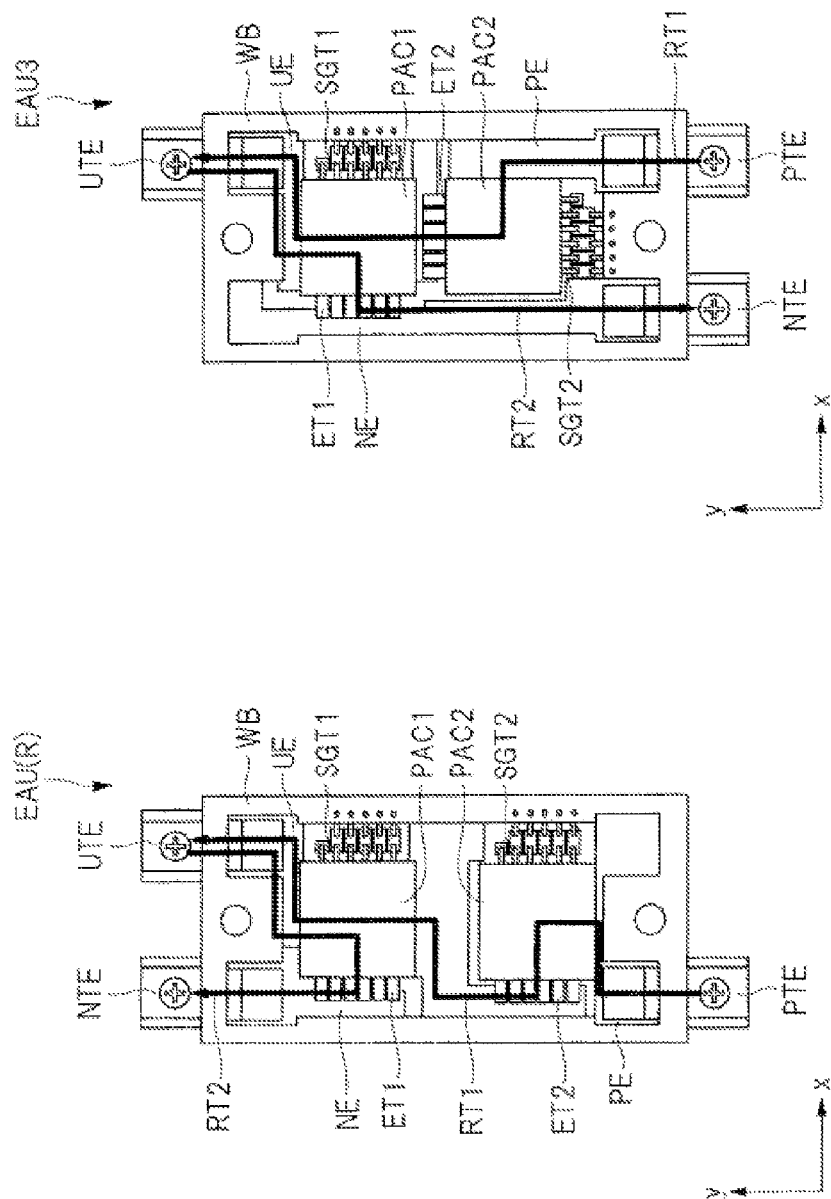

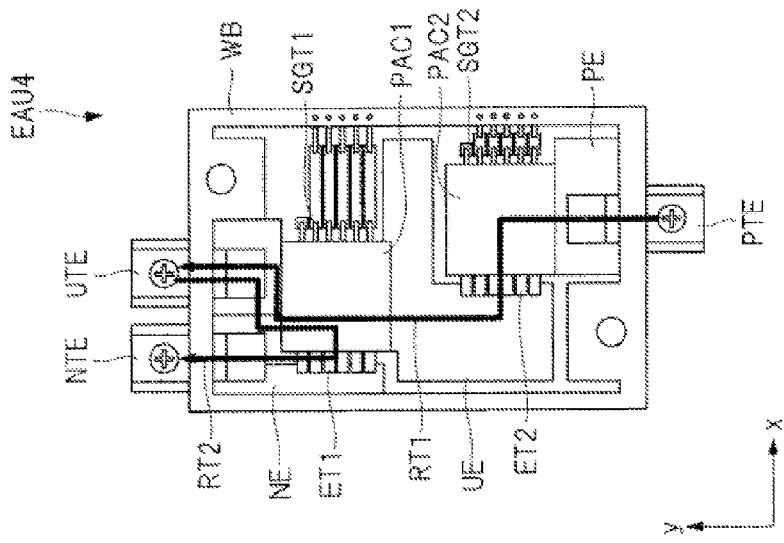
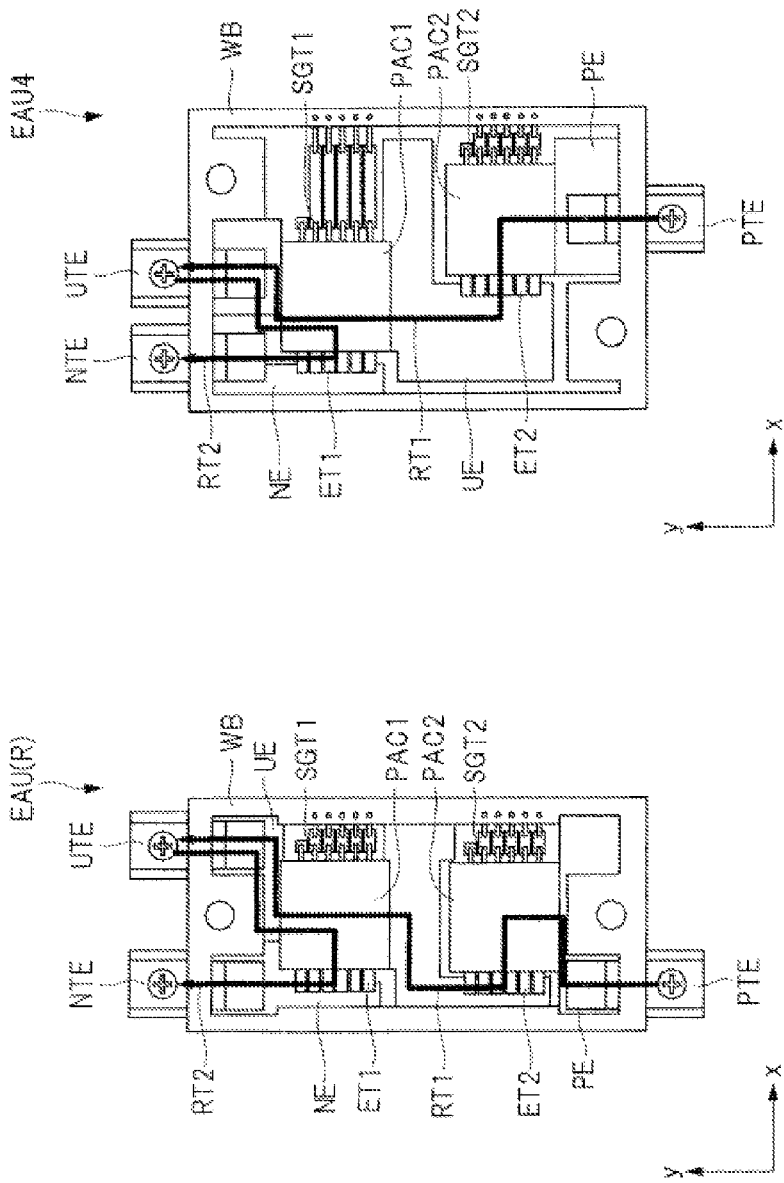
FIG. 31A
FIG. 31B

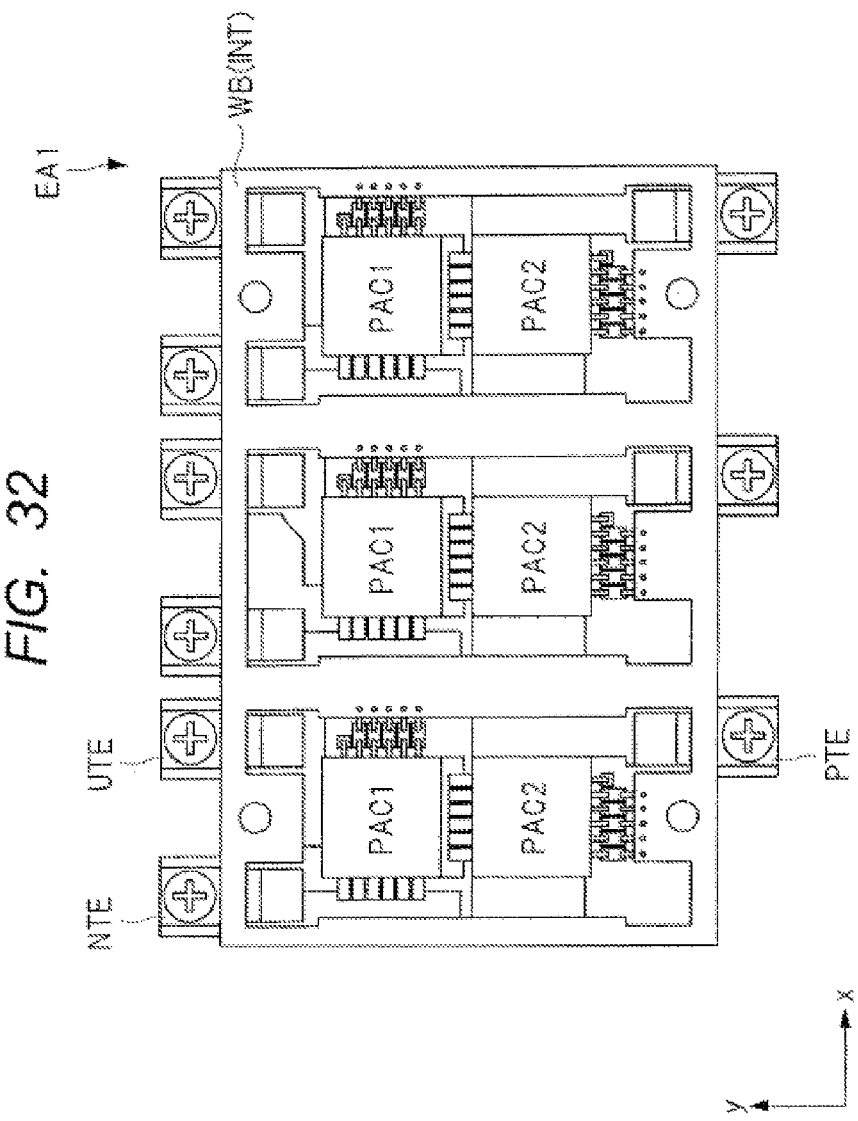

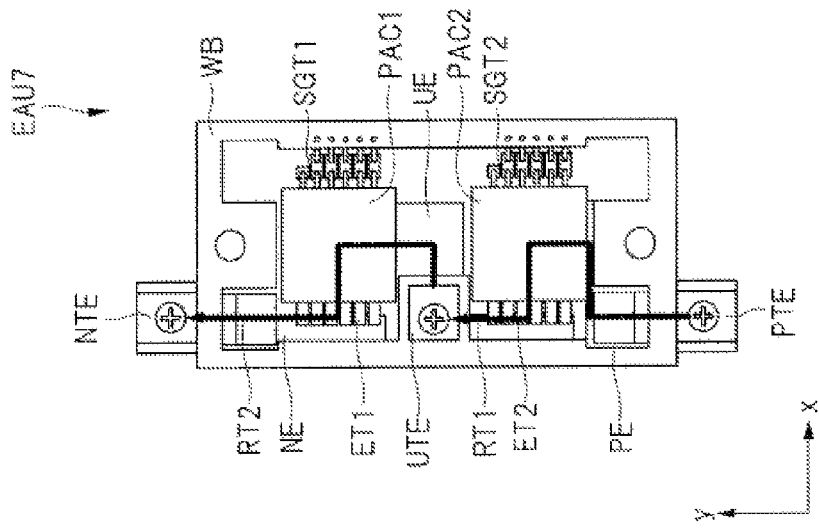
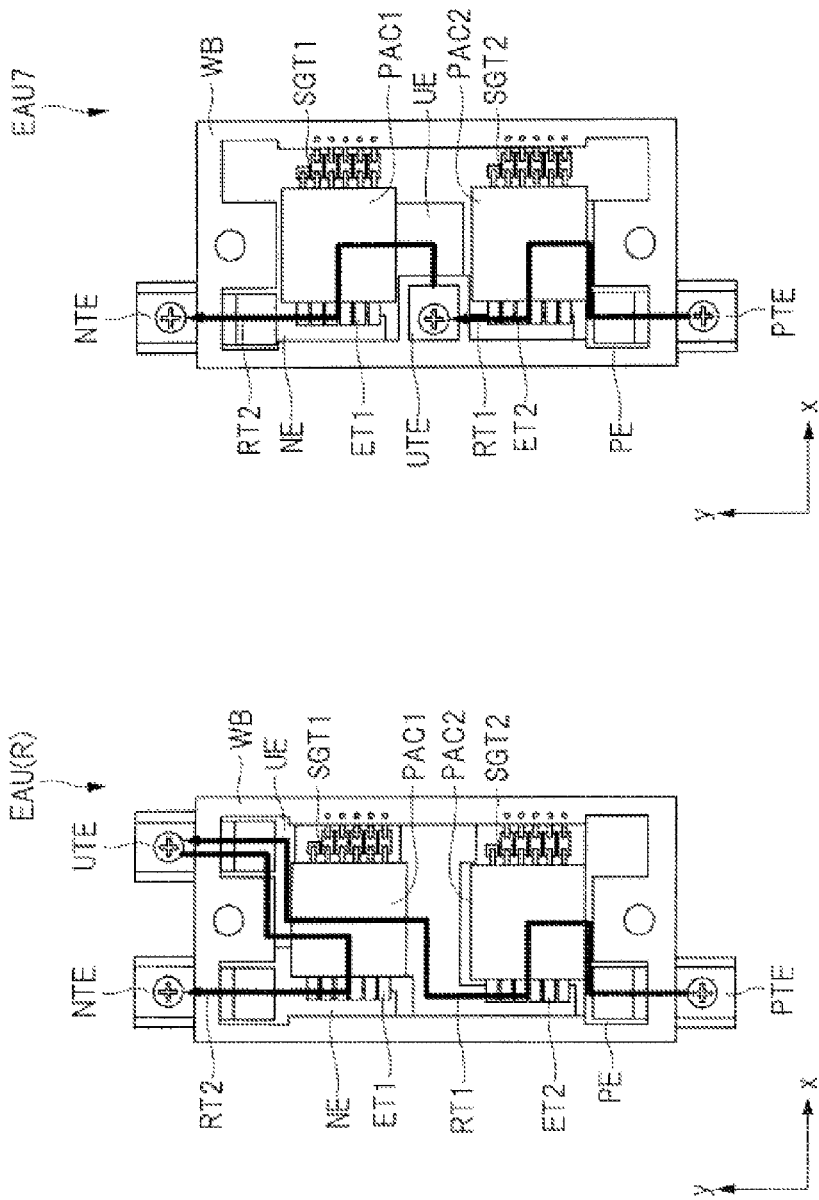
FIG. 40A
FIG. 40B

ELECTRONIC DEVICE

CROSS-REFERENCE TO RELATED APPLICATIONS

The disclosure of Japanese Patent Application No. 2013-181591 filed on Sep. 2, 2013 including the specification, drawings and abstract is incorporated herein by reference in its entirety.

BACKGROUND

The present invention relates to an electronic device and to a technology which is effective when applied to an electronic device in which, e.g., a plurality of semiconductor devices each including a semiconductor chip are mounted.

In Japanese Unexamined Patent Publication No. 2008-60256 (Patent Document 1), the technique shown below is described. That is, a first chip is mounted on a first die pad and a second chip is mounted on a second die pad. The first die pad and the second die pad are configured to be separated along a direction parallel with a first side and a second side of a sealing body. This allows output pins extending from the first chip and the control pins of a drive circuit to protrude in opposite directions.

In Japanese Unexamined Patent Publication No. 2008-21796 (Patent Document 2), a semiconductor device is described in which a semiconductor chip formed with an Insulated Gate Bipolar Transistor (hereinafter referred to as an IGBT in the present specification) and a semiconductor chip formed with a diode are mounted on a die pad.

In Japanese Unexamined Patent Publication No. 2011-86889 (Patent Document 3), a technique is described which mounts a plurality of single-body packages together on a metal substrate via an insulating adhesive sheet to form one composite package.

In Japanese Unexamined Patent Publication No. 2009-158787 (Patent Document 4), a technique is described which mounts, on a wiring board, a semiconductor chip formed with an IGBT and a semiconductor chip formed with a diode, each in a bare-chip state.

RELATED ART DOCUMENTS

Patent Documents

[Patent Document 1]
Japanese Unexamined Patent Publication No. 2008-60256
[Patent Document 2]
Japanese Unexamined Patent Publication No. 2008-21796
[Patent Document 3]
Japanese Unexamined Patent Publication No. 2011-86889
[Patent Document 4]
Japanese Unexamined Patent Publication No. 2009-158787

SUMMARY

For example, in an electric automobile, a hybrid automobile, or the like, a motor is mounted. Examples of the motor include a single-phase induction motor and a 3-phase induction motor. These motors are controlled by an inverter circuit (electronic device) which converts a dc power to an ac power. The inverter circuit includes a semiconductor device including IGBTs and diodes as a component thereof. For example, in an inverter circuit which controls a single-phase induction motor, two IGBTs and two diodes are used. On the other hand, in an inverter circuit which controls a 3-phase induction motor, six IGBTs and six diodes are used. That is, in the electronic device forming an inverter circuit, a large number of IGBTs and a large number of diodes are mounted.

Accordingly, when a consideration is given to the product yield and manufacturing process time of the electronic device forming an inverter, there is a room for an improvement in a technique which mounts an IGBT and a diode, each provided in a bare-chip state, on a wiring board (module substrate). That is, in the technique described in Patent Document 4 mentioned above, it is necessary to mount the IGBT and the diode, each in a barechip state, and then perform a packaging step. As a result, with the technique described in Patent Document 4, the manufacturing process time increases and, when a defective product is produced in the packaging step, the non-defective IGBT and diode which are internally mounted become wastes. Therefore, in the technique described in Patent Document 4 mentioned above, in terms of achieving an improvement in product yield and a reduction in manufacturing process time, there is a room for an improvement.

With regard to this point, the present inventors have studied a technique which preliminarily manufactures a semiconductor device in which one IGBT and one diode are sealed with a resin (semiconductor package) and mounts a plurality of the semiconductor devices each determined to be non-defective on a wiring board to manufacture an electronic device forming an inverter circuit, as shown in each of Patent Documents 1 to 3 mentioned above. This is because, since the technique uses the preliminarily resin-capsulated semiconductor devices, the packaging step in the manufacturing process of the electronic device is unnecessary to allow a reduction in manufacturing process time. In addition, since the technique allows the plurality of semiconductor devices (semiconductor packages) each determined to be non-defective to be used without any modification, an improvement can be achieved in the product yield of the electronic device.

However, when the electronic device is formed of the semiconductor devices in each of which the IGBT and the diode are resin-sealed, the positions of external connection terminals provided on the semiconductor devices are fixed. This may elongate paths (wiring lengths) between the input terminals (external terminals) of the electronic device and the output terminals (external terminals) thereof unless a careful consideration is given to the arrangement/layout of the semiconductor devices each including the IGBT and the diode on the wiring board. That is, in the technology which uses the preliminarily resin-sealed semiconductor devices, since the positions of the external connection terminals provided on the semiconductor devices are fixed, the degree of freedom of substrate wiring which provides connection between the plurality of semiconductor devices is limited. As a result, the length of the substrate wiring tends to increase. This means that the impedance of the substrate wiring increases to easily interrupt the high-speed switching of the electronic device. That is, the technique which uses the preliminarily resin-sealed semiconductor devices to manufacture the electronic device forming the inverter circuit has the advantage of allowing an improvement in product yield and a reduction in manufacturing process time. However, in terms of achieving an improvement in the performance of the electronic device represented by high-speed switching, there is a room for an improvement in the technique.

Other problems and novel features of the present invention will become apparent from a statement in the present specification and the accompanying drawings.

An electronic device in an embodiment includes a first semiconductor device and a second semiconductor device each mounted on an upper surface of a wiring board. The second semiconductor device is mounted on the upper surface of the wiring board such that, in plan view, the orientation of the second semiconductor device intersects the orientation of the first semiconductor device.

An electronic device in another embodiment includes a first semiconductor device and a second semiconductor device each mounted on an upper surface of a wiring board. In a plan view, the first semiconductor device and the second semiconductor device have the same orientations, but the center position of the second semiconductor is located to be shifted from the center position of the first semiconductor device.

The electronic device in the embodiment can achieve an improvement in performance represented by, e.g., high-speed switching.

BRIEF DESCRIPTION OF THE DRAWINGS

FIG. 8 is a plan view showing an outer configuration of the semiconductor device in Embodiment 1;

FIGS. 9A and 9B are views each showing the internal structure of the sealing body of the semiconductor device in Embodiment 1, of which FIG. 9A is a plan view and FIG. 9B is a cross-sectional view along the line A-A in FIG. 9A;

FIG. 10 is a plan view showing the outer shape of a semiconductor chip formed with an IGBT;

FIG. 11 is a plan view showing the back surface of the semiconductor chip opposite to the front surface thereof;

FIGS. 16A and 16B are views each showing a manufacturing process of the semiconductor device in Embodiment 1, of which FIG. 16A is a plan view and FIG. 16B is a cross-sectional view along the line A-A in FIG. 16A;

FIGS. 17A and 17B are views each showing the manufacturing process of the semiconductor device subsequently to FIGS. 16A and 16B, of which FIG. 17A is a plan view and FIG. 17B is a cross-sectional view along the line A-A in FIG. 17A;

FIGS. 18A and 18B are views each showing the manufacturing process of the semiconductor device subsequently to FIGS. 17A and 17B, of which FIG. 18A is a plan view and FIG. 18B is a cross-sectional view along the line A-A in FIG. 18A;

FIGS. 19A and 19B are views each showing the manufacturing process of the semiconductor device subsequently to FIGS. 18A and 18B, of which FIG. 19A is a plan view and FIG. 19B is a side view;

FIGS. 20A and 20B are views each showing the manufacturing process of the semiconductor device subsequently to FIGS. 19A and 19B, of which FIG. 20A is a plan view and FIG. 20B is a side view;

FIG. 21 is a view showing an outer configuration of the semiconductor device in Embodiment 1;

FIG. 22 is a view showing a manufacturing process of the electronic device in Embodiment 1;

FIG. 23 is a view showing the manufacturing process of the electronic device subsequently to FIG. 22;

FIG. 24 is a view showing the manufacturing process of the electronic device 1 subsequently to FIG. 23;

FIG. 25A is a schematic diagram showing a two-dimensional configuration of an electronic device unit in a related art technology and FIG. 25B is a schematic diagram showing a two-dimensional configuration of the electronic device unit in Embodiment 1;

FIG. 28A is a schematic diagram showing a two-dimensional configuration of the electronic device unit in the related art technology and FIG. 28B is a schematic diagram showing the two-dimensional configuration of the electronic device unit in Modification 2;

FIG. 31A is a schematic diagram showing a two-dimensional configuration of the electronic device unit in the related art technology and FIG. 31B is a schematic diagram showing the two-dimensional configuration of the electronic device unit in Modification 3;

FIG. 32 is a schematic diagram showing a two-dimensional configuration of an electronic device in Modification 4;

FIG. 40A is a schematic diagram showing the two-dimensional configuration of the electronic device unit in the related art technology and FIG. 40B is a schematic diagram showing the two-dimensional configuration of the electronic device unit in Modification of Embodiment 3.

DETAILED DESCRIPTION

Figure 1:
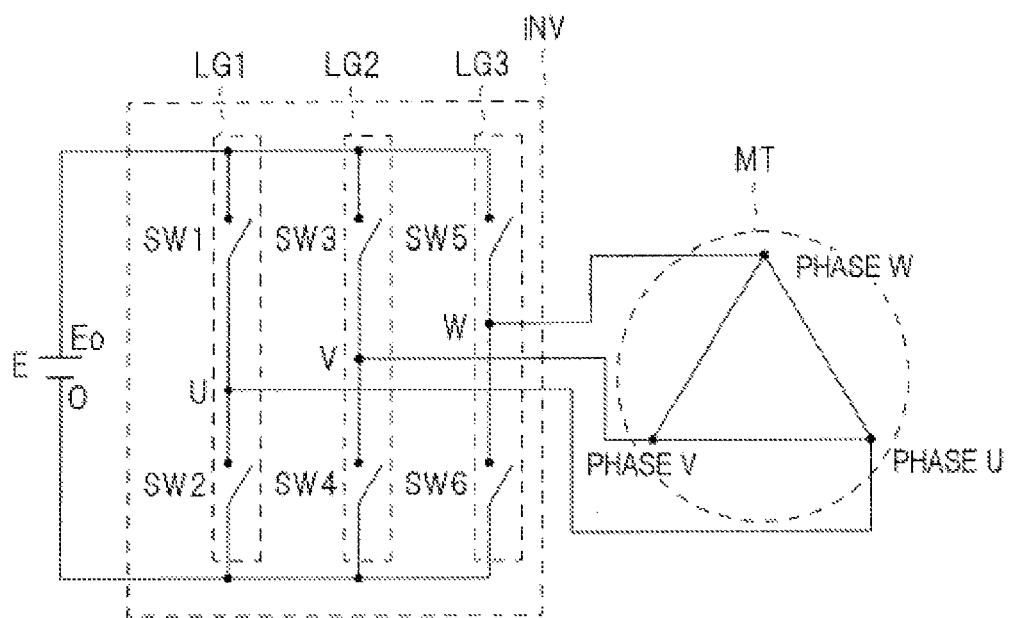
FIG. 1 is a circuit block diagram in which a 3-phase inverter circuit is placed between a dc power supply and a 3-phase induction motor.

In the following embodiments, if necessary for the sake of convenience, the embodiments will be each described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also in the following embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

Hereinbelow, the embodiments of the present invention will be described in detail on the basis of the drawings. Note that, throughout all the drawings for illustrating the embodiments, members having the same functions are designated by the same reference numerals, and a repeated description thereof is omitted. Also, in the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

Embodiment 1

An inverter circuit converts a dc power to an ac power. For example, when a dc power supply alternately outputs a positive voltage and a negative voltage, the direction of a current is inverted in response thereto. In this case, since the direction of the current is alternately inverted, the output can be considered to be an ac power. This is the principle of the inverter circuit. The ac power comes in various forms represented by a single-phase ac power and a 3-phase ac power. Accordingly, in Embodiment 1, a 3-phase inverter circuit which converts a dc power to a 3-phase ac power will be particularly described by way of example. However, the application of the technical idea of Embodiment is not limited to the 3-phase inverter circuit. The technical idea of Embodiment 1 can be widely applied to, e.g., a single-phase inverter circuit or the like.

<Configuration of 3-Phase Inverter Circuit>

FIG. 1 is a circuit diagram in which a 3-phase inverter circuit INV is placed between a dc power supply E and a 3-phase induction motor MT. As shown in FIG. 1, to convert the power from the dc power supply E to a three-phase ac power, the 3-phase inverter circuit INV including six switches SW1 to SW6 is used. Specifically, as shown in FIG. 1, the 3-phase inverter circuit INV has a first leg LG1 in which the switches SW1 and SW2 are connected in series, a second leg LG2 in which the switches SW3 and SW4 are connected in series, and a third leg LG3 in which the switches SW5 and SW6 are connected in series. The first to third legs LG1 to LG3 are connected in parallel. At this time, the switches SW1, SW3, and SW5 form upper arms, while the switches SW2, SW4, and SW6 form lower arms.

A point U between the switches SW1 and SW2 is connected with a phase U of the 3-phase induction motor MT. Likewise, a point V between the switches SW3 and SW4 is connected with a phase V of the 3-phase induction motor MT and a point W between the switches SW5 and SW6 is connected with a phase W of the 3-phase induction motor MT. Thus, the 3-phase inverter circuit INV is configured.

<Operation of 3-Phase Inverter Circuit>

Figure 2:
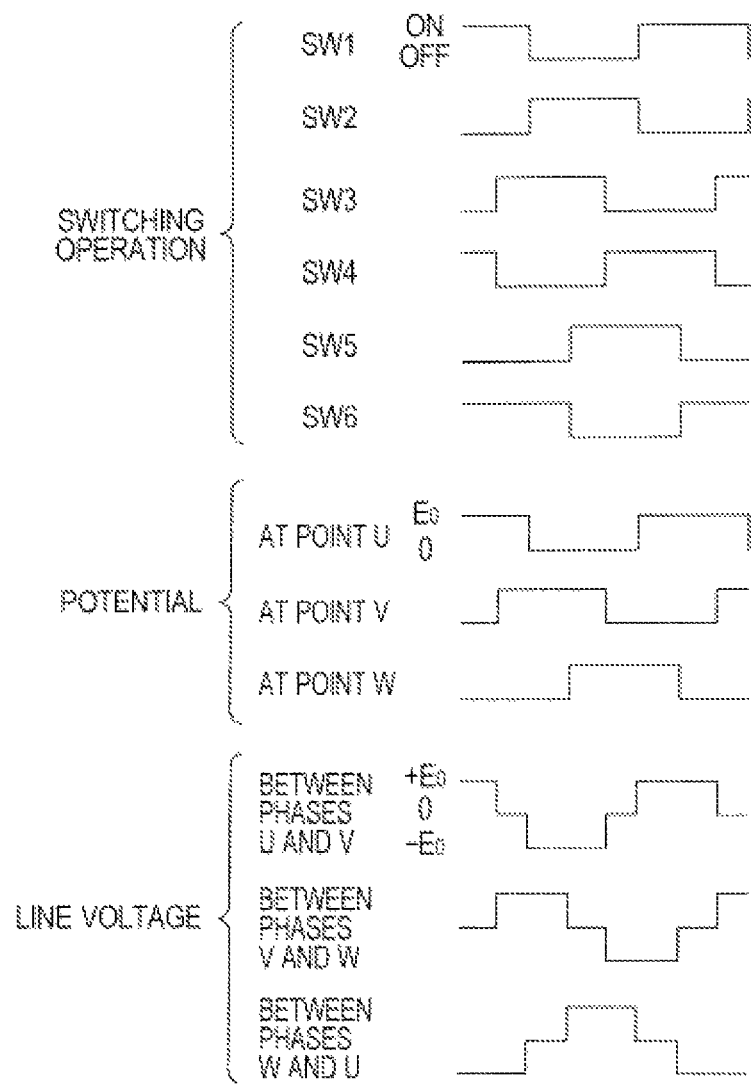
FIG. 2 is a timing chart illustrating an operation of the 3-phase inverter circuit.

Next, a description will be given of an operation of the 3-phase inverter circuit INV having the configuration described above. FIG. 2 is a timing chart illustrating the operation of the 3-phase inverter circuit INV. In FIG. 2, the switching operations of the switches SW1 and SW2 in the 3-phase inverter circuit INV are performed such that, e.g., when the switch SW1 is ON, the switch SW2 is OFF while, when the switch SW1 is OFF, the switch SW2 is ON. Likewise, the switching operations of the switches SW3 and SW4 in the 3-phase inverter circuit INV are performed such that, when the switch SW3 is ON, the switch SW4 is OFF while, when the switch SW3 is OFF, the switch SW4 is ON. Also, the switching operations of the switches SW5 and SW6 in the 3-phase inverter circuit INV are performed such that, when the switch SW5 is ON, the switch SW6 is OFF while, when the switch SW5 is OFF, the switch SW6 is ON.

As shown in FIG. 2, the switching operations of the three switch pairs are performed so as to have 120° phase differences therebetween. At this time, the respective potentials at the points U, V, and W change to 0 and $E_0$ in accordance with the switching operations of the three switch pairs. For example, since the line voltage between the phases U and V corresponds to a value obtained by subtracting a V-phase potential from a U-phase potential, the line voltage between the phases U and V changes to $+E_0$, 0, and $-E_0$. On the other hand, the line voltage between the phases V and W has a voltage waveform having a phase 120° shifted from that of the voltage waveform of the line voltage between the phases U and V, while the line voltage between the phases W and U has a voltage waveform having a phase 120° shifted from that of the voltage waveform of the line voltage between the phases V and W. By causing the switches SW1 to SW6 to perform such switching operations, each of the line voltages therebetween has a stepwise ac voltage waveform and the respective ac voltage waveforms of the line voltages have 120° phase differences therebetween. Thus, the 3-phase inverter circuit INV allows the dc power supplied from the dc power supply E to the 3-phase ac power.

<Example of Configuration of Real 3-Phase Inverter Circuit>

Figure 3:
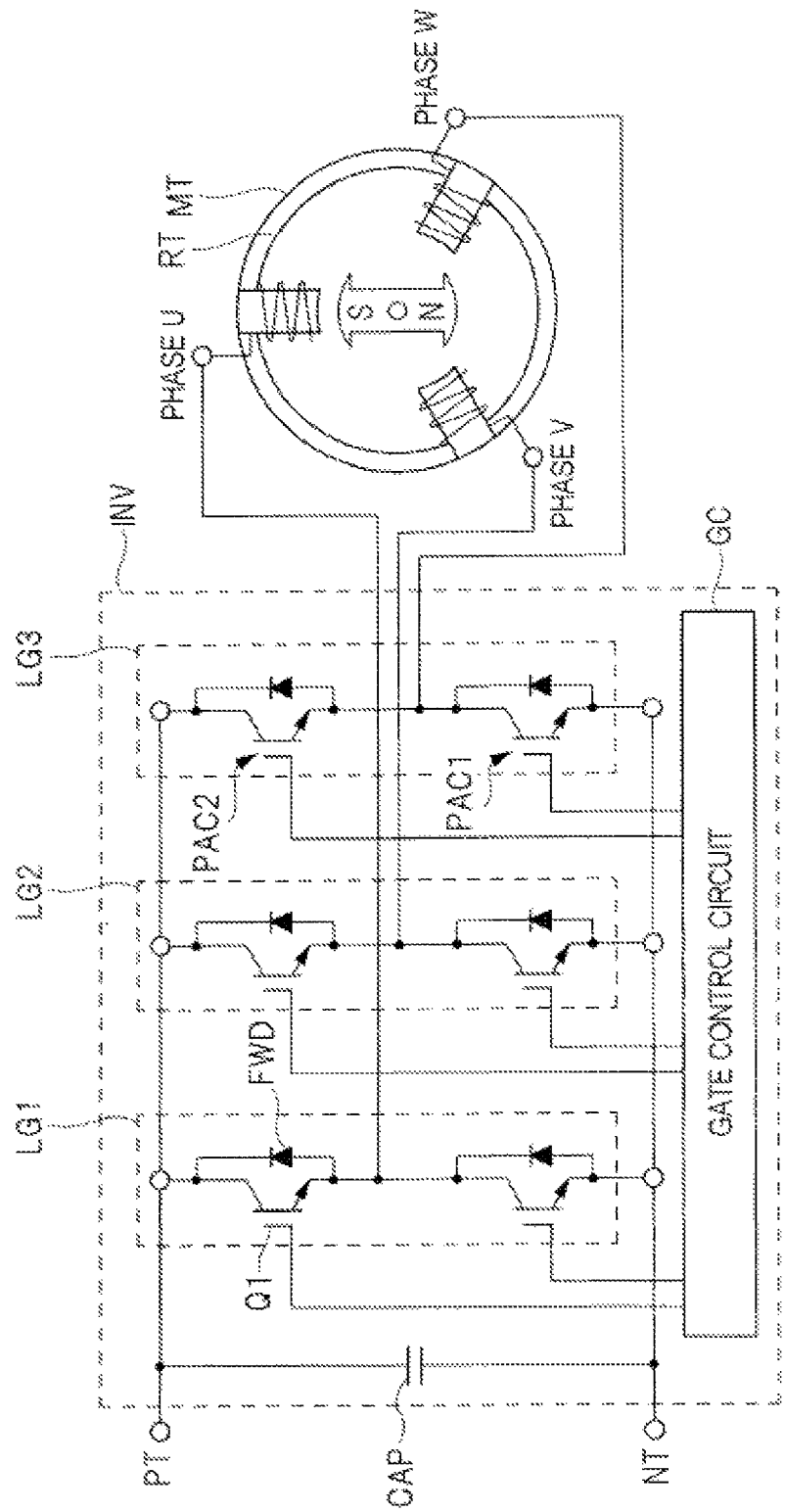
FIG. 3 is a circuit diagram showing a configuration of a motor circuit including an inverter circuit and a 3-phase induction motor in Embodiment 1.

An electronic device in Embodiment 1 is used in a drive circuit for a 3-phase induction motor used in, e.g., an electric automobile, a hybrid automobile, or the like. Specifically, the drive circuit includes an inverter circuit. The inverter circuit has the function of converting a dc power to an ac power. FIG. 3 is a circuit diagram showing a configuration of a motor circuit including the inverter circuit and the 3-phase induction motor in Embodiment 1.

In FIG. 3, the motor circuit has the 3-phase induction motor MT and the inverter circuit INV. The 3-phase induction motor MT is configured to perform a drive operation with a 3-phase voltage having three different phases. Specifically, in the 3-phase induction motor MT, using a 3-phase ac current having so-called phases U, V, and W which are 120° shifted from each other, a rotation magnetic field is generated around a rotor RT as a conductor. In this case, the magnetic field rotates around the rotor RT. This means that a magnetic flux traversing the rotor RT as a conductor changes. As a result, electromagnetic induction occurs in the rotor RT as a conductor and an induction current flows in the rotor RT. The flow of the induction current in the rotation magnetic field means that a force is applied to the rotor in accordance with the Fleming's left-hand rule and, by the force, the rotor RT is rotated. Thus, it will be understood that, in the 3-phase induction motor MT, using the 3-phase ac current, the rotor RT can be rotated. That is, the 3-phase induction motor MT requires the 3-phase ac current. Therefore, in the motor circuit, by using the inverter circuit INV which produces an ac current from a direct current, the 3-phase ac current is supplied to the 3-phase induction motor.

A description will be given below of an example of a configuration of the real inverter circuit INV. As shown in FIG. 3, in, e.g., the inverter circuit INV in Embodiment 1, IGBTs Q1 and diodes FWD are provided in correspondence to three phases. That is, in the real inverter circuit INV, e.g., each of switches SW1 to SW6 is formed of a component as shown in FIG. 3 in which the IGBT Q1 and the diode FWD are connected in inverse parallel. That is, in FIG. 3, each of the upper and lower arms of the first leg LG1, the upper and lower arms of the second leg LG2, and the upper and lower arms of the third leg LG is formed of the component in which the IGBT Q1 and the diode FWD are connected in inverse parallel.

Here, it can be considered to use, e.g., a power MOSFET (Metal Oxide Semiconductor Field Effect Transistor) as each of switching elements in the inverter circuit INV. Since the power MOSFET is of a voltage-driven type the ON/OFF operation of which is controlled with the voltage applied to the gate electrode, the advantage of allowing high-speed switching is offered. On the other hand, the power MOSFET tends to have a higher ON resistance and a larger amount of heat generation as the breakdown voltage thereof is intended to be increased. This is because, in the power MOSFET, the breakdown voltage is ensured by increasing the thickness of a lower-concentration epitaxial layer (drift layer) but, when the thickness of the lower-concentration epitaxial layer is increased, a resistance increase occurs as a side effect.

On the other hand, as each of the switching elements, there can also be used a bipolar transistor capable of handling a high power. However, since the bipolar transistor is of a current-driven type the ON/OFF operation of which is controlled with a base current, the switching speed of the bipolar transistor tends to be generally lower than that of the power MOSFET described above.

Accordingly, with the power MOSFET or the bipolar transistor, it is difficult to respond to situations encountered in a use application as the motor of an electric automobile, a hybrid automobile, or the like which needs high-speed switching. Therefore, for a use application which involves a high power and needs high-speed switching, an IGBT is used. The IGBT is a semiconductor element formed of a combination of a power MOSFET and a bipolar transistor and having both the high-speed switching property of the power MOSFET and the high breakdown voltage property of the bipolar transistor. As a result, the IGBT can handle a high power and perform high-speed switching and is therefore a semiconductor element appropriate for a use application which involves a high power and needs high-speed switching. For the foregoing reason, in the inverter circuit INV in Embodiment 1, the IGBT is used as each of the switching elements.

In the inverter circuit INV in Embodiment 1, between a positive potential terminal PT and each of the phases (phases U, V, and W) of the 3-phase induction motor MT, the IGBT Q1 and the diode FWD are connected in inverse parallel and, between each of the phases of the 3-phase induction motor MT and a negative potential terminal NT also, the IGBT Q1 and the diode FWD are connected in inverse parallel. That is, for each of the phases, the two IGBTs Q1 and the two diodes FWD are provided so that, for the three phases, the six IGBTs Q1 and the six FWDs are provided. To the gate electrode of each of the IGBTs Q1, a gate control circuit GC is connected with control the switching operation of the IGBT Q1. In the inverter circuit INV thus configured, the gate control circuit GC controls the switching operation of each of the IGBTs Q1 to convert a dc power to a 3-phase ac power and supply the 3-phase ac power to the 3-phase induction motor MT.

<Need for Diodes>

As described above, in the inverter circuit INV in Embodiment 1, as the switching elements, IGBTs Q1 are used and the diodes FWDs are provided so as to be connected in inverse parallel with the IGBTs Q1. The IGBTs Q1 as the switching elements are needed in terms of merely implementing a switching function with the switching elements, but it is considered that there is no need to provide the diodes FWD. With regard to this point, when a load connected with the inverter circuit INV includes inductance, it is necessary to provide the diodes FWD. The reason for this will be described below.

When the load is a pure resistance not including inductance, there is no energy flowing backward so that the diodes FWD are unnecessary. However, when a circuit including inductance such as a motor is connected with the load, there is a mode in which a load current flows in a direction reverse to the direction of a current flow in a switch in an ON state. That is, when the load includes inductance, an energy may return from the inductance of the load to the inverter circuit INV (a current may flow backward).

At this time, since each of the IGBTs Q1 alone does not have the function of allowing the backward current to flow, the diode FWD needs to be connected in inverse parallel with the IGBT Q1. That is, in the inverter circuit INV, in the case where a load includes inductance as in motor control, when the IGBT Q1 is turned OFF, the energy ($\frac{1}{2}LI^2$) stored in the inductance should necessarily be released. However, the IGBT Q1 alone cannot allow the backward current for releasing the energy stored in the inductance to flow. Accordingly, to cause the electric energy stored in the inductance to flow backward, the diode FWD is connected in inverse parallel with the IGBT Q1. That is, the diode FWD has the function of causing the backward current to flow to release the electric energy stored in the inductance. From the foregoing, it will be understood that, in the inverter circuit connected with the load including inductance, the diode FWD needs to be provided in inverse parallel to the IGBT Q1 as the switching element. The diode FWD is referred to as a free wheel diode.

<Need for Capacitor Element>

Also in the inverter circuit INV in Embodiment 1, as shown in, e.g., FIG. 3, between the positive potential terminal PT and the negative potential terminal NT, a capacitor element CAP is provided. The capacitor element CAP has the function of, e.g., smoothing switching noise in the inverter circuit INV and stabilizing a system voltage.

<Implementation/Configuration of Electronic Device in Embodiment 1>

The inverter circuit INV in Embodiment 1 is configured as described above. A description will be given below of an implementation/configuration of an electronic device which implements the inverter circuit INV.

Figure 4:
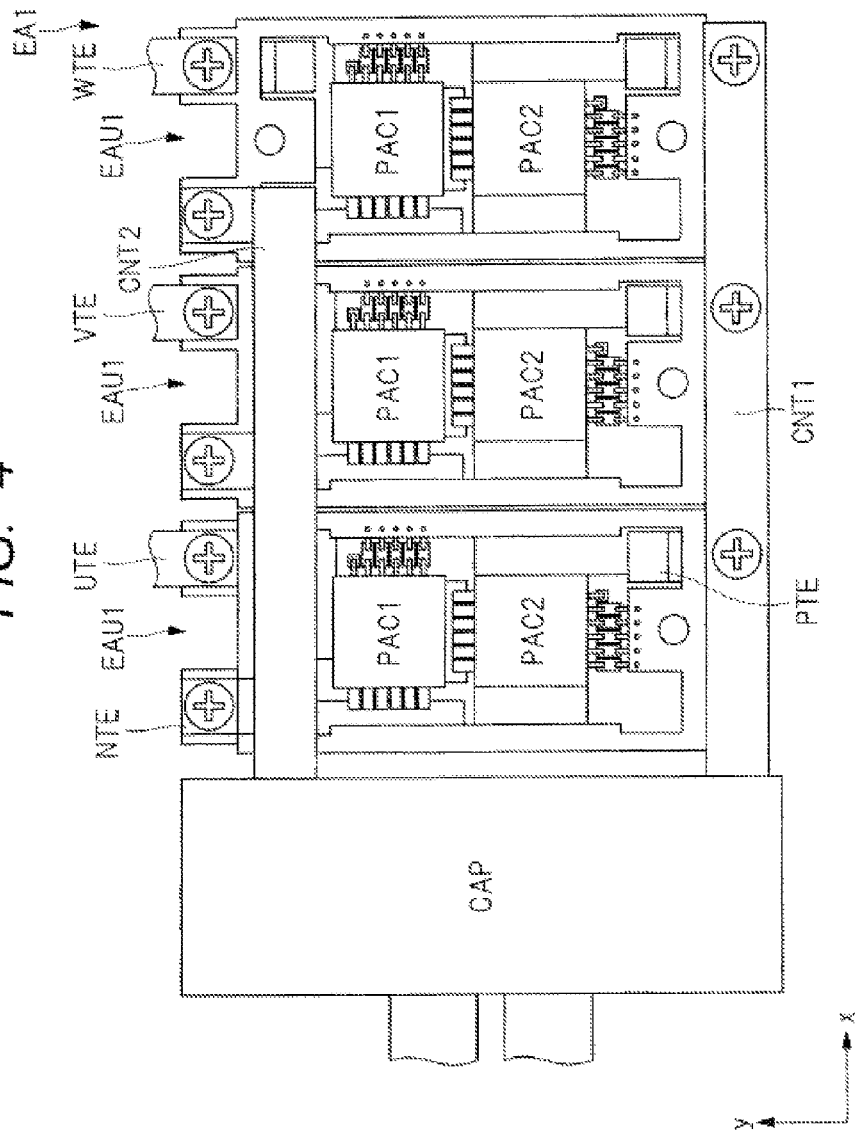
FIG. 4 is a schematic diagram showing an implementation/configuration of an electronic device in Embodiment 1.

FIG. 4 is a schematic diagram showing an implementation/configuration of an electronic device EA1 in Embodiment 1. In FIG. 4, the electronic device EA1 in Embodiment 1 includes three electronic device units EAU1. Each of the three electronic device units EAU1 has a rectangular shape defined by a pair of longer sides extending in a y-direction and a pair of shorter sides extending in an x-direction.

As shown in, e.g., FIG. 4, the three electronic device units EAU1 are arranged so as to be aligned in the x-direction. That is, in Embodiment 1, the plurality of electronic device units EAU1 are provided and arranged to be aligned in the x-direction (first direction) in which the pairs of shorter sides extend.

Here, in each of the three electronic device units EAU1 included in the electronic device EA1, a semiconductor device PAC1 and a semiconductor device PAC2 are mounted. That is, in each of the three electronic device units EAU1, as shown in FIG. 4, the plurality of semiconductor devices are mounted. In Embodiment 1, by way of example, the two semiconductor devices are mounted in each of the electronic device units EAU1. Accordingly, the electronic device EA1 in Embodiment 1 has the three electronic device units EAU1 and, in each of the three electronic device units EAU1, the two semiconductor devices are mounted. It follows therefore that the electronic device EA1 in Embodiment 1 includes the total of six semiconductor devices. At this time, each of the six semiconductor devices included in the electronic device EA1 has the same configuration. In other words, the six semiconductor devices included in the electronic device EA1 serve as electronic components of the same type.

In each of the electronic device units EAU1, a P-terminal PTE (positive potential terminal PT) and an N-terminal NTE (negative potential terminal NT) are provided. Among the three electronic device units EAU1, e.g., the electronic device unit EAU1 located on the left side is provided with a U-terminal UTE, the electronic device unit EAU1 located in the middle is provided with a V-terminal VTE, and the electronic device unit EAU1 located on the right side is provided with a W-terminal WTE.

At this time, the P-terminals PTE provided in the individual electronic device units EAU1 are connected with each other by, e.g., a conductive connection member CNT1. Likewise, the N-terminals NTE provided in the individual electronic device units EAU1 are connected with each other by a conductive connection member CNT2. Specifically, the three P-terminals PTE are electrically connected with each other by the connection member CNT1 extending in the x-direction and the three N-terminals NTE are electrically connected with each other by the connection member CNT2 extending in the x-direction. Between the connection members CNT1 and CNT2, the capacitor element CAP is connected. It follows therefore that, in Embodiment 1, between the P-terminals PTE and the N-terminals NTE, the capacitor element CAP is connected.

The electronic device EA1 in Embodiment 1 is thus implemented/configured to implement the inverter circuit INV shown in FIG. 3. Specifically, the first leg LG1 shown in FIG. 3 is implemented/configured by the electronic device unit EAU1 shown on the left side in FIG. 4, and the second leg LG2 shown in FIG. 3 is implemented/configured by the electronic device unit EAU1 shown in the middle in FIG. 4. Also, the third leg LG3 shown in FIG. 3 is implemented/configured by the electronic device unit EAU1 shown on the right side in FIG. 4. In each of the three electronic device units EAU1, the semiconductor devices PAC1 and PAC2 are mounted and, each of the semiconductor devices PAC1 and PAC2, the IGBT Q1 and the diode FWD each shown in FIG. 3 are formed.

Thus, in Embodiment 1, by the electronic device EA1 which is a combination of the three electronic device units EAU1, the 3-phase inverter circuit INV is implemented.

<Implementation/Configuration of Electronic Device Unit in Embodiment 1>

A description will be given below of an implementation/configuration of each of the electronic device units EAU1 included in the electronic device EA1. Note that, since the three electronic device units EAU1 shown in FIG. 4 have equal configurations, attention is focused on the electronic device unit EAU1 located on the left side in FIG. 4 and a description will be given below of the implementation/configuration of the electronic device unit EAU1.

Figure 5:
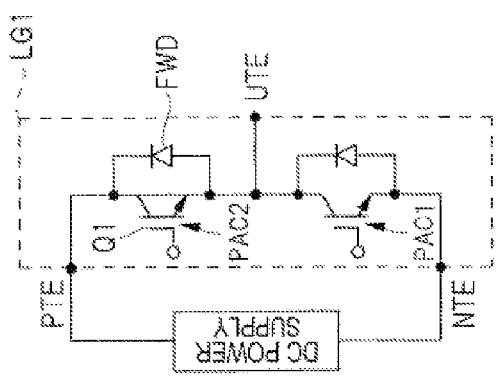
FIG. 5 is a view showing a circuit element implemented by one electronic device unit.

FIG. 5 is a view showing a circuit element implemented by the electronic device unit EAU1. Specifically, FIG. 5 is a circuit diagram showing the circuit element of the first leg LG1 in the 3-phase inverter circuit shown in FIG. 3. The first leg LG1 is implemented by the electronic device unit EAU1.

Figure 6:
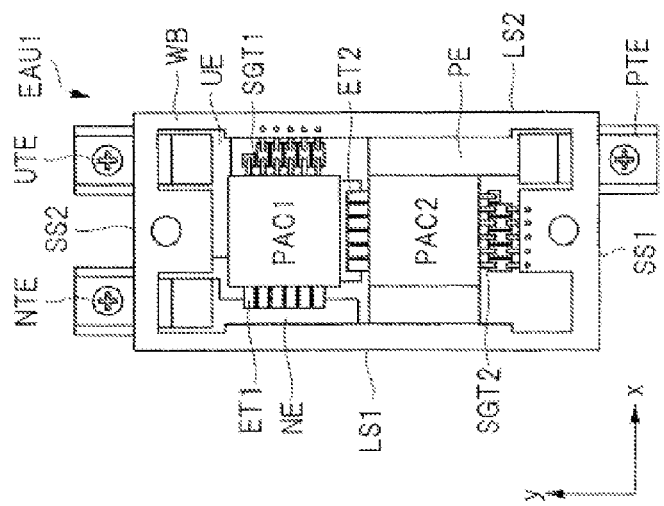
FIG. 6 is a schematic diagram showing an implementation/configuration of the electronic device unit in Embodiment 1.

FIG. 6 is a schematic diagram showing the implementation/configuration of the electronic device unit EAU1 in Embodiment 1. In FIG. 6, the electronic device unit EAU1 in Embodiment 1 has a wiring board WB having a rectangular shape. The upper surface (front surface or first surface) of the wiring board WB is formed with a P-electrode PE, a U-electrode UE, and an N-electrode NE. The P-electrode PE is electrically connected with the P-terminal PTE and the U-electrode is electrically connected with the U-terminal UTE. Also, the N-electrode NE is electrically connected with the N-terminal NTE. Note that the surface of the wiring board WB opposite to the upper surface thereof corresponds to the lower surface (back surface or second surface) of the wiring board WB.

The wiring board WB has a rectangular shape including a pair of longer sides and a pair of shorter sides intersecting the pair of longer sides. Specifically, the wiring board WB has a first longer side LS1 and a second longer side LS2 which extend in parallel with each other in the y-direction and also has a first shorter side SS1 and a second shorter side SS2 which extend in parallel with each other in the x-direction. The P-terminal PTE (first external terminal) is provided beside either one of the pair of shorter sides. The U-terminal UTE (second external terminal) is provided beside either one of the pair of shorter sides. The N-terminal NTE (third external terminal) is provided beside either one of the pair of shorter sides. At this time, beside each of the first and second shorter sides SS1 and SS2, at least one of the P-terminal PTE, the U-terminal UE, and the N-terminal NTE is provided. Specifically, in the electronic device unit EAU1 in Embodiment 1, the P-terminal PTE is provided beside the first shorter side SS1, while the U-terminal UTE and the N-terminal NTE are provided beside the second shorter side SS2.

This allows a reduction in the size of the electronic device EA1 using the electronic device units EAU1 in Embodiment 1. That is, in each of the electronic device units EAU1 in Embodiment 1, the wiring board WB having the pair of longer sides and the pair of shorter sides is used. At this time, at either one of the pair of shorter sides, each of the P-terminal PTE, the U-terminal UTE, and the N-terminal NTE is formed. In other words, none of the P-terminal PTE, the U-terminal UTE, and the N-terminal NTE is formed at the pair of longer sides of the wiring board WB. Consequently, as shown in, e.g., FIG. 4, in the electronic device EA1 in Embodiment 1, the three electronic device units EAU1 can be arranged to be aligned in the x-direction in which the shorter sides of the electronic device units EAU1 extend. That is, the configuration allows the three electronic device units EAU1 to be aligned in the x-direction without being interrupted by the arrangement of the P-terminal PTE, the U-terminal UTE, and the N-terminal NTE. By thus providing each of the P-terminal PTE, the U-terminal UTE, and the N-terminal NTE at either one of the pair of shorter sides as in the electronic device unit EAU1 in Embodiment 1, it is possible to reduce the size of the electronic device EA1 formed of a combination of the plurality of electronic device units EAU1. In other words, it can be said that such a configuration in which each of the P-terminal PTE, the U-terminal UTE, and the N-terminal NTE is provided at either one of the pair of shorter sides, not at the pair of longer sides as that of the electronic device unit EAU1 in Embodiment 1 is useful in terms of reducing the size of the electronic device EA1.

In addition, as shown in FIG. 4, the electronic device units EAU1 in Embodiment 1 are arranged to be aligned in the x-direction in which the pair of shorter sides extend. This provides the advantage of allowing easy wire extraction from each of the P-terminals PTE, the U-terminal UTE, and the N-terminals NTE. That is, it is possible to improve the ease of connection between each of the P-terminals PTE, the U-terminal UTE and the N-terminals NTE which are provided individually in the plurality of electronic device units EAU1 and external equipment.

In particular, in each of the plurality of electronic device units EAU1, as shown in FIG. 4, the P-terminal PTE is provided at one of the shorter sides and the N-terminal NTE is provided at the other shorter side facing to the one of the shorter sides. Accordingly, it is possible to easily provide the capacitor element CAP between the connection members CNT1 and CNT2 each extending in the x-direction, while electrically connecting the plurality of P-terminals PTE with the connection member CNT1 and electrically connecting the plurality of N-terminals NTE with the connection member CNT2. That is, the configuration of each of the electronic device units EAU1 in Embodiment 1 allows the electronic device EA1 having an efficient implementation/configuration (implementation/layout) to be implemented. In other words, in terms of configuring the 3-phase inverter circuit INV shown in FIG. 3, each of the electronic device units EAU1 in Embodiment 1 has a useful configuration in which full consideration has been given to a reduction in the size of the electronic device EA1 and ease of connection with external equipment.

On the upper surface of the wiring board WB thus configured, as shown in, e.g., FIG. 6, the semiconductor devices PAC1 and PAC2 are mounted. Specifically, at one of the four sides of the semiconductor device PAC1, emitter terminals ET1 (leads) are arranged and electrically connected with the N-electrode NE formed on the wiring board WB. Also, at the side of the semiconductor device PAC1 facing to the side at which the emitter terminals ET1 are arranged, signal terminals SGT1 (leads) are arranged and electrically connected with wiring provided in the wiring board WB. Note that, at the back surface of the semiconductor device PAC1, a die pad serving as a collector terminal is exposed and electrically connected with the U-electrode UE formed on the wiring board WB, though not shown in FIG. 6.

Likewise, at one of the four sides of the semiconductor device PAC2, emitter terminals ET2 (leads) are arranged and electrically connected with the U-electrode UE formed on the wiring board WB. Also, at the side of the semiconductor device PAC2 facing to the side at which the emitter terminals ET2 are arranged, signal terminals SGT2 (leads) are arranged and electrically connected with the wiring provided in the wiring board WB. Note that, at the back surface of the semiconductor device PAC2, a die pad serving as a collector terminal is exposed and electrically connected with the P-electrode PE formed on the wiring board WB, though not shown in FIG. 6.

Here, the characteristic feature of Embodiment 1 lies in that, as shown in FIG. 6, the semiconductor devices PAC1 and PAC2 are mounted on the upper surface of the wiring board WB such that, in plan view, the orientation of the semiconductor position PAC2 intersects the orientation of the semiconductor device PAC1. Specifically, the orientation of the semiconductor device PAC2 is substantially orthogonal to the orientation of the semiconductor device PAC1. Note that "orthogonal" used in Embodiment 1 shows a state tilted at approximately 90 degrees and the tilt angle is not necessarily limited to 90 degrees. The characteristic feature of Embodiment 1 can also be described as follows. That is, the semiconductor device PAC1 is mounted on the upper surface of the wiring board WB such that the emitter terminals ET1 and the signal terminals SGT1 are arranged along the x-direction in which the pair of shorter sides of the wiring board WB extend. On the other hand, the semiconductor device PAC2 is mounted on the upper surface of the wiring board WB such that the emitter terminals ET2 and the signal terminals SGT2 are arranged along the y-direction in which the pair of longer sides of the wiring board WB extend.

As a result, according to Embodiment 1, the path length between the P-terminal PTE and the U-terminal UTE is shortened to allow a reduction in the parasitic resistance between the P-terminal PTE and the U-terminal UTE. This means that a delay time in signal transmission defined by the product of a parasitic resistance and a parasitic capacitance in the wiring can be reduced. Therefore, it is possible to improve the performance of the electronic device represented by high-speed switching. The details of the advantage of Embodiment 1 will be described later.

Note that, as described above, on the wiring board WB forming each of the electronic device units EAU1 in Embodiment 1, the semiconductor devices PAC1 and PAC2 are mounted and, in each of the semiconductor devices PAC1 and PAC2, one IGBT and one diode are included. The details of the internal structure of each of the semiconductor devices PAC1 and PAC2 will also be described later. Here, with regard to, e.g., the arrangement of the semiconductor devices PAC1 and PAC2, a brief description will be given of the outline of the arrangement/layout of the IGBT and diode in the semiconductor device PAC1 or the arrangement/layout of the IGBT and diode in the semiconductor device PAC2.

Figure 7:
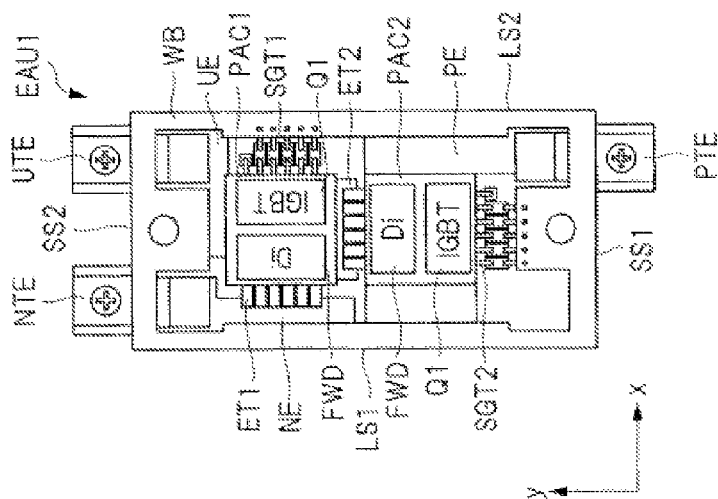
FIG. 7 is a schematic diagram showing the arrangement/layout of IGBTs and diodes in the semiconductor devices mounted in the electronic device unit in Embodiment 1.

FIG. 7 is a schematic diagram showing the arrangement/layout of the IGBT Q1 and the diode FWD in the semiconductor device PAC1 and the arrangement/layout of the IGBT Q1 and the diode FWD in the semiconductor device PAC2 in the electronic device unit EAU1 in Embodiment 1. In FIG. 7, when attention is focused on the semiconductor device PAC1, it can be seen that the IGBT Q1 and the diode FWD are arranged so as to be aligned in the x-direction. Specifically, in the x-direction, a semiconductor chip formed with the IGBT Q1 is placed beside the signal terminals SGT1 and a semiconductor chip formed with the diode FWD is placed beside the emitter terminals ET1.

On the other hand, in FIG. 7, when attention is focused on the semiconductor device PAC2, it can be seen that the IGBT Q1 and the diode FWD are arranged so as to be aligned in the y-direction. Specifically, in the y-direction, a semiconductor chip formed with the IGBT Q1 is placed beside the signal terminals SGT2 and a semiconductor chip formed with the diode FWD is placed beside the emitter terminals ET2.

Accordingly, when attention is focused on the semiconductor devices PAC1 and PAC2, the protruding direction of each of the emitter terminals ET1 is different from that of each of the emitter terminals ET2 by approximately 90 degrees and the protruding direction of each of the signal terminals SGT1 is also different from that of each of the signal terminals SGT2 by approximately 90 degrees. It can also be seen that, in Embodiment 1, the positions at which the IGBT Q1 and the diode FWD are arranged in the semiconductor device PAC1 are different from the positions at which the IGBT Q1 and the diode FWD are arranged in the semiconductor device PAC2 by approximately 90 degrees.

<Configuration of Semiconductor Device in Embodiment 1>

Each of the electronic device units EAU1 in Embodiment 1 is configured as described above. Next, a description will be given of a configuration of each of the semiconductor devices included in the electronic device unit EAU1. As described above, each of the electronic device units EAU1 has the semiconductor devices PAC1 and PAC2. Since the semiconductor devices PAC1 and PAC2 have the same configuration, the semiconductor devices PAC1 and PAC2 having the same configuration will be described below as a semiconductor device PAC.

The semiconductor device PAC in Embodiment 1 relates to the inverter circuit INV shown in FIG. 3 and is obtained by integrating one IGBT Q1 and one diode FWD which serve as the components of the inverter circuit INV into one package. That is, by using the six semiconductor devices in Embodiment 1, an electronic device (power module) serving as the 3-phase inverter circuit INV which drives a 3-phase motor is configured.

FIG. 8 is a plan view showing an outer configuration of the semiconductor device PAC in Embodiment 1. As shown in FIG. 8, the semiconductor device PAC in Embodiment 1 has a sealing body MR made of a resin and having a rectangular shape. The sealing body MR has the upper surface shown in FIG. 8, a lower surface opposite to the upper surface, a first side surface located between the upper and lower surfaces in the thickness direction thereof, and a second side surface facing to the first side surface. In FIG. 8, a side S1 defining the first side surface and a side S2 defining the second side surface are shown. The sealing body MR further has a third side surface intersecting the first and second side surfaces and a fourth side surface intersecting the first and second side surfaces to face to the third side surface. In FIG. 8, a side S3 defining the third side surface and a side S4 defining the fourth side surface are shown In the semiconductor device PAC in Embodiment 1, as shown in FIG. 8, a part of each of a plurality of leads LD1 protrudes from the first side surface and a part of each of a plurality of leads LD2 protrudes from the second side surface. At this time, the leads LD1 form emitter terminals ET and the leads LD2 form signal terminals SGT. The width of each of the plurality of leads LD1 forming the emitter terminals ET is larger than the width of each of the plurality of leads LD2 forming the signal terminals SGT. In other words, in Embodiment 1, when the plurality of leads LD1 are collectively referred to as a first lead (first lead set) and the plurality of leads LD2 are collectively referred to as a second lead (second lead set), the portion of the first lead exposed from the sealing body MR includes the plurality of portions (plurality of leads LD1) and the portion of the second lead exposed from the sealing body MR includes the plurality of portions (plurality of leads LD2). At this time, it can also be said that, in plan view, the width of each of the plurality of portions of the first lead is larger than the width of each of the plurality of leads LD2. Such a width difference is provided by considering the fact that, since a large current flows in the emitter terminals ET, the resistance needs to be minimized while, in the signal terminals SGT, only an extremely small current flows.

Figure 9A:
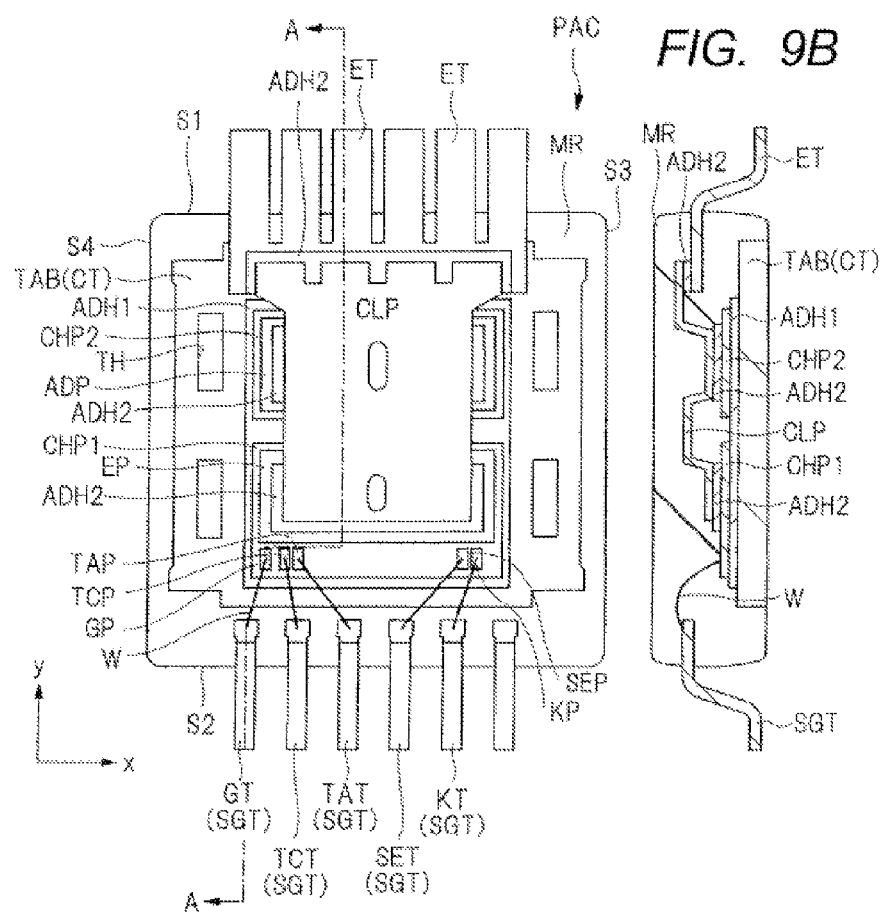
Figure 9B:
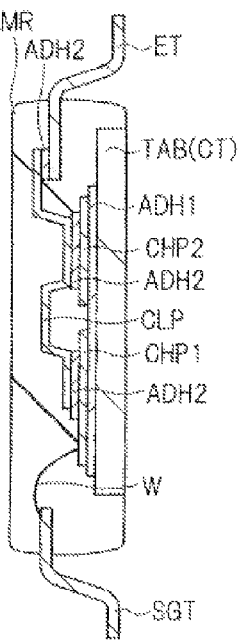

Subsequently, a description will be given of the internal configuration of the sealing body MR forming the semiconductor device PAC in Embodiment 1. FIGS. 9A and 9B are views each showing the internal structure of the sealing body MR of the semiconductor device PAC in Embodiment 1, of which FIG. 9A corresponds to a plan view and FIG. 9B corresponds to a cross-sectional view along the line A-A in FIG. 9A.

First, in FIG. 9A, in the sealing body MR, a chip mounting portion (die pad) TAB having a rectangular shape is placed. The chip mounting portion TAB functions also as a heat spreader for enhancing a heat release efficiency and is formed of, e.g., a material containing copper having a high heat conductivity as a main component. The "main component" used herein indicates a material component having a highest content in a component material forming a member. For example, the "material containing copper as a main component" means that copper has a highest content in the material of the member. In the present specification, the wording "main component" is used to show that, e.g., even though the member is basically formed of copper, the case where an impurity is contained therein in addition to copper is not intended to be excluded.

On the chip mounting portion TAB, a semiconductor chip CHP1 formed with the IGBT and a semiconductor chip CHP2 formed with the diode are mounted via a conductive adhesive ADH1 made of, e.g., a high-melting-point solder. At this time, the surface on which the semiconductor chips CHP1 and CHP2 are mounted is defined as a first surface of the chip mounting portion TAB and the surface thereof opposite to the first surface is defined as a second surface. It follows that, in this case, the semiconductor chips CHP1 and CHP2 are mounted on the first surface of the chip mounting portion TAB. In particular, the semiconductor chip CHP2 formed with the diode is placed such that the cathode electrode pad formed on the back surface of the semiconductor chip CHP2 comes in contact with the first surface of the chip mounting portion TAB via the conductive adhesive ADH1. It follows that, in this case, an anode electrode pad ADP formed on the front surface of the semiconductor chip CHP2 faces upward. On the other hand, the semiconductor chip CHP1 formed with the IGBT is placed such that a collector electrode (collector electrode pad) formed on the back surface of the semiconductor chip CHP1 comes in contact with the first surface of the chip mounting portion TAB via the conductive adhesive ADH1. It follows that, in this case, an emitter electrode pad EP and a plurality of electrode pads each formed on the front top surface of the semiconductor chip CHP1 face upward. As a result, the collector electrode pad of the semiconductor chip CHP1 and the cathode electrode pad of the semiconductor chip CHP2 are electrically connected with each other via the chip mounting portion TAB.

In addition, in FIG. 9A, the two-dimensional area of the chip mounting portion TAB is larger than the total two-dimensional area of the semiconductor chips CHP1 and CHP2. In the portion of the chip mounting portion TAB which does not overlap the semiconductor chips CHP1 and CHP2 in plan view, through holes TH are formed to extend through the chip mounting portion TAB from the first surface thereof to the second surface thereof. In each of the through holes TH, a part of the sealing body MR is embedded.

As also shown in FIG. 9A, over the emitter electrode pad EP of the semiconductor chip CHP1 and the anode electrode pad ADP of the semiconductor chip CHP2, a clip CLP as a conductive member is placed via, e.g., a conductive adhesive ADH2 made of, e.g., a high-melting-point solder. The clip CLP is connected with the emitter terminals ET via the conductive adhesive ADH2. Consequently, the emitter electrode pad EP of the semiconductor chip CHP1 and the anode electrode pad ADP of the semiconductor chip CHP2 are electrically connected with the emitter terminals ET via the clip CLP. The clip CLP is formed of a plate-like member containing, e.g., copper as a main component. That is, in Embodiment 1, a large current flows from the emitter electrode pad EP of the semiconductor chip CHP1 to the emitter terminals ET so that the clip CLP that can occupy a large area is used to allow the large current to flow.

As also shown in FIG. 9A, on the front surface of the semiconductor chip CHP1, the plurality of electrode pads are formed. The plurality of electrode pads are individually connected with the signal terminals SGT by wires W as conductive members. Specifically, the plurality of electrode pads include a gate electrode pad GP, a temperature sensing electrode pad TCP, a temperature sensing electrode pad TAP, a current sensing electrode pad SEP, and a Kelvin sensing electrode pad KP. The gate electrode pad GP is electrically connected with a gate terminal GT which is one of the signal terminals SGT by the wire W. Likewise, the temperature sensing electrode pad TCP is electrically connected with a temperature sensing terminal TCT which is one of the signal terminals SGT by the wire W, and the temperature sensing electrode pad TAP is electrically connected with a temperature sensing terminal TAT which is one of the signal terminals SGT by the wire W. Also, the current sensing electrode pad SEP is electrically connected with a current sensing terminal SET which is one of the signal terminals SGT by the wire W, and the Kelvin sensing electrode pad KP is electrically connected with a Kelvin terminal KT by the wire W. At this time, each of the wires W is formed of a conductive member containing, e.g., gold, copper, or aluminum as a main component.

As shown in FIG. 9A, in plan view, the semiconductor chip CHP2 is mounted on the first surface of the chip mounting portion TAB so as to be located between the emitter terminals ET and the semiconductor chip CHP1, while the semiconductor chip CHP1 is mounted on the first surface of the chip mounting portion TAB so as to be located between the semiconductor chip CHP2 and the signal terminal SGT.

In other words, the emitter terminals ET, the semiconductor chips CHP2 and CHP1, and the signal terminals SGT are arranged along the y-direction as a first direction. Specifically, in plan view, the semiconductor chip CHP2 is mounted on the first surface of the chip mounting portion TAB so as to be closer to the emitter terminals ET than the semiconductor chip CHP1 and the semiconductor chip CHP1 is mounted on the first surface of the chip mounting portion TAB so as to be closer to the signal terminals SGT than the semiconductor chip CHP2.

Also, in plan view, the semiconductor chip CHP1 is mounted on the first surface of the chip mounting portion TAP such that the gate electrode pad GP is closer to the signal terminals SGT than the emitter electrode pad EP. In other words, in plan view, the semiconductor chip CHP1 is mounted on the first surface of the chip mounting portion TAP such that the plurality of electrode pads including the gate electrode pad GP, the temperature sensing electrode pad TCP, the temperature sensing electrode pad TAP, the current sensing electrode pad SEP, and the Kelvin sensing electrode pad KP are closer to the signal terminals SGT than to the emitter electrode pads EP. It can also be said that, in plan view, the plurality of electrode pads of the semiconductor chip CHP1 are arranged along the one of the four sides of the semiconductor chip CHP1 which is closest to the signal terminals SGT. At this time, as shown in FIG. 9A, in plan view, the clip CLP is placed so as not to overlap any of the plurality of electrode pads including the gate electrode pad GP and the plurality of wires W.

In the semiconductor device PAC having such an internal configuration, the semiconductor chips CHP1 and CHP2, a part of the chip mounting portion TAB, a part of each of the emitter terminals ET, a part of each of the plurality of signal terminals SGT, the clip CLP, and the wires W are sealed with a resin to form the sealing body MR.

Next, in FIG. 9B, on the first surface of the chip mounting portion TAB, the semiconductor chip CHP1 formed with the IGBT and the semiconductor chip CHP2 formed with the diode are mounted via the conductive adhesive ADH1. In addition, from over the front surface of the semiconductor chip CHP1 to over the front surface of the semiconductor chip CHP2, the clip CLP is placed via the conductive adhesive ADH2. The clip CLP is further connected with the emitter terminals ET via the conductive adhesive ADH2 and a part of each of the emitter terminals ET is exposed from the sealing body MR. The semiconductor chip CHP1 is connected with the signal terminals SGT arranged to be opposite to the emitter terminals ET by the wires W and a part of each of the signal terminals SGT is also exposed from the sealing body MR.

As shown in FIG. 9B, the second surface of the chip mounting portion TAB is exposed from the lower surface of the sealing body MR. The exposed second surface of the chip mounting portion TAB serves as a collector terminal CT. When the semiconductor device PAC1 is mounted on the wiring board, the second surface of the chip mounting portion TAB can be soldered to the wiring formed over the wiring board.

On the first surface of the chip mounting portion TAB, the semiconductor chips CHP1 and CHP2 are mounted. The collector electrode pad of the semiconductor chip CHP2 and the cathode electrode pad of the semiconductor chip CHP2 are in contact with the chip mounting portion TAB via the conductive adhesive ADH1. As a result, the collector electrode pad and the cathode electrode pad are electrically connected with each other via the chip mounting portion TAB and eventually electrically connected with the collector terminal CT. As also shown in FIG. 9B, the thickness of the chip mounting portion TAB is larger than the thicknesses of the emitter terminals ET and the signal terminals SGT.

In this manner, the semiconductor device PAC1 in Embodiment 1 is implemented/configured.

Note that, in the semiconductor device PAC in Embodiment 1, in terms of reducing the ON-resistance, a solder is used as each of the conductive adhesive ADH1 used to connect the chip mounting portion TAB and the semiconductor chips CHP1 and CHP2 mounted on the chip mounting portion TAB and the conductive adhesive ADH2 used to connect the semiconductor chips CHP1 and CHP2 and the clip CLP. That is, in the semiconductor device PAC used for the inverter circuit in which a reduction in ON resistance is needed, a solder having a high electrical conductivity is used to reduce the ON resistance.

Note that, after being completed as a product, the semiconductor device PAC in Embodiment 1 is mounted on the wiring board forming the electronic device unit. In this case, to connect the semiconductor device PAC and the wiring board, a solder is used. In the case of providing the connection using the solder, heating treatment (reflow) for melting the solder to provide the connection is needed.

In the case where the solder used to connect the semiconductor device PAC and the wiring board is the same material as the solder used in the semiconductor device PAC described above, by the heat treatment (reflow) performed when the semiconductor device PAC and the wiring board are connected, the solder used in the semiconductor device PAC is also melted. In this case, a problem such as the formation of a crack in the resin with which the semiconductor device PAC is sealed due to the volume expansion resulting from the melting of the solder or the leakage of the molten solder to the outside may occur.

To prevent this, in the semiconductor device PAC, a high-melting-point solder is used. In this case, the high-melting-point solder used in the semiconductor device PAC is not melted by the heat treatment (reflow) performed when the semiconductor device PAC and the wiring board are connected. Therefore, it is possible to prevent a problem such as the formation of a crack in the resin with which the semiconductor device PAC is sealed due to the volume expansion resulting from the melting of the high-melting-point solder or the leakage of the molten solder to the outside.

As the solder used herein to connect the semiconductor device PAC and the wiring board, a solder having a melting point of about 220° C. represented by, e.g., a tin (Sn)-silver (Ag)-copper (Cu) alloy is used. During the reflow, the semiconductor device PAC is heated to about 260° C. Accordingly, as the high-melting-point solder mentioned in the present specification, a solder which is not melted even when heated to about 260° C. is intended to be used. Representative examples of the solder include a solder having a melting point of not less than 300° C., a reflow temperature of about 350° C., and a Pb (lead) content of not less than 90 wt %.

Basically, in the semiconductor device PAC in Embodiment 1, it is assumed that the high-melting-point solder used as the conductive adhesive ADH1 and the high-melting-point solder used as the conductive adhesive ADH2 have the same material components. However, the material components thereof are not limited thereto. For example, it is also possible to form the high-melting-point solder forming the conductive adhesive ADH1 and the high-melting-point solder forming the conductive adhesive ADH2 from different material components.

<Structure of IGBT>

Next, referring to the drawings, a description will be given of the structures of the IGBTs Q1 and the diodes FWD each forming the inverter circuit INV in Embodiment 1.

FIG. 10 is a plan view showing the outer shape of the semiconductor chip CHP1 formed with the IGBT Q1. In FIG. 10, the main surface (front surface) of the semiconductor chip CHP1 is shown. As shown in FIG. 10, the semiconductor chip CHP1 in Embodiment 1 has a rectangular two-dimensional shape having longer sides LS(CHP1) and shorter sides SS(CHP1). On the front surface of the semiconductor chip CHP1 having the rectangular shape, the emitter electrode pad EP having a rectangular shape is formed. Along the longer side direction of the semiconductor chip CHP1, the plurality of electrode pads are formed. Specifically, as the electrode pads, the gate electrode pad GP, the temperature sensing electrode pad TCP, the temperature sensing electrode pad TAP, the current sensing electrode pad SEP, and the Kelvin sensing electrode pad KP are arranged in the left-to-right direction in FIG. 10. Thus, on the front surface of the semiconductor chip CHP1 having the rectangular shape, the emitter electrode pad EP and the electrode pads are arranged along the shorter-side direction, while the plurality of electrode pads are formed along the longer-side direction. At this time, the size (two-dimensional area) of the emitter electrode pad EP is far larger than the sizes of the plurality of electrode pads.

FIG. 11 is a plan view showing the back surface of the semiconductor chip CHP1 opposite to the front surface thereof. As shown in FIG. 11, it can be seen that, over the entire back surface of the semiconductor chip CHP1, the collector electrode pad CP having a rectangular shape is formed.

Figure 12:
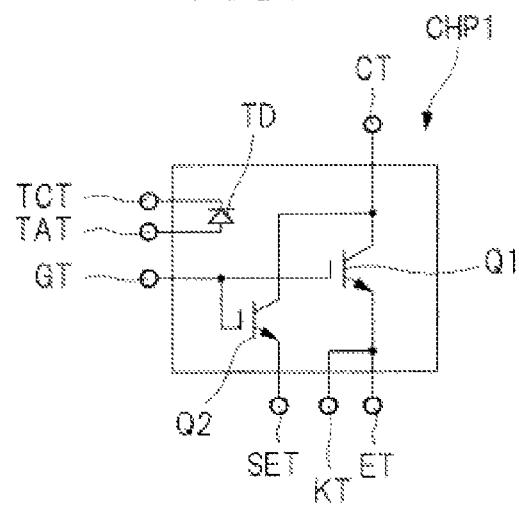
FIG. 12 is a circuit diagram showing an example of the circuit formed in the semiconductor chip.

Subsequently, a description will be given of a configuration of the circuit formed in the semiconductor chip CHP1. FIG. 12 is a circuit diagram showing an example of the circuit formed in the semiconductor chip CHP1. As shown in FIG. 12, the semiconductor chip CHP1 is formed with the IGBT Q1, a sensing IGBT Q2, and a temperature sensing diode TD. The IGBT Q1 is a main IGBT and used to drive-control the 3-phase induction motor MT shown in FIG. 3. The IGBT Q1 is formed with an emitter electrode, a collector electrode, and a gate electrode. The emitter electrode of the IGBT Q1 is electrically connected with the emitter terminals ET via the emitter electrode pad EP shown in FIG. 10. The collector electrode of the IGBT Q1 is electrically connected with the collector terminal CT via the collector electrode pad CP shown in FIG. 11. The gate electrode of the IGBT Q1 is electrically connected with the gate terminal GT via the gate electrode pad GP shown in FIG. 10.

The gate electrode of the IGBT Q1 is connected with the gate control circuit GC shown in FIG. 3. At this time, by the application of a signal from the gate control circuit GC to the gate electrode of the IGBT Q1 via the gate terminal GT, the switching operation of the IGBT Q1 can be controlled from the gate control circuit GC.

The sensing IGBT Q2 is provided so as to sense an overcurrent flowing between the collector and emitter electrodes of the IGBT Q1. That is, the sensing IGBT Q2 is provided as the inverter circuit INV so as to sense the overcurrent flowing between the collector and emitter electrodes of the IGBT Q1 and protect the IGBT Q1 from a breakdown due to the overcurrent. In the sensing IGBT Q2, the collector electrode of the sensing IGBT Q2 is electrically connected with the collector electrode of the IGBT Q1 and the gate electrode of the sensing IGBT Q2 is electrically connected with the gate electrode of the IGBT Q1. The emitter electrode of the sensing IGBT Q2 is electrically connected with a current sensing terminal SET other than the emitter electrode of the IGBT Q1 via a current sensing electrode pad SEP shown in FIG. 10. The current sensing terminal SET is connected with a current sensing circuit provided outside. The current sensing circuit senses a collector-emitter current in the IGBT Q1 on the basis of an output from the emitter electrode of the sensing IGBT Q2. When an overcurrent flows, the current sensing circuit interrupts the gate signal applied to the gate electrode of the IGBT Q1 to protect the IGBT Q1.

Specifically, the sensing IGBT Q2 is used as a current detection element for preventing an overcurrent from flowing in the IGBT Q1 due to a load short circuit or the like. The sensing IGBT Q2 is designed such that, e.g., the current ratio between the current flowing in the main IGBT Q1 and the current flowing in the detecting IGBT Q2 satisfies IGBT Q1:Sensing IGBT Q2=1000:1. That is, when a 200 A current is allowed to flow in the main IGBT Q1, a 200 mA current flows in the sensing IGBT Q2.

In a real application, an external sense resistor electrically connected with the emitter electrode of the sensing IGBT Q2 is provided to feedback the voltage between the both ends of the sense resistor to a control circuit. When the voltage between the both ends of the sense resistor becomes not less than a set voltage, the control circuit performs a control operation to disconnect a power supply. That is, when the current flowing in the main IGBT Q1 becomes an overcurrent, the current flowing in the sensing IGBT Q2 also increases. As a result, the current flowing in the sense resistor also increases to increase the voltage between the both ends of the sense resistor and, when the voltage therebetween becomes not less than the set value, it can be recognized that the current flowing in the main IGBT Q1 is in an overcurrent state.

The temperature sensing diode TD is provided so as to sense the temperature of the IGBT Q1 (temperature of the semiconductor chip CHP1 in a wider sense). That is, the voltage in the temperature sensing diode TD varies depending on the temperature of the IGBT Q1 so that the temperature of the IGBT Q1 is sensed. The temperature sensing diode TD is formed with a pn junction formed by introducing impurities of different conductivity types into polysilicon and has a cathode electrode (negative electrode) and an anode electrode (positive electrode). The cathode electrode is electrically connected with the temperature sensing terminal TCT shown in FIG. 12 by internal wiring via the temperature sensing electrode pad TCP (see FIG. 10) formed on the upper surface of the semiconductor chip CHP1. Likewise, the anode electrode is electrically connected with the temperature sensing terminal TAT shown in FIG. 12 by internal wiring via the temperature sensing electrode pad TCP (see FIG. 10) formed on the upper surface of the semiconductor chip CHP1.

The temperature sensing terminals TCT and TAT are connected with an externally provided temperature sensing circuit. The temperature sensing circuit indirectly senses the temperature of the IGBT Q1 on the basis of the output between the temperature sensing terminals TCT and TAT which are connected with the cathode and anode electrodes of the temperature sensing diode TD. When the sensed temperature becomes not less than a given fixed temperature, the temperature sensing circuit interrupts the gate signal applied to the gate electrode of the IGBT Q1 to protect the IGBT Q1.

As described above, the temperature sensing diode TD formed of a pn junction diode has a property such that, when a forward voltage of not less than the given fixed value is applied thereto, the forward current flowing in the temperature sensing diode TD rapidly increases. The voltage value at which the forward current begins to rapidly flow varies depending on the temperature. When the temperature rises, the voltage value lowers. Accordingly, Embodiment 1 utilizes the foregoing property of the temperature sensing diode TD. By allowing a fixed current to flow in the temperature sensing diode TD and measuring the voltage value between the both ends of the temperature sensing diode TD, the temperature can be indirectly monitored. In a real application, by feedbacking the voltage value (temperature signal) in the temperature sensing diode TD thus measured to the control circuit, the operating temperature of the element is controlled not to exceed a guaranteed value (e.g., 150 to 175° C.).

Subsequently, in FIG. 12, the emitter electrode of the IGBT Q1 is electrically connected with the emitter terminal ET and also electrically connected with the Kelvin terminal KT other than the emitter terminal ET. The Kelvin terminal KT is electrically connected with the Kelvin sensing electrode pad KP (see FIG. 10) formed on the upper surface of the semiconductor chip CHP1 by the internal wiring. Consequently, the emitter electrode of the IGBT Q1 is electrically connected with the Kelvin terminal KT via the Kelvin sensing electrode pad KP. The Kelvin terminal KT is used as a terminal for testing the main IGBT Q1. That is, during a test which allows a large current to flow in the main IGBT Q1, when the voltage is sensed from the emitter terminal ET of the IGBT Q1, a large current flows in the emitter terminal ET so that a voltage drop resulting from a wiring resistance cannot be ignored any longer and it becomes difficult to measure a precise ON resistance. To prevent this, in Embodiment 1, the Kelvin terminal KT is provided as a voltage sensing terminal which is electrically connected with the emitter terminal ET of the IGBT Q1 but in which a large current does not flow. That is, during the test which allows the large current to flow, by measuring the voltage at the emitter electrode from the Kelvin terminal, the ON voltage of the IGBT Q1 can be measured without being affected by the large current. The Kelvin terminal KT is used also as an electrically independent reference pin for a gate drive output.

Thus, the semiconductor chip CHP1 in Embodiment 1 is configured to be able to be connected with the control circuit including the current sensing circuit, the temperature sensing circuit, and the like. This allows the operation reliability of the IGBT Q1 included in the semiconductor chip CHP1 to be improved.

<Device Structure of IGBT>

Figure 13:
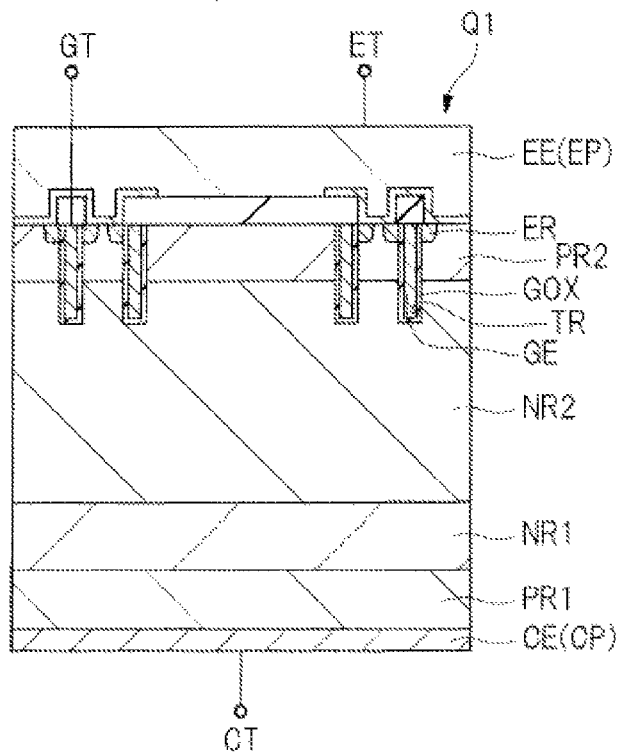
FIG. 13 is a cross-sectional view showing the device structure of the IGBT in Embodiment 1.

Subsequently, a description will be given of the device structure of the IGBT Q1. FIG. 13 is a cross-sectional view showing the device structure of the IGBT Q1 in Embodiment 1. In FIG. 13, the IGBT Q1 has a collector electrode CE (collector electrode pad CP) and, over the collector electrode CE, a $p^+$-type semiconductor region PR1 is formed. Over the $p^+$-type semiconductor region PR1, an $n^+$-type semiconductor region NR1 is formed. Over the $n^+$-type semiconductor region NR1, an $n^-$-type semiconductor region NR2 is formed. Over the $n^-$-type semiconductor region NR2, a p-type semiconductor region PR2 is formed and trenches TR are formed to extend through the p-type semiconductor region PR2 and reach the $n^-$-type semiconductor region NR2. In addition, $n^+$-type semiconductor regions ER serving as emitter regions are formed by alignment with the trenches TR. In each of the trenches TR, a gate insulating film GOX formed of, e.g., a silicon oxide film is formed and the gate electrode GE is formed via the gate insulating film GOX. The gate electrode GE is formed of, e.g., a polysilicon film so as to be embedded in each of the trenches TR.

In the IGBT Q1 thus configured, the gate electrode GE is connected with the gate terminal GT via the gate electrode pad GP shown in FIG. 10. Likewise, the $n^+$-type semiconductor regions ER serving as the emitter regions are electrically connected with the emitter terminal ET via an emitter electrode EE (emitter electrode pad EP). The $p^+$-type semiconductor region PR1 serving as a collector region is electrically connected with the collector electrode CE formed on the back surface of the semiconductor chip.

The IGBT Q1 thus configured has each of the high-speed switching property and voltage driving property of a power MOSFET and the low ON-voltage property of a bipolar transistor.

Note that the $n^+$-type semiconductor region NR1 is referred to as a buffer layer. The $n^+$-type semiconductor region NR1 is provided so as to prevent a punch-through phenomenon in which a depletion layer that grows from the p-type semiconductor region PR2 into the $n^-$-type semiconductor region NR2 when the IGBT Q1 has been turned OFF comes in contact with the $p^+$-type semiconductor region PR1 formed in the layer under the $n^-$-type semiconductor region NR2. The $n^+$-type semiconductor region NR1 is also provided for the purpose of limiting the number of holes injected from the $p^+$-type semiconductor region PR1 into the $n^-$-type semiconductor region NR2.

<Operation of IGBT>

Next, a description will be given of the operation of the IGBT Q1 in Embodiment 1. First, a description will be given of the turn-ON operation of the IGBT Q1. In FIG. 13, by applying a sufficient positive voltage between the gate electrode GE and the n$^+$-type semiconductor regions ER serving as the emitter regions, a MOSFET having a trench-gate structure is turned ON. In this case, the region between the p$^+$-type semiconductor region PR1 forming the collector region and the n$^-$-type semiconductor region NR2 is forwardly biased so that the injection of holes from the p$^+$-type semiconductor region PR1 into the n$^-$-type semiconductor region NR2 occurs. Subsequently, electrons equivalent to the positive charges of the injected holes are concentrated on the n$^-$-type semiconductor region NR2. As a result, a resistance drop occurs in the n$^-$-type semiconductor region NR2 (conductivity modulation) to bring the IGBT Q1 into the ON state.

To the ON voltage, the junction voltage between the p$^+$-type semiconductor region PR1 and the n$^-$-type semiconductor region NR2 is added. However, since the resistance value of the n$^-$-type semiconductor region NR2 is reduced by the conductivity modulation by one order of magnitude, with a high breakdown voltage accounting for the major part of the ON resistance, the ON voltage of the IGBT Q1 is lower than that of the power MOSFET. Accordingly, it can be seen that the IGBT Q1 is a device which is effective in achieving a higher breakdown voltage. That is, in the power MOSFET, to increase the breakdown voltage thereof, it is necessary to increase the thickness of an epitaxial layer serving as a drift layer. In this case, however, the ON resistance also increases. By contrast, in the IGBT Q1, even when the thickness of the n$^-$-type semiconductor region. NR2 is increased to achieve a higher breakdown voltage, the conductivity modulation occurs during the ON operation of the IGBT Q1. This allows the IGBT Q1 to have an ON resistance lower than that of the power MOSFET. That is, with the IGBT Q1, even when a higher breakdown voltage is to be achieved, a device having an ON resistance lower than that of the power MOSFET can be implemented.

Subsequently, a description will be given of the turn-OFF operation of the IGBT Q1. When the voltage between the gate electrode GE and the n$^+$-type semiconductor regions ER serving as the emitter regions is reduced, the MOSFET having the trench-gate structure is turned OFF. In this case, the injection of holes from the p$^+$-type semiconductor region PR1 into the n$^-$-type semiconductor region NR2 is stopped and the already injected holes, including some which come to the ends of their lives, also decrease. The remaining holes flow directly toward the emitter electrode EE (tail current) and, at the completion of the flow, the IGBT Q1 is brought into an OFF state. Thus, the IGBT Q1 is allowed to perform the ON/OFF operations.

<Structure of Free Wheel Diode>

Figure 14:
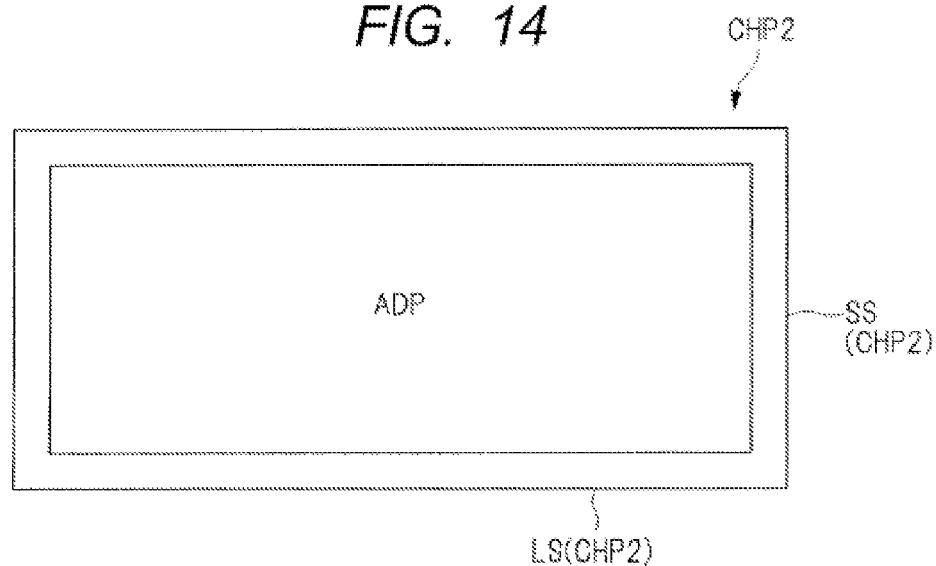
FIG. 14 is a plan view showing the outer shape of a semiconductor chip formed with a diode.

FIG. 14 is a plan view showing the outer shape of the semiconductor chip CHP2 formed with the diode FWD. In FIG. 14, the main surface (front surface) of the semiconductor chip CHP2 is shown. As shown in FIG. 14, the two-dimensional shape of the semiconductor chip CHP2 in Embodiment 1 is a rectangle having longer sides LS(CHP2) and shorter sides SS(CHP2). On the front surface of the semiconductor chip CHP2 having the rectangular shape, the anode electrode pad ADP having a rectangular shape is formed. On the other hand, over the entire back surface of the semiconductor chip CHP2 opposite to the front surface thereof, the cathode electrode pad having a rectangular shape is formed.

Figure 15:
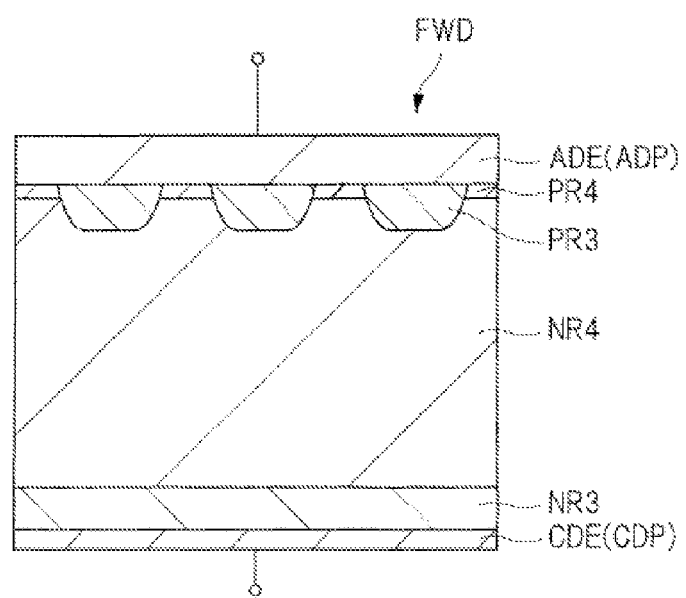
FIG. 15 is a cross-sectional view showing the device structure of the diode.

Subsequently, a description will be given of the device structure of the diode FWD. FIG. 15 is a cross-sectional view showing the device structure of the diode FWD. In FIG. 15, on the back surface of the semiconductor chip, a cathode electrode CDE (cathode electrode pad CDP) is formed and, over the cathode electrode CDE, an n$^+$-type semiconductor region NR3 is formed. Over the n$^+$-type semiconductor region NR3, an n$^-$-type semiconductor region NR4 is formed and, over the n$^-$-type semiconductor region NR4, p-type semiconductor regions PR3 spaced apart from each other are formed. Between the p-type semiconductor regions PR3, p$^-$-type semiconductor regions PR4 are formed. Over the p-type semiconductor regions PR3 and the p$^-$-type semiconductor regions PR4, an anode electrode ADE (anode electrode pad ADP) is formed. The anode electrode ADE is formed of, e.g., an aluminum-silicon alloy.

<Operation of Diode>

In the diode FWD thus configured, when a positive voltage is applied to the anode electrode ADE and a negative voltage is applied to the cathode electrode CDE, the pn junctions between the n$^-$-type semiconductor regions NR4 and the p-type semiconductor regions PR3 are forwardly biased so that a current flows. On the other hand, when a negative voltage is applied to the anode electrode ADE and a positive voltage is applied to the cathode electrode CDE, the pn junctions between the n$^-$-type semiconductor regions NR4 and the p-type semiconductor regions PR3 are reversely biased so that no current flows. In this manner, the diode FWD having a rectifying function can be operated.

The semiconductor device in Embodiment 1 is configured as described above. Subsequently, a description will be given of a manufacturing method of the electronic device in which the semiconductor device is mounted. Specifically, a description will be given first of a manufacturing method of the semiconductor device in Embodiment 1. Then, a description will be given of the manufacturing method of the electronic device using the manufactured semiconductor device.

<Manufacturing Method of Semiconductor Device in Embodiment 1>

1. Step of Providing Base Material (Lead Frame)

Figure 16A:
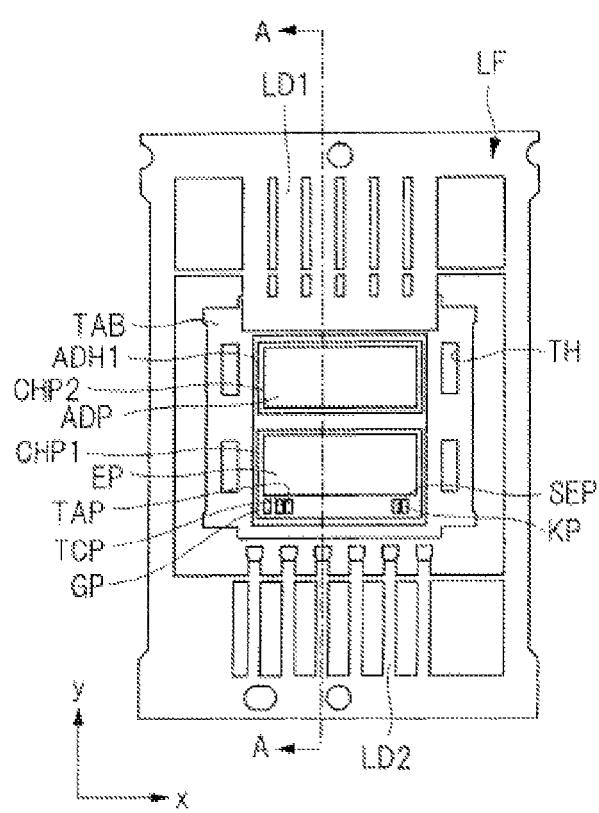
Figure 16B:
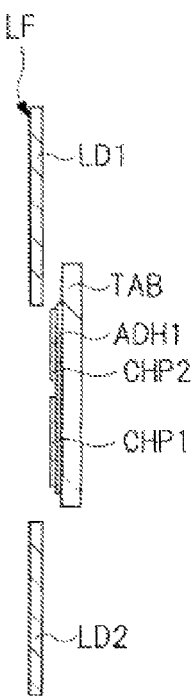

First, as shown in FIGS. 16A and 16B, a lead frame LF and the chip mounting portion TAB are provided. In Embodiment 1, the lead frame LF and the chip mounting portion TAB are configured as separate components. The positional relationship between the lead frame LF and the chip mounting portion TAB is adjusted using, e.g., a positioning jig. Here, as shown in FIG. 16B, the chip mounting portion TAB is thicker than the lead frame LF.

Note that the lead frame LF is formed with the plurality of leads LD1 and the plurality of leads LD2. In the chip mounting portion TAB, the through holes TH are provided so as to extend therethrough from the second surface (back surface) of the chip mounting portion TAB to the first surface (front surface) thereof.

2. Chip Mounting Step

Next, as shown in FIGS. 16A and 16B, on the chip mounting portion TAB, the conductive adhesive ADH1 made of, e.g., a high-melting-point solder is formed. Specifically, by using, e.g., a solder printing method, the conductive adhesive ADH1 made of the high-melting-point solder is printed onto the chip mounting portion TAB.

As the high-melting-point solder mentioned herein, a solder which is not melted even when heated to about 260° C. is intended. Examples of the high-melting-point solder include a Pb-rich high-melting-point solder having a high content of Pb (lead), a melting point of not less than 300° C., and a reflow temperature of about 350° C.

Subsequently, on the chip mounting portion TAB, the semiconductor chip CHP1 formed with the IGBT and the semiconductor chip CHP2 formed with the diode are mounted. At this time, the semiconductor chip CHP1 formed with the IGBT is placed at a position closer to the leads LD2 and the semiconductor chip CHP2 formed with the diode is placed at a position closer to the leads LD1. That is, in plan view, the semiconductor chip CHP2 is mounted so as to be interposed between the leads LD1 and the semiconductor chip CHP1 and the semiconductor chip CHP1 is mounted so as to be interposed between the leads LD2 and the semiconductor chip CHP2.

The semiconductor chip CHP2 formed with the diode is placed such that the cathode electrode pad formed on the back surface of the semiconductor chip CHP2 comes in contact with the chip mounting portion TAB via the conductive adhesive ADH1. As a result, the anode electrode pad ADP formed on the front surface of the semiconductor chip CHP2 faces upward.

On the other hand, the semiconductor chip CHP1 formed with the IGBT is placed such that the collector electrode pad formed on the back surface of the semiconductor chip CHP1 comes in contact with the chip mounting portion TAB via the conductive adhesive ADH1. As a result, the cathode electrode pad of the semiconductor chip CHP and the collector electrode pad of the semiconductor chip CHP1 are electrically connected with each other via the chip mounting portion TAB.

Consequently, the emitter electrode pad EP and the plurality of electrode pads including the gate electrode pad GP, the temperature sensing electrode pad TCP, the temperature sensing electrode pad TAP, the current sensing electrode pad SEP, and the Kelvin sensing electrode pad KP each formed on the front surface of the semiconductor chip CHP1 face downward. The semiconductor chip CHP1 formed with the IGBT is mounted on the chip mounting portion TAB such that the emitter electrode pad EP is located closer to the leads LD1 and the plurality of the electrode pads are arranged closer to the leads LD2.

Note that the order in which the semiconductor chip CHP1 formed with the IGBT and the semiconductor chip CHP2 formed with the diode are mounted is not determined. It may be possible to mount the semiconductor chip CHP1 first and then mount the semiconductor chip CHP2 or mount the semiconductor chip CHP2 first and then mount the semiconductor chip CHP1.

3. Electrically Connecting Step

Next, as shown in FIGS. 17A and 17B, on the anode electrode pad ADP of the semiconductor chip CHP2, the conductive adhesive ADH2 made of, e.g., a high-melting-point solder is formed. Then, on the emitter electrode pad EP of the semiconductor chip CHP1, the conductive adhesive ADH2 made of, e.g., a high-melting-point solder is formed. Further, as shown in FIGS. 17A and 17B, on the partial region of each of the leads LD1 also, the conductive adhesive ADH2 made of, e.g., a high-melting-point solder is formed.

Specifically, by using, e.g., a coating method, the conductive adhesive ADH2 made of, e.g., a high-melting-point solder is applied even onto the semiconductor chip CHP1, the semiconductor chip CHP2, and the partial region of each of the leads LD1. The conductive adhesive ADH2 formed at this time may have material components which may be the same as or different from those of the conductive adhesive ADH1 described above.

Then, as shown in FIGS. 17A and 17B, over the leads LD1, the semiconductor chip CHP2, and the semiconductor chip CHP1, the clip CLP is mounted.

Consequently, the leads LD1, the anode electrode pad ADP formed on the semiconductor chip CHP2, and the emitter electrode pad EP formed on the semiconductor chip CHP1 are electrically connected with each other by the clip CLP.

Subsequently, a reflow is performed on the conductive adhesive ADH1 made of the high-melting-point solder and the conductive adhesive ADH2 made of the high-melting-point solder. Specifically, the lead frame LF including the conductive adhesives ADH1 and ADH2 is heated at a temperature of, e.g., about 350° C. In this manner, the conductive adhesive ADH1 made of the high-melting-point solder and the conductive adhesive ADH2 made of the high-melting-point solder can be melted.

Then, to remove the flux contained in each of the high-melting-point solders, flux cleaning is performed. Then, in terms of improving wire bondability in the wire bonding step performed in the subsequent process, plasma treatment is performed on the front surface of the lead frame LF1 to clean the surface of the lead frame LF.

Figure 18A:
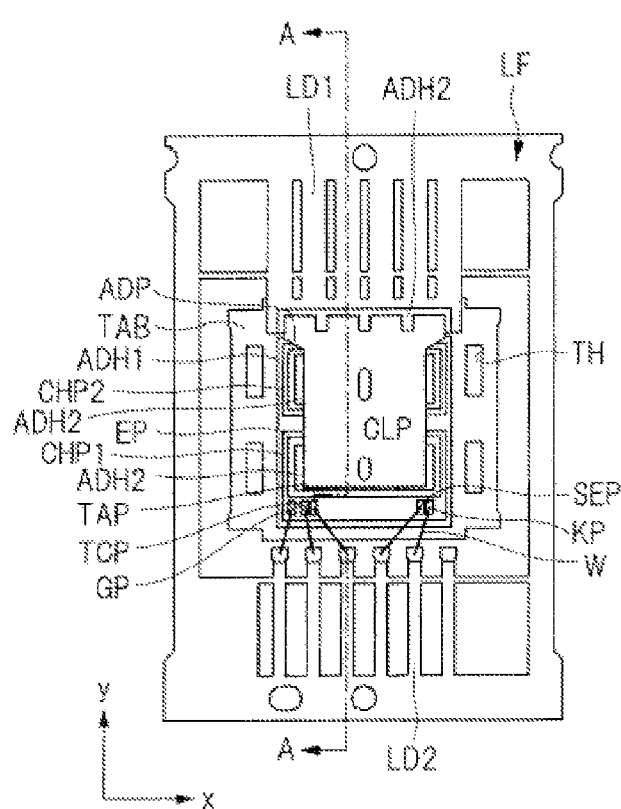
Figure 18B:
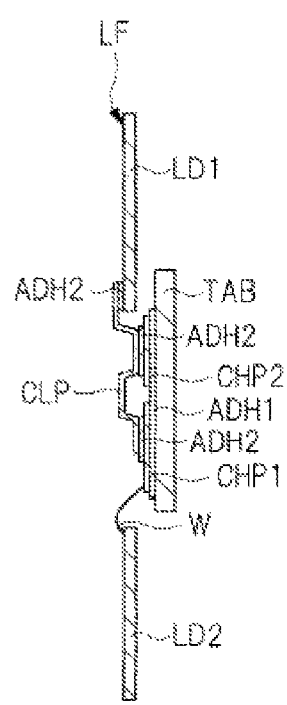

Subsequently, as shown in FIGS. 18A and 18b, the wire bonding step is performed. For example, as shown in FIG. 18A, the lead LD2 and the gate electrode pad GP are electrically connected by the wire W, and the lead LD2 and the temperature sensing electrode pad TCP are electrically connected by the wire W. Also, the lead LD2 and the temperature sensing electrode pad TAP are electrically connected by the wire W, and the lead LD2 and the current sensing electrode pad SEP are electrically connected by the wire W. Also, the lead LD2 and the Kelvin sensing electrode pad KP are electrically connected by the wire W. At this time, in Embodiment 1, the leads LD2 are arranged on the opposite side of the leads LD1 connected with the clip CLP. Therefore, the wire bonding step can be performed without considering the interference by the clip CLP.

4. Sealing (Molding) Step

Figures 19A, 19B:
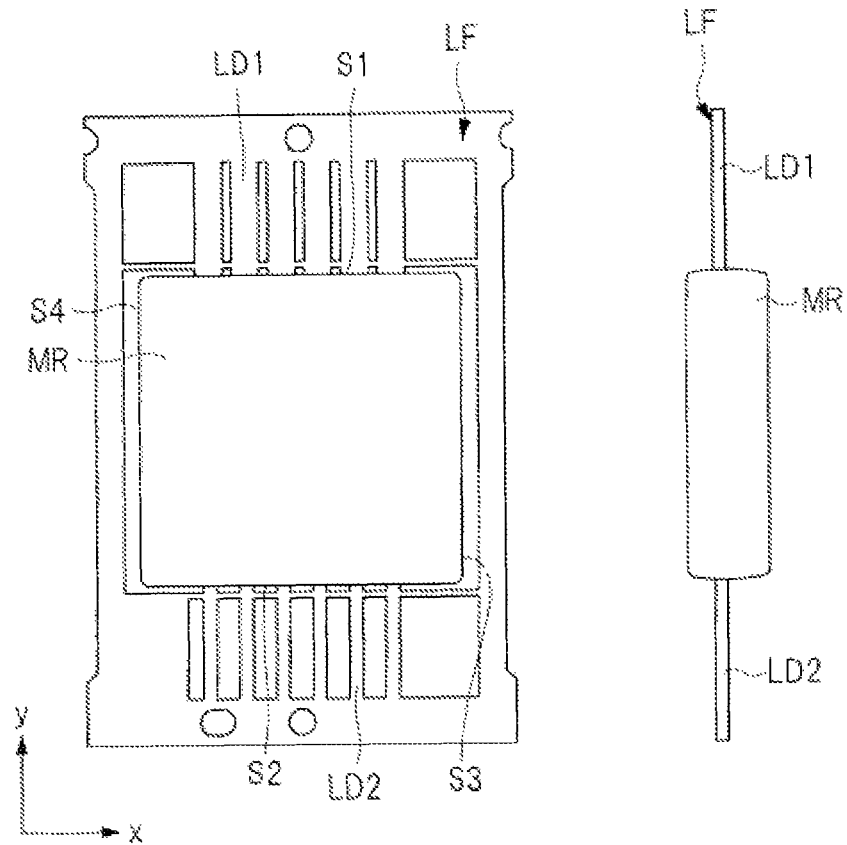

Next, as shown in FIGS. 19A and 19B, the semiconductor chip CHP1, the semiconductor chip CHP2, a part of the chip mounting portion TAB, a part of each of the leads LD1, a part of each of the plurality of leads LD2, the clip CLP, and the wires W are sealed to form the sealing body MR.

At this time, the sealing body MR has the upper surface, the lower surface opposite to the upper surface, the first side surface located between the upper surface and the lower surface in the thickness orientation thereof, and the second side surface facing to the first side surface. In FIG. 19A, the first side surface S1 and the second side surface S2 are shown. Also, in the sealing body MR, the leads LD1 protrude from the first side surface (side S1) of the sealing body MR and the plurality of leads LD2 protrude from the second side surface (side S2) of the sealing body MR.

Note that, from the lower surface of the sealing body MR described above, the second surface (back surface) of the chip mounting portion TAB is exposed, though not shown in FIGS. 19A and 19B. As shown in FIG. 18A, the two-dimensional area of the chip mounting portion TAB is larger than the total two-dimensional area of the semiconductor chips CHP1 and CHP2. In the portion of the chip mounting portion TAB which does not overlap the semiconductor chips CHP1 and CHP2 in plan view, the through holes TH are formed to extend through the chip mounting portion TAB from the first surface (front surface) thereof to the second surface (back surface) thereof. In each of the through holes TH, a part of the sealing body MR is embedded. Thus, according to Embodiment 1, the anchoring effect achieved by the resin embedded in the through holes TH improves the adhesion strength between the sealing body MR and the chip mounting portion TAB.

In the sealing step in Embodiment 1, the sealing body MR is configured such that a part of the chip mounting portion TAB does not protrude from the side surface of the sealing body MR. However, the configuration of the sealing body MR is not limited thereto. For example, the sealing body MR can also be formed such that a part of the chip mounting portion TAB protrudes from the side surface of the sealing body MR. In this case, as shown in FIG. 19A, the sealing body MR may also be formed to have the third side surface (side S3) intersecting each of the first side surface (side S1) and the second side surface (side S2) and the fourth side surface (side S4) intersecting each of the first and second side surfaces to face to the third side surface such that a part of the chip mounting portion TAB protrudes from each of the third and fourth side surfaces of the sealing body MR.

5. Outer Plating Step

Then, as shown in FIGS. 20A and 20B, over the chip mounting portion TAB, the surface of a part of each of the leads LD1, and the surface of a part of each of the leads LD2 which are exposed from the back surface of the sealing body MR, a plating layer PF (tin film) as a conductor film is formed. That is, over the portions of the leads LD1 exposed from the sealing body MR, the portions of the plurality of leads LD2 exposed from the sealing body MR, and the second surface (back surface) of the chip mounting portion TAB, the plating layer PF is formed.

6. Marking Step

Then, the front surface of the sealing body MR made of a resin is formed with information (marks) such as a product name and a model number. Note that, as a method for forming the marks, a method which prints the marks by a printing method or a method which engraves the marks by irradiating the front surface of the sealing body with a laser can be used.

7. Singulation Step

Subsequently, by cutting a part of each of the plurality of leads LD1 and a part of each of the plurality of leads LD2, the plurality of leads LD1 and the plurality of leads LD2 are separated from the lead frame LF. In this manner, as shown in FIG. 21, the semiconductor device PAC in Embodiment 1 can be manufactured. Thereafter, each of the plurality of leads LD1 and each of the plurality of leads LD2 are subjected to forming. Then, after a test step of testing, e.g., electric properties is performed, each of the semiconductor devices PAC determined to be non-defective is shipped. In the manufacturing process of the electronic device EA1 in Embodiment 1, the semiconductor device PAC shipped as a non-defective product is used.

Note that, in Embodiment 1, the description has been given of the example in which the high-melting-point solder is used as the conductive adhesives ADH1 and ADH2, but the conductive adhesives ADH1 and ADH2 are not limited thereto. For example, a silver paste using a material such as an epoxy resin as a binder and containing a silver filler ((Ag) filler) may also be used as the conductive materials ADH1 and ADH2.

<Manufacturing Method of Electronic Device in Embodiment 1>

Subsequently, a description will be given of the manufacturing method of the electronic device in Embodiment 1. First, as shown in FIG. 22, the wiring board WB is provided. On the upper surface of the wiring board WB, the P-electrode PE, the U-electrode UE, and the N-electrode NE have been formed. The P-electrode is electrically connected with the P-terminal PTE. The U-electrode UE is electrically connected with the U-terminal UTE. The N-electrode NE is electrically connected with the N-terminal NTE.

In other words, as shown in FIG. 22, the wiring board WB has the rectangular shape including the pair of longer sides, and the pair of shorter sides intersecting the pair of longer sides. Specifically, the wiring board WB has the first and second longer sides LS1 and LS2 extending in parallel with the y-direction and also has the first and second shorter sides SS1 and SS2 extending in parallel with the x-direction. In the wiring board WB in Embodiment 1, the P-terminal PTE is provided beside the first shorter side SS1, while the U-terminal UTE and the N-terminal NTE are provided beside the second shorter side SS2.

Next, as shown in FIG. 23, the semiconductor device PAC is mounted on the wiring board WB. Specifically, as shown in FIG. 23, the semiconductor device PAC1 is mounted on the wiring board WB such that the emitter terminals ET1 of the semiconductor device PAC1 are electrically connected with the N-electrode NE formed on the wiring board WB, and such that the signal terminals SGT1 of the semiconductor device PAC1 are electrically connected with the substrate wiring. At this time, the back surface of the semiconductor device PAC is electrically connected with the U-electrode UE formed on the wiring board WB.

Then, as shown in FIG. 24, the semiconductor device PAC2 is mounted on the wiring board WB. Specifically, as shown in FIG. 24, the semiconductor device PAC2 is mounted on the wiring board WB such that the emitter terminals ET2 of the semiconductor device PAC2 are electrically connected with the U-electrode UE formed on the wiring board WB, and such that the signal terminals SGT2 of the semiconductor device PAC2 are electrically connected with the substrate wiring. At this time, the back surface of the semiconductor device PAC2 is electrically connected with the P-electrode PE formed on the wiring board WB.

In Embodiment 1, as shown in FIG. 24, the semiconductor device PAC2 is mounted on the upper surface of the wiring board WB such that, in plan view, the orientation of the semiconductor device PAC2 is tilted at approximately 90 degrees with respect to the orientation of the semiconductor device PAC1. In other words, the semiconductor device PAC1 is mounted on the upper surface of the wiring board WB such that the emitter terminals ET1 and the signal terminals SGT1 are arranged along the x-direction in which the pair of shorter sides of the wiring board WB extend. On the other hand, the semiconductor device PAC2 is mounted on the upper surface of the wiring board WB such that the emitter terminals ET2 and the signal terminals SGT2 are arranged along the y-direction in which the pair of longer sides of the wiring board WB extend. In this manner, the electronic device unit EAU1 in Embodiment 1 can be manufactured.

Thereafter, as shown in FIG. 4, the three manufactured electronic device units EAU1 are combined to manufacture the electronic device EA1 corresponding to the 3-phase inverter. Specifically, after the three electronic device units EAU1 are arranged to be aligned in the x-direction in which the pair of shorter sides extend, the respective P-terminals PTE formed on the three electronic device units EAU1 are connected with the connection member CNT1, while the respective N-terminals NTE formed on the three electronic device units EAU1 are connected with the connection member CNT2. Then, by connecting the capacitor element CAP between the connection members CNT1 and CNT2, the electronic device EA1 in Embodiment 1 can be manufactured.

<Characteristic Feature of Embodiment 1>

The characteristic feature of Embodiment 1 lies in that, e.g., as shown in FIG. 6, the semiconductor devices PAC1 and PAC2 are mounted on the upper surface of the wiring board WB such that, in plan view, the orientation of the semiconductor device PAC2 is tilted at approximately 90 degrees with respect to the orientation of the semiconductor device PAC1. That is, the semiconductor device PAC1 is mounted on the upper surface of the wiring board WB such that the emitter terminals ET1 and the signal terminals SGT1 are arranged along the x-direction in which the pair of shorter sides of the wiring board WB extend. On the other hand, the semiconductor device PAC2 is mounted on the upper surface of the wiring board WB such that the emitter terminals ET2 and the signal terminals SGT2 are arranged along the y-direction in which the pair of longer sides of the wiring board WB extend.

Thus, according to Embodiment 1, the path length between the P-terminal PTE and the U-terminal UTE can be reduced to allow a reduction in the parasitic resistance between the P-terminal PTE and the U-terminal UTE.

A specific description will be given of the advantage of Embodiment 1, while comparing the electronic device unit EAU1 in Embodiment 1 to an electronic device unit EAU(R) in a related art technology.

FIG. 25A is a schematic diagram showing a two-dimensional configuration of the electronic device unit EAU(R) in the related art technology. FIG. 25B is a schematic diagram showing a two-dimensional configuration of the electronic device unit EAU1 in Embodiment 1.

First, in FIG. 25A, in the related art technology, the semiconductor devices PAC1 and PAC2 mounted on the wiring board WB have the same orientations. That is, the emitter terminals ET1 and the signal terminals SGT1 of the semiconductor device PAC1 are arranged along the x-direction and the emitter terminals ET2 and the signal terminals SGT2 of the semiconductor device PAC2 are also arranged along the x-direction. In this case, as shown in FIG. 25A, a current path RT2 between the U-terminal UTE and the N-terminal NTE is shorter, while a current path RT1 between the P-terminal PTE and the U-terminal UTE is longer. Accordingly, in the related art technology, the parasitic resistance between the P-terminal PTE and the U-terminal UTE undesirably increases. This means that, in the related art technology, a delay time in signal transmission defined by the product of a parasitic resistance and a parasitic capacitance in the current path RT1 increases. Therefore, there is a room for an improvement in terms of improving the performance of the electronic device represented by high-speed switching.

Accordingly, in Embodiment 1, an approach of reducing the length of the current path RT1 is taken. That is, as shown in FIG. 25B, in the electronic device unit EAU1 in Embodiment 1, the semiconductor devices PAC1 and PAC2 are mounted on the upper surface of the wiring board WB such that the orientation of the semiconductor device PAC2 is tilted at approximately 90 degrees with respect to the orientation of the semiconductor device PAC2. That is, in Embodiment 1, the emitter terminals ET1 and the signal terminals SGT1 of the semiconductor device PAC1 are arranged along the x-direction, while the emitter terminals ET2 and the signal terminals SGT2 of the semiconductor device PAC2 are arranged along the y-direction of the wiring board WB.

As a result, when FIGS. 25A and 25B are compared to each other, it can be seen that the current path RT1 between the P-terminal PTE and the U-terminal UTE shown in FIG. 25B is considerably shorter than the current path RT1 between the P-terminal PTE and the U-terminal UTE shown in FIG. 25A. That is, by arranging the semiconductor devices PAC1 and PAC2 on the wiring board WB such that the orientations of the semiconductor devices PAC1 and PAC2 are different by approximately 90 degrees as in Embodiment 1, the length of the current path RT1 can be reduced to be shorter than in the related art technology in which the semiconductor devices PAC1 and PAC2 have the same orientations. As a result, according to Embodiment 1, the parasitic resistance between the P-terminal PTE and the U-terminal UTE can be reduced to be lower than in the related art technology. This means that, in the electronic device unit EAU1 in Embodiment 1, the delay time in signal transmission defined by the product of the parasitic resistance and the parasitic capacitance in the current path RT1 can be reduced to be shorter than in the related art technology. Therefore, with the electronic device unit EAU1 in Embodiment 1, the performance of the electronic device represented by high-speed switching can be improved.

The technical idea of Embodiment 1 is based on the assumption that the electronic device unit EAU1 is manufactured using the semiconductor devices PAC1 and PAC2 that have been preliminarily resin-sealed. In this case, since the preliminarily resin-sealed semiconductor devices are used, the packaging step in the manufacturing process of the electronic device is no longer necessary to allow a reduction in manufacturing process time. In addition, since the plurality of semiconductor devices each determined to be non-defective can be used without any modification, the advantage of improving a product yield in the electronic device can be obtained.

However, when the electronic device is formed of the semiconductor devices in each of which the IGBT and the diode are resin-sealed, the positions of the external connection terminals provided in the semiconductor device are also fixed. As a result, the current path between the input terminal and the output terminal of the electronic device undesirably increases unless the arrangement/layout of the semiconductor devices each including the IGBT and the diode over the wiring board is carefully considered. Specifically, when the semiconductor devices PAC1 and PAC are simply mounted on the wiring board WB to have the same orientations as in the related art technology shown in FIG. 25A, the current path RT1 between the P-terminal PTE and the U-terminal UTE undesirably increases. That is, in the technique using the preliminarily resin-sealed semiconductor devices, due to the fixed position of the external connection terminals provided on the semiconductor devices, the current path between the P-terminal PTE and the U-terminal UTE considerably increases.

Accordingly, in the technical idea of the present embodiment, the approach is taken which minimizes the current path between the P-terminal and the U-terminal UTE even when the flexibility of the connection between the P-terminal PTE and the U-terminal UTE is limited by the fixed positions of the external connection terminals provided on the semiconductor device. Specifically, the semiconductor devices PAC1 and PAC2 are arranged on the wiring board WB such that the orientation of the semiconductor device PAC1 and the orientation of the semiconductor device PAC2 are different by approximately 90 degrees. The characteristic feature of Embodiment 1 lies in this point and, even when the positions of the external terminals provided on the semiconductor devices are fixed, the current path between the P-terminal PTE and the U-terminal UTE can be reduced. That is, in Embodiment 1, by using the preliminarily resin-sealed semiconductor devices PAC1 and PAC2, it is possible to minimize the current path RT1 between the P-terminal PTE and the U-terminal UTE even under the constraint of the fixed positions of the external terminals, while retaining the advantage of being able to reduce the manufacturing process time and improve the product yield. As a result, according to embodiment 1, it is possible to improve the performance of the electronic device represented by high-speed switching, while retaining the advantage of being able to reduce the manufacturing process time and improve the product yield.

Also in the electronic device unit EAU1 in Embodiment 1, as shown in FIG. 25B, the consideration has been given to the position at which the semiconductor device PAC2 is placed and the position at which the P-electrode PTE formed on the wiring board WB is placed so as to maximize the distance between the current path RT1 and the gate terminal GT2 of the semiconductor device PAC2. Consequently, with the electronic device unit EAU1 in Embodiment 1, it is also possible to achieve a reliability improvement.

Specifically, between the P-terminal PTE and the U-terminal UTE, a current flows. When the current flows, a magnetic field is inevitably formed around the current. The intensity of the magnetic field increases as the magnitude of the current increases. Accordingly, as a larger current is allowed to flow, the magnetic field is enlarged. At this time, when, e.g., the current path RT1 and the gate terminal GT2 are proximate to each other, the gate terminal GT2 is consequently affected by the magnetic field. That is, when the gate terminal GT2 is placed in proximity to the current path RT in which a large current flows, electromagnetically induced noise resulting from the flow of the large current in the current path RT1 is consequently applied to the gate terminal GT2. In this case, a situation may be encountered where, e.g., a voltage of not less than a set value is applied to the gate electrode of the IGBT to possibly cause the breakdown of the IGBT. In other words, in the configuration in which the gate terminal GT2 is provided in proximity to the current path RT1, the large magnetic field resulting from the large current also increases the electromagnetically induced noise, which adversely affects the gate terminal GT2.

With regard to this point, in the semiconductor device PAC2 in Embodiment 1, as shown in, e.g., FIG. 25B, the current path RT1 in which the large current flows and the gate terminal GT2 which transmits an extremely weak signal are arranged so as to be most distant from each other. As a result, according to Embodiment 1, even when electromagnetically induced noise resulting from the large magnetic field generated by making a large current flow in the current path RT1 generates, it is possible to inhibit the electromagnetically induced noise from adversely affecting the gate terminal GT2. That is, in the semiconductor device PAC2 in Embodiment 1, the gate terminal GT2 is placed so as to be maximally distant from the current path RT1. Consequently, even when a large current is handled, it is possible to reduce the influence of the electromagnetically induced noise resulting from the magnetic field formed by the large current and thus improve the reliability of the electronic device unit EAU1 in Embodiment 1.

<Modification 1>

Next, a description will be given of a configuration of an electronic device unit EAU2 in Modification 1. The electronic device unit EAU2 in Modification 1 has substantially the same configuration as that of the electronic device unit EAU1 in Embodiment 1 shown in FIG. 6 so that a description will be given mainly of the difference therebetween.

Figure 26:
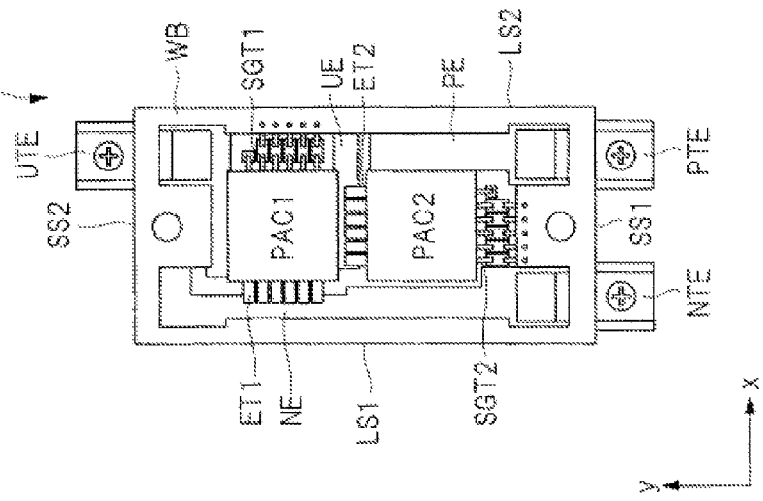
FIG. 26 is a schematic diagram showing a two-dimensional configuration of an electronic device unit in Modification 1.

FIG. 26 is a schematic diagram showing a two-dimensional configuration of the electronic device unit EAU2 in Modification 1. In FIG. 26, in the electronic device unit EAU2 in Modification 1, the P-electrode PE electrically connected with the P-terminal PTE and the gate terminal GT2 provided on the semiconductor device PAC2 are arranged in proximity. That is, in contrast to Embodiment 1 in which the gate terminal GT2 is placed so as to be distant from the current path RT1 as shown in, e.g., FIG. 25B, in Modification 1, the current path and the gate terminal GT2 are arranged in proximity. Thus, the technical idea of Embodiment 1 is also applicable to the configuration shown in Modification 1.

For example, in terms of reducing the influence of electromagnetically induced noise resulting from a magnetic field formed by a large current, it is desirable to increase the distance between the current path RT1 and the gate electrode GT2 as in Embodiment 1. However, when a large current is not used, even when the distance between the current path RT1 and the gate electrode GT2 is reduced, the influence of the electromagnetically induced noise is considered to be small. Accordingly, it is also possible to use the configuration of the electronic device unit EAU2 in Modification 1.

<Modification 2>

Subsequently, a description will be given of a configuration of an electronic device unit EAU3 in Modification 2. The electronic device unit EAU3 in Modification 2 has substantially the same configuration of that of the electronic device unit EAU1 in Embodiment 1 shown in, e.g., FIG. 6 so that a description will be given mainly of the difference therebetween.

Figure 27:
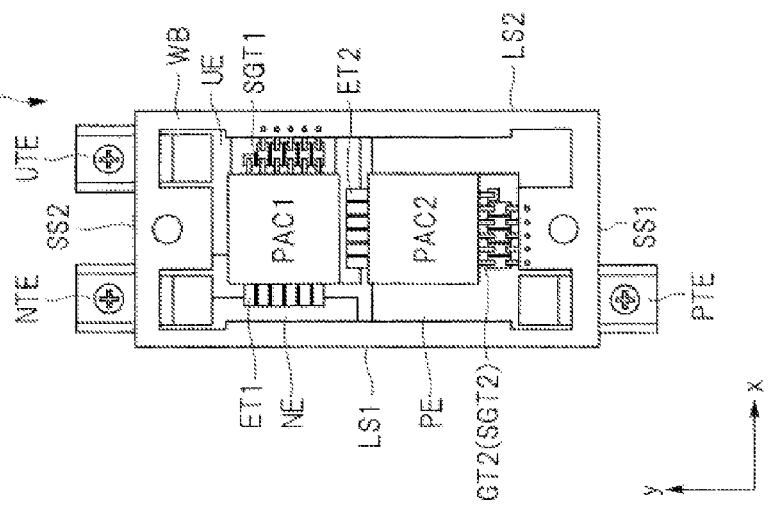
FIG. 27 is a schematic diagram showing a two-dimensional configuration of an electronic device unit in Modification 2.

FIG. 27 is a schematic diagram showing a two-dimensional configuration of the electronic device unit EAU3 in Modification 2. In FIG. 27, in the electronic device unit EAU3 in Modification 2, the P-terminal PTE and the N-terminal NTE are formed beside the shorter side SS1. On the other hand, the U-terminal UTE is formed beside the shorter side SS2. To such a configuration as shown in Modification 2 also, the technical idea of Embodiment 1 is applicable.

FIG. 28A is a schematic diagram showing the two-dimensional configuration of the electronic device unit EAU(R) in the related art technology. FIG. 28B is a schematic diagram showing the two-dimensional configuration of the electronic device unit EAU3 in Modification 2. As is obvious from FIGS. 28A and 28B, the current path RT1 between the P-terminal PTE and the U-terminal UTE shown in FIG. 28B is considerably shorter than the current path RT1 between the P-terminal PTE and the U-terminal UTE shown in FIG. 28A. That is, in Modification 2 also, the semiconductor devices PAC1 and PAC2 are arranged on the wiring board WB such that the orientations of the semiconductor devices PAC1 and PAC2 are different by approximately 90 degrees. This allows the length of the current path RT1 to be shorter than in the related art technology in which the semiconductor devices PAC1 and PAC2 have the same orientations.

As a result, in Modification 2 also, the parasitic resistance between the P-terminal PTE and the U-terminal UTE can be reduced to be lower than in the related art technology. Consequently, in the electronic device unit EAU3 in Modification 2 also, the delay time in signal transmission defined by the product of the parasitic resistance and the parasitic capacitance in the current path RT1 can be reduced to be shorter than in the related art technology. Thus, the electronic device unit EAU3 in Modification 2 can also achieve an improvement in the performance of the electronic device represented by high-speed switching.

Note that, as can be seen from FIGS. 28A and 28B, in Modification 2, the current path RT2 between the U-terminal UTE and the N-terminal NTE is longer than the current path RT2 in the related art technology. However, since the current paths RT1 and RT2 are substantially equal in the electronic device unit EAU3 in Modification 2, even when the current path RT2 is longer, it will not conceivably present a serious problem.

Figure 29:
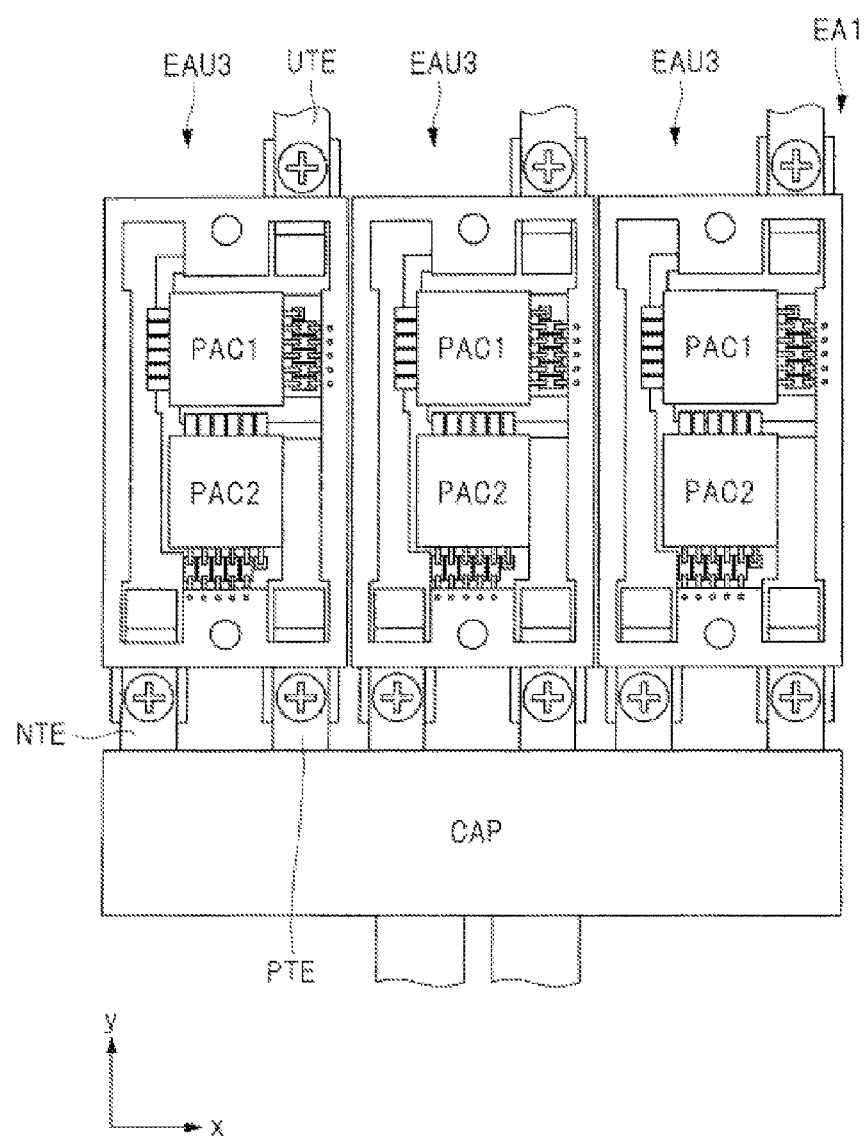
FIG. 29 is a schematic diagram showing an example in which three electronic device units in Modification 2 are combined to form an electronic device corresponding to a 3-phase inverter circuit.

FIG. 29 is a schematic diagram showing an example in which the three electronic device units EAU3 in Modification are combined to form the electronic device EA1 corresponding to a 3-phase inverter circuit. In FIG. 29, the electronic device EA1 in Modification 2 has a configuration in which the three electronic device units EAU3 are arranged to be aligned in the x-direction in which the shorter sides of the electronic device units EAU3 extend. Between the P-terminal PTE and the N-terminal NTE which are provided on each of the three electronic device units EAU3, the capacitor element CAP is connected. That is, in FIG. 29, the capacitor element CAP is shown which is integrally connected with the three electronic device units EAU3 but, more specifically, the capacitor element CAP is connected with each of the electronic device units EAU3.

<Modification 3>

Figure 30:
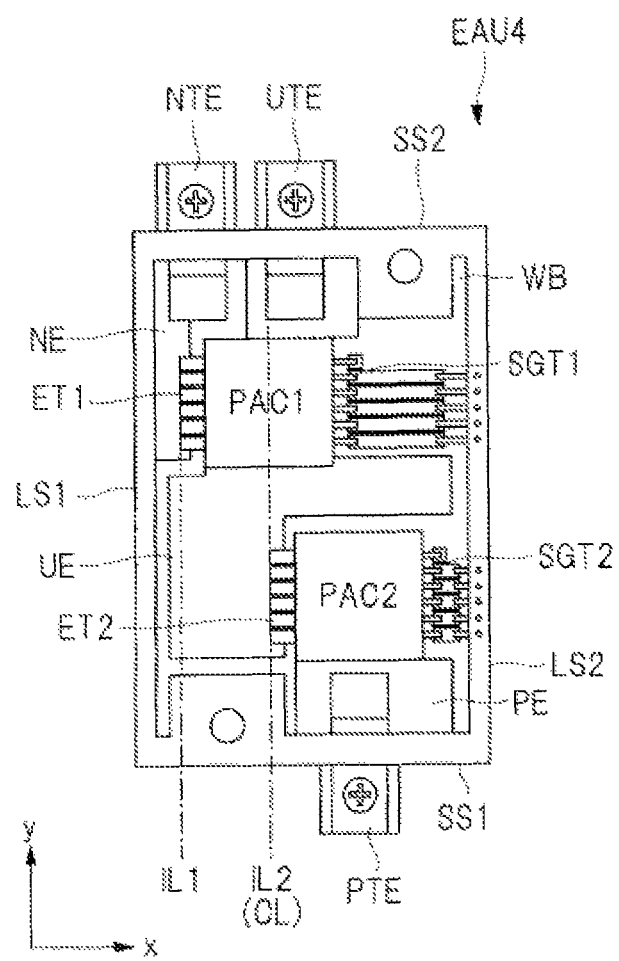
FIG. 30 is a schematic diagram showing a two-dimensional configuration of an electronic device unit in Modification 3.

Next, a description will be given of a configuration of an electronic device unit EAU4 in Modification 3. FIG. 30 is a schematic diagram showing a two-dimensional configuration of the electronic device unit EAU4 in Modification 3. In FIG. 30, the electronic device unit EAU4 in Modification 3 has the semiconductor devices PAC1 and PAC2 on the wiring board WB.

The semiconductor device PAC1 is mounted on the upper surface of the wiring board WB such that the emitter terminals ET1 and the signal terminals SGT1 are arranged along the x-direction in which the pair of shorter sides (shorter sides SS1 and SS2) of the wiring board WB extend.

Likewise, the semiconductor device PAC2 is also mounted on the upper surface of the wiring board WB such that the emitter terminals ET2 and the signal terminals SGT2 are arranged along the x-direction in which the pair of shorter sides (shorter sides SS1 and SS2) of the wiring board WB extend.

When it is assumed here that the straight line passing through the tip portions of the emitter terminals ET1 of the semiconductor device PAC1 and extending in the y-direction parallel with the pair of longer sides (longer sides LS1 and LS2) of the wiring board WB is a first imaginary line IL1 and the straight line passing through the tip portions of the emitter terminals ET2 of the semiconductor device PAC2 and extending in the y-direction is a second imaginary line IL2, the position of the first imaginary line IL1 in the x-direction is different from the position of the second imaginary line IL2 in the x-direction. That is, the semiconductor devices PAC1 and PAC2 are mounted on the wiring board WB to be shifted from each other in the x-direction.

In particular, in Modification 3, when it is assumed that the straight line passing through the center of the semiconductor device PAC1 in the x-direction is a center line CL, the position of the center line CL in the x-direction coincides with the position of the second imaginary line IL2 in the x-direction. Consequently, in the electronic device unit EAU4 in Modification 3, the current path between the P-terminal PTE and the U-terminal UTE can be reduced. A description will be given below of this point.

FIG. 31A is a schematic diagram showing the two-dimensional configuration of the electronic device unit EAU(R) in the related art technology. FIG. 31B is a schematic diagram showing a two-dimensional configuration of the electronic device unit EAU4 in Modification 3. As is obvious from FIGS. 31A and 31B, the current path RT1 between the P-terminal PTE and the U-terminal UTE shown in FIG. 31B is considerably shorter than the current path RT1 between the P-terminal PTE and the U-terminal UTE shown in FIG. 31A. That is, in Modification 3, by arranging the semiconductor devices PAC1 and PAC2 at positions shifted from each other in the x-direction such that the center line passing through the center of the semiconductor device PAC1 in the x-direction coincides with the second imaginary line passing through the tip portions of the emitter terminals ET2 of the semiconductor device PAC2 and extending in the y-direction, the current path RT1 can be reduced. Thus, in the electronic device unit EAU4 in Modification 3, the length of the current path RT1 can be reduced to be shorter than in the related art technology.

As a result, in Modification 3 also, the parasitic resistance between the P-terminal PTE and the U-terminal UTE can be reduced to be lower than in the related art technology. This means that, in the electronic device unit EAU4 in Modification 3 also, the delay time in signal transmission defined by the product of the parasitic resistance and the parasitic capacitance in the current path RT1 can be reduced to be shorter than in the related art technology. Thus, the electronic device unit EAU4 in Modification 3 can also achieve an improvement in the performance of the electronic device represented by high-speed switching.

Note that an advantage specific to Modification 3 lies in the fact that, as shown in, e.g., FIG. 30, each of the signal terminals SGT1 of the semiconductor device PAC1 and the signal terminals SGT2 of the semiconductor device PAC2 can be extracted from the same longer side LS2. As a result, according to Modification 3, the wiring layout of a control substrate (pre-driver substrate) which controls the electronic device unit EAU4 can be simplified. Specifically, it is possible to shorten wiring over the pre-driver substrate and enhance layout flexibility.

That is, the pre-driver substrate is mounted over the electronic device unit EAC4, and the pre-driver substrate and the signal terminals SGT1 and SGT2 of the electronic device unit EAU4 are electrically connected with each other. In this case, the signal terminals SGT1 and SGT2 are connected with the pre-driver substrate via relay terminals which are bent in a perpendicular direction. Accordingly, if the signal terminals SGT1 and SGT2 are configured so as to be extracted from the same side of the wiring board WB, the connection regions over the pre-driver substrate can be combined to allow the wiring layout over the pre-driver substrate to be simplified.

<Modification 4>

Next, a description will be given of a configuration of the electronic device EA1 in Modification 4. For example, in Embodiment 1, the description has been given of the example in which, as shown in FIG. 4, the three electronic device units EAU1 are arranged in the x-direction to form the electronic device EA1 corresponding to the 3-phase inverter circuit. However, the configuration aspect of the electronic device EA1 is not limited thereto. For example, as shown in FIG. 32, the electronic device EA1 corresponding to the 3-phase inverter circuit may also be configured by mounting six semiconductor devices on the upper surface of an integrated wiring board WB(INT). That is, the configuration aspect of the electronic device EA1 corresponding to the 3-phase inverter circuit is not limited to a form in which the plurality of electronic device units EAU1 are combined, and a form using the integrated wiring board WB(INT) can also be used. That is, the technical idea of Embodiment 1 is applicable to the electronic devices EA1 in various configuration aspects.

<Modification 5>

Figure 33:
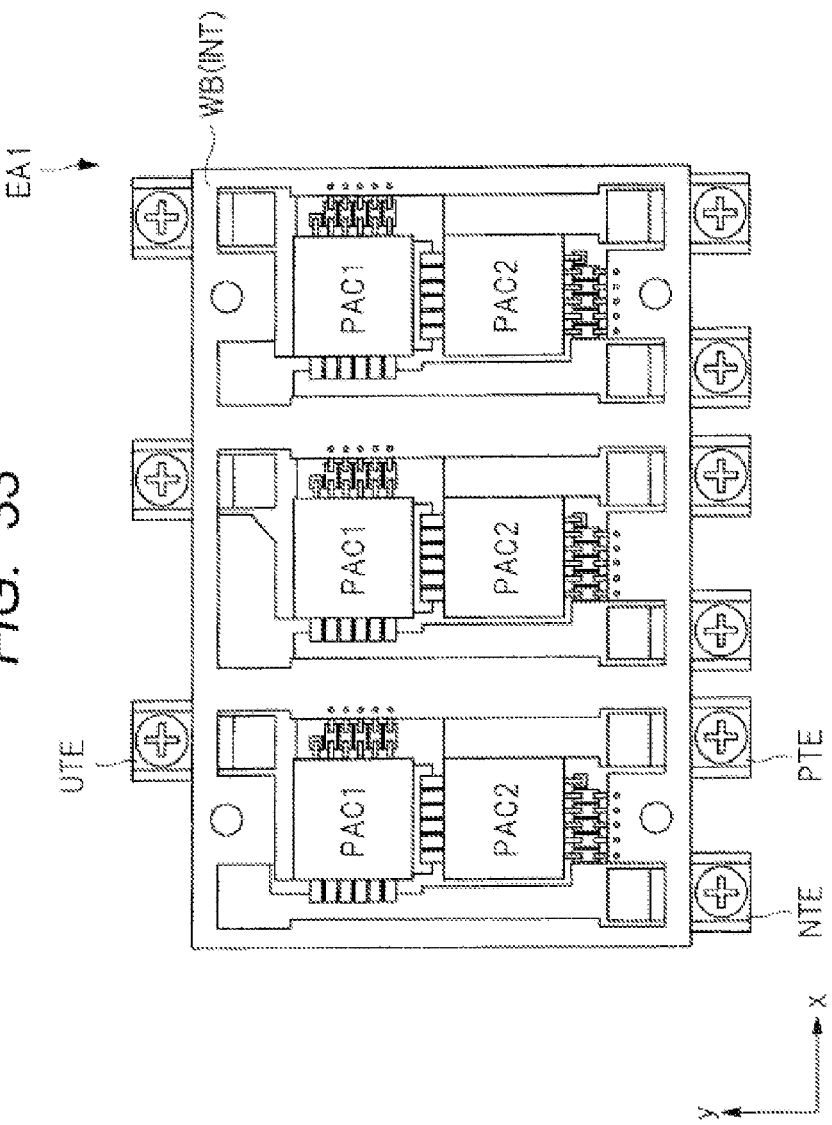
FIG. 33 is a schematic diagram showing a two-dimensional configuration of an electronic device in Modification 5.

Subsequently, a description will be given of a configuration of the electronic device EA1 in Modification 5. FIG. 33 is a schematic diagram showing a two-dimensional configuration of the electronic device EA1 in Embodiment 5. In Modification 5 shown in FIG. 33 also, in the same manner as in Modification 4, the electronic device EA1 corresponding to the 3-phase inverter circuit can be configured by mounting six semiconductor devices on the upper surface of the integrated wiring board WB(INT). In particular, in Modification 5, an example is shown in which the P-terminal PTE and the N-terminal NTE are formed beside the same side. Thus, the electronic device EA1 corresponding to the 3-phase inverter circuit can be configured irrespective of the positions at which the P-terminal PTE and the N-terminal NTE are arranged.

Embodiment 2

Figure 34:
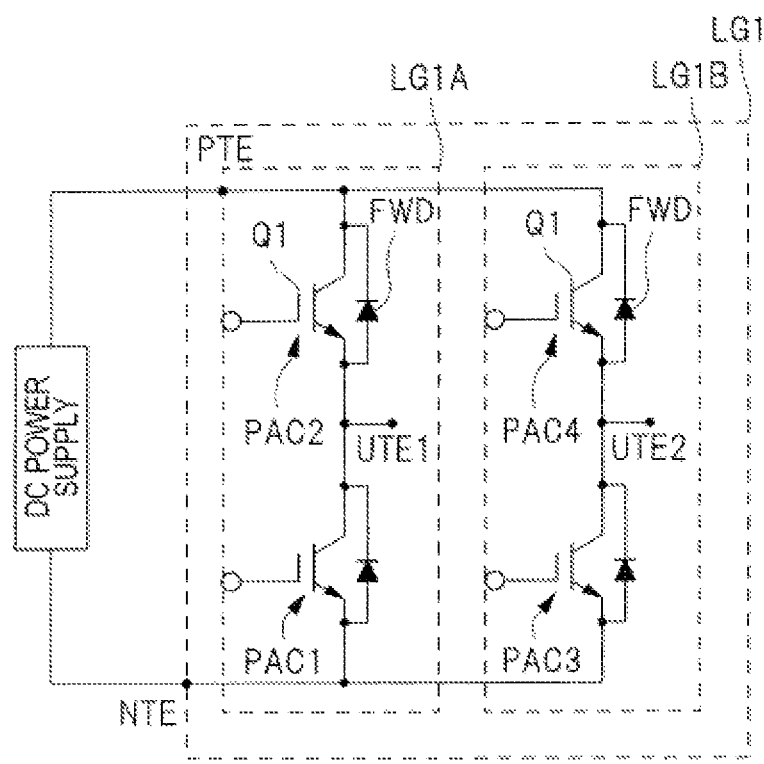
FIG. 34 is a circuit diagram showing an example in which attention is focused on a first leg among the first to third legs which is formed of two unit legs.

Next, a description will be given of a configuration of an electronic device unit in Embodiment 2. As shown in, e.g., FIG. 3, in a typical inverter circuit, each of the first to third legs LG1 to LG3 includes one upper arm and one lower arm. When a large current is allowed to flow in the inverter circuit and each of the first to third legs LG1 to LG3 is formed of one upper arm and one lower arm, the large current may conceivably surpass the tolerable amount of the current flowing in the upper and lower arms. To prevent this, when the large current is allowed to flow in the inverter circuit, e.g., each of the first to third legs LG1 to LG3 may be formed of a plurality of upper arms and a plurality of lower arms. FIG. 34 is a circuit diagram showing an example in which attention is focused on the first leg LG1 among the first to third legs LG1 to LG3 of the inverter circuit and the first leg LG1 is formed of a unit leg LG1A and a unit leg LG1B. In FIG. 34, as the output terminal of the unit leg LG1A, a U-terminal UTE1 is provided and, as the output terminal of the unit leg LG1B, a U-terminal UTE2 is provided. As a result, in the circuit shown in FIG. 34, even when a large current is allowed to flow, the current can be distributed to the unit leg LG1A and the unit leg LG1B. This can provide compatibility with a configuration in which a large current is allowed to flow in an inverter circuit.

<Configuration of Electronic Device Unit in Embodiment 2>

Figure 35:
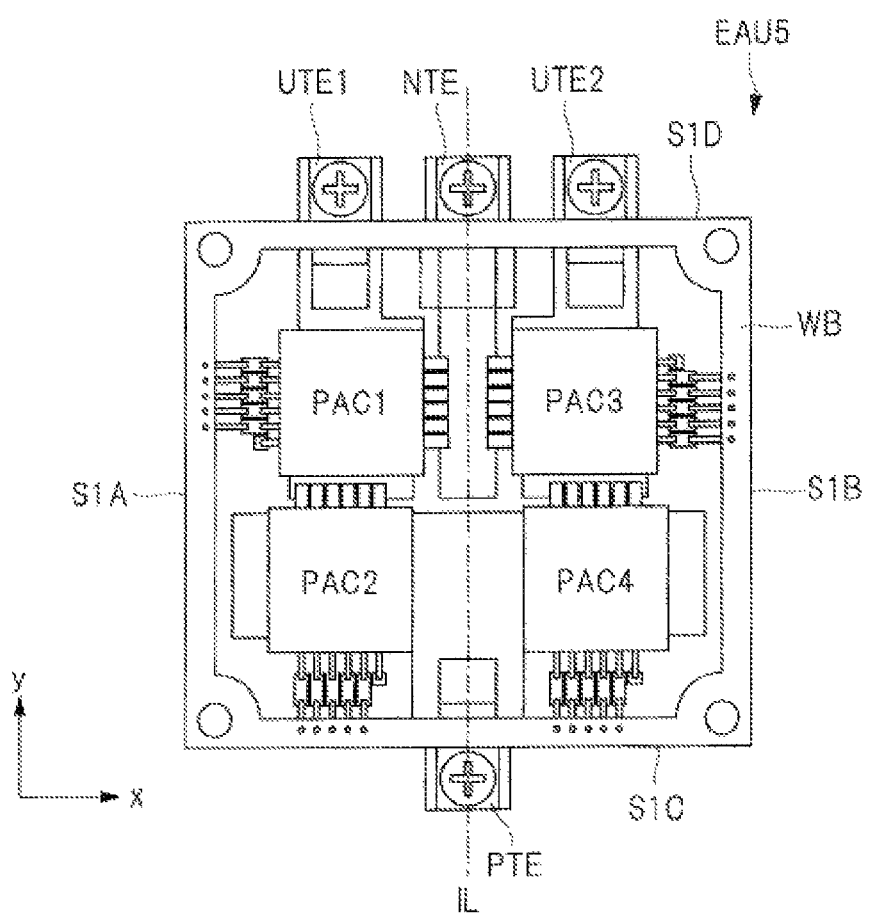
FIG. 35 is a schematic diagram showing a two-dimensional configuration of an electronic device unit in Embodiment 2.

Subsequently, a description will be given of a two-dimensional configuration of an electronic device unit EAU5 corresponding to the circuit shown in FIG. 34. FIG. 35 is a schematic diagram showing a two-dimensional configuration of the electronic device unit EAU5 in Embodiment 2. In FIG. 35, the wiring board WB has a rectangular shape, sides S1A and S1B extending in the y-direction, and sides S1C and S1D extending in the x-direction. On the wiring board WB, the semiconductor devices PAC1 and PAC2, a semiconductor device PAC3, and a semiconductor device PAC4 are mounted. The semiconductor devices PAC1 and PAC2 are the components of the unit leg LG1A shown in FIG. 34. In the semiconductor device PAC1, the IGBT Q1 and the diode FWD each forming the lower arm of the unit leg LG1A are formed. On the other hand, in the semiconductor device PAC2, the IGBT Q1 and the diode FWD each forming the upper arm of the unit leg LG1A are formed.

Likewise, the semiconductor devices PAC3 and PAC4 are the components of the unit leg LG1B shown in FIG. 34. In the semiconductor device PAC3, the IGBT Q1 and the diode FWD each forming the lower arm of the unit leg LG1B are formed. On the other hand, in the semiconductor device PAC4, the IGBT Q1 and the diode FWD each forming the upper arm of the unit leg LG1B are formed. Thus, the electronic device unit EAU5 in Embodiment 2 includes the four semiconductor devices PAC1 to PAC4 each formed of the same structure on the wiring board WB.

The semiconductor device PAC1 is mounted on the upper surface of the wiring board WB such that the emitter terminals of the semiconductor device PAC1 are electrically connected with the N-terminal NTE of the wiring board WB, and such that the collector terminal (die pad) formed on the back surface of the semiconductor device PAC1 is electrically connected with the U-terminal UTE1 of the wiring board WB.

The semiconductor device PAC2 is mounted on the upper surface of the wiring board WB such that the emitter terminals of the semiconductor device PAC2 are electrically connected with the U-terminal UTE1 of the wiring board WB, and such that the collector terminal (die pad) formed on the back surface of the semiconductor device PAC2 is electrically connected with the P-terminal PTE of the wiring board WB.

The semiconductor device PAC3 is mounted on the upper surface of the wiring board WB such that the emitter terminals of the semiconductor device PAC3 are electrically connected with the N-terminal NTE of the wiring board WB, and such that the collector terminal (die pad) formed on the back surface of the semiconductor device PAC3 is electrically connected with the U-terminal UTE2 of the wiring board WB.

The semiconductor device PAC4 is mounted on the upper surface of the wiring board WB such that the emitter terminals of the semiconductor device PAC4 are electrically connected with the U-terminal UTE2 of the wiring board WB, and such that the collector terminal (die pad) formed on the back surface of the semiconductor device PAC4 is electrically connected with the P-terminal PTE of the wiring board WB.

As shown in FIG. 35, the semiconductor device PAC2 is mounted on the upper surface the wiring board WB such that, in plan view, the orientation of the semiconductor device PAC2 is tilted at approximately 90 degrees with respect to the orientation of the semiconductor device PAC1. This allows a reduction in the length of the current path between the P-terminal PTE and the U-terminal UTE1. Likewise, the semiconductor device PAC4 is mounted on the upper surface of the wiring board WB such that, in plan view, the orientation of the semiconductor device PAC4 is tilted at approximately degrees with respect to the orientation of the semiconductor device PAC3. This allows a reduction in the length of the current path between the P-terminal PTE and the U-terminal UTE2.

At the side S1C of the wiring board WB, the P-terminal PTE is formed and, at the side S1D facing to the side S1C, the N-terminal NTE and the U-terminals UTE1 and UTE2 are formed. In particular, in Embodiment 2, each of the P-terminal PTE and the N-terminal NTE is placed on an imaginary line IL extending in the y-direction orthogonal to the x-direction. The U-terminals UTE1 and UTE2 are arranged at positions which are symmetrical with respect to the imaginary line IL. Likewise, the semiconductor devices PAC1 and PAC3 are arranged at positions which are symmetrical with respect to the imaginary line IL, and the semiconductor devices PAC2 and PAC4 are also arranged at positions symmetrical with respect to the imaginary line IL.

Consequently, as shown in FIG. 35, the current path between the P-terminal PTE and the U-terminal UTE1 and the current path between the P-terminal PTE and the U-terminal UTE2 are equal, while the current path between the U-terminal UTE1 and the N-terminal NTE and the current path between the U-terminal UTE2 and the N-terminal NTE are equal. As a result, the unit legs LG1A and LG1B shown in FIG. 34 are equal to each other and the current can be evenly distributed to the unit legs LG1A and LG1B. That is, in the electronic device unit EAU5 in Embodiment 2, by symmetrically arranging the U-terminals UTE1 and UTE2, symmetrically arranging the semiconductor devices PAC1 and PAC3, and symmetrically arranging the semiconductor devices PAC2 and PAC4, equal currents are allowed to flow to the unit legs LG1A and LG1B. Thus, in the electronic device unit EAU5 in Embodiment 2, the current is prevented from unevenly flowing in one of the unit legs. This can effectively prevent the current flowing in one of the unit legs from surpassing the tolerable value.

With regard to, e.g., the arrangement of the semiconductor devices PAC1 to PAC2, a brief description will be given of the arrangement/layout of the IGBTs and the diodes in the semiconductor devices PAC1 to PAC4.

Figure 36:
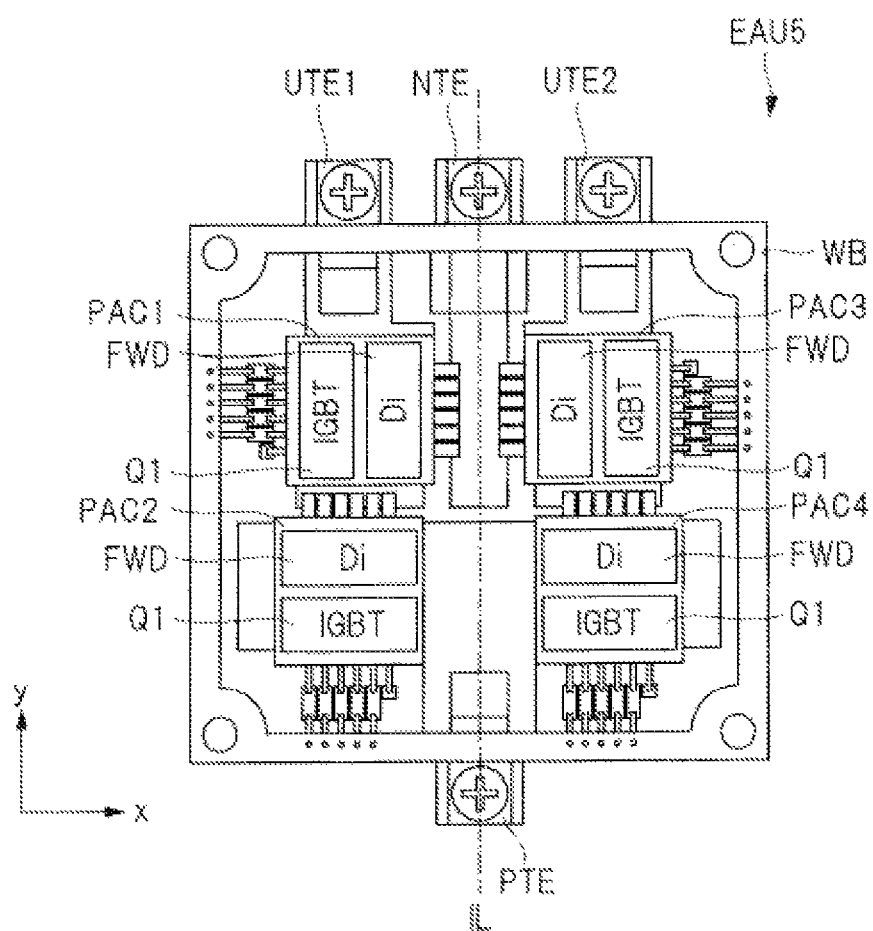
FIG. 36 is a schematic diagram showing the arrangement/layout of IGBTs and diodes in the semiconductor devices in the electronic device unit in Embodiment 2.

FIG. 36 is a schematic diagram showing the arrangement/layout of the IGBTs Q1 and the diodes FWD in the semiconductor devices PAC1 to PAC4 in the electronic device unit EAU5 in Embodiment 2. In FIG. 36, when attention is focused on each of the semiconductor devices PAC1 and PAC3, it can be seen that the IGBT Q1 and the diode FWD are arranged so as to be aligned in the x-direction. In particular, the positions at which the IGBT Q1 and the diode FWD each mounted in the semiconductor device PAC1 are arranged and the positions at which the IGBT Q1 and the diode FWD each mounted in the semiconductor device PAC3 are arranged are symmetrical with respect to the imaginary line.

Likewise, in FIG. 36, when attention is focused on each of the semiconductor devices PAC2 and PAC4, it can be seen that the IGBT Q1 and the diode FWD are arranged so as to be aligned in the y-direction. In particular, the positions at which the IGBT Q1 and the diode FWD each mounted in the semiconductor device PAC2 are arranged and the positions at which the IGBT Q1 and the diode FWD each mounted in the semiconductor device PAC4 are arranged are symmetrical with respect to the imaginary line.

On the other hand, in FIG. 36, when attention is focused on the semiconductor devices PAC1 and PAC2, it can be seen that the positions at which the IGBT Q1 and the diode FWD each mounted in the semiconductor device PAC1 are arranged are shifted by approximately 90 degrees from the positions at which the IGBT Q1 and the diode FWD each mounted in the semiconductor device PAC2 are arranged. Likewise, when attention is focused on the semiconductor devices PAC3 and PAC4, it can be seen that the positions at which the IGBT Q1 and the diode FWD each mounted in the semiconductor device PAC3 are arranged are shifted by approximately 90 degrees from the positions at which the IGBT Q1 and the diode FWD each mounted in the semiconductor device PAC4 are arranged.

Embodiment 3

Configuration of Electronic Device Unit in Embodiment 3

Figure 37:
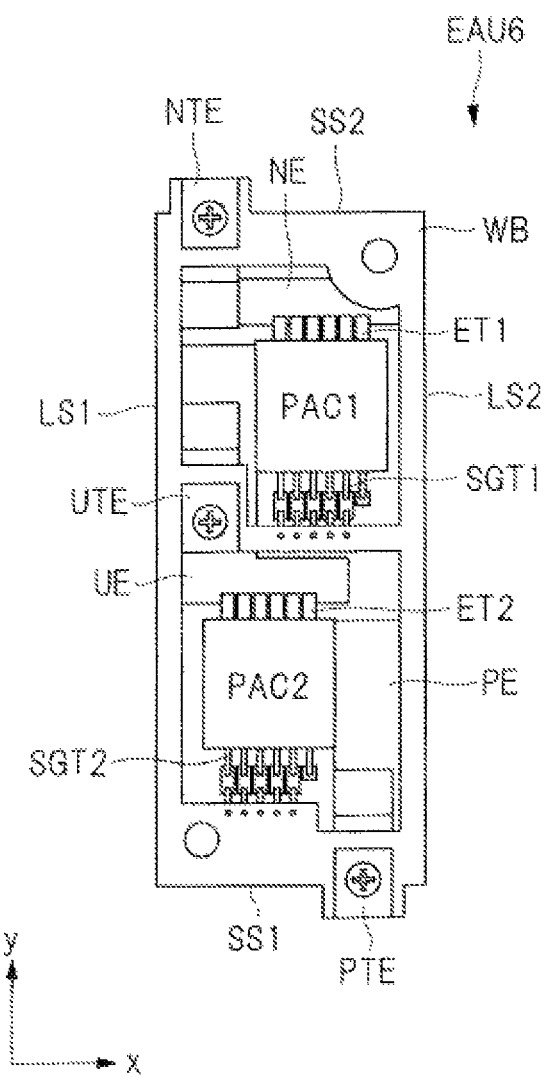
FIG. 37 is a schematic diagram showing a two-dimensional configuration of an electronic device unit in Embodiment 3.

Subsequently, a description will be given of a configuration of an electronic device unit in Embodiment 3. FIG. 37 is a schematic diagram showing a two-dimensional configuration of an electronic device unit EAU6 in Embodiment 3. In FIG. 37, the wiring board WB has a rectangular shape and the longer sides LS1 and LS2 extending in the y-direction. The wiring board WB also has the shorter sides SS1 and SS2 extending in the x-direction. In Embodiment 3, the P-terminal PTE is provided beside the shorter side SS1 and the N-terminal NTE is provided beside the shorter side SS2. On the other hand, the U-terminal UTE is provided at a position interposed between the P-terminal PTE and the N-terminal NTE in the y-direction orthogonal to the x-direction. The characteristic feature of Embodiment 3 lies in this point.

In the electronic device unit EAU6 in Embodiment 3, as shown in FIG. 37, the semiconductor devices PAC1 and PAC2 are mounted on the upper surface of the wiring board WB. At this time, in Embodiment 3, the semiconductor devices PAC1 and PAC2 have the same orientations. Specifically, the emitter terminals and the signal terminals of the semiconductor device PAC1 are arranged along the y-direction and the emitter terminals and the signal terminals of the semiconductor device PAC2 are also arranged along the y-direction.

The electronic device unit EAU6 thus configured in Embodiment 3 has a configuration different from that of the electronic device unit EAU1 in Embodiment 1 described above. However, in the electronic device unit EAU6 in Embodiment 3 also, the current path between, e.g., the P-terminal PTE and the U-terminal UTE can be reduced in the same manner as in Embodiment 1 described above.

A specific description will be given below of the advantage of Embodiment 3, while comparing the electronic device unit EAU6 in Embodiment 3 to the electronic device unit EAU(R) in the related art technology.

Figure 38B:
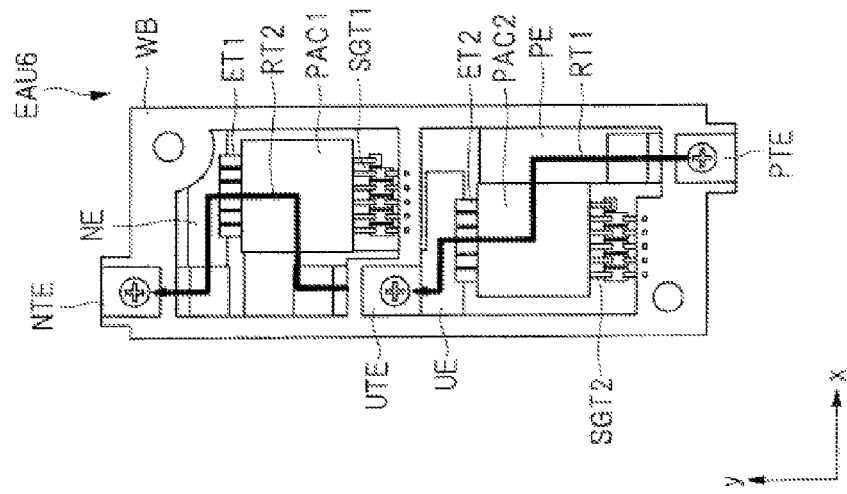
FIG. 38A is a schematic diagram showing a two-dimensional configuration of the electronic device unit in the related art technology and FIG. 38B is a schematic diagram showing the two-dimensional configuration of the electronic device unit in Embodiment 3.
Figure 38A:
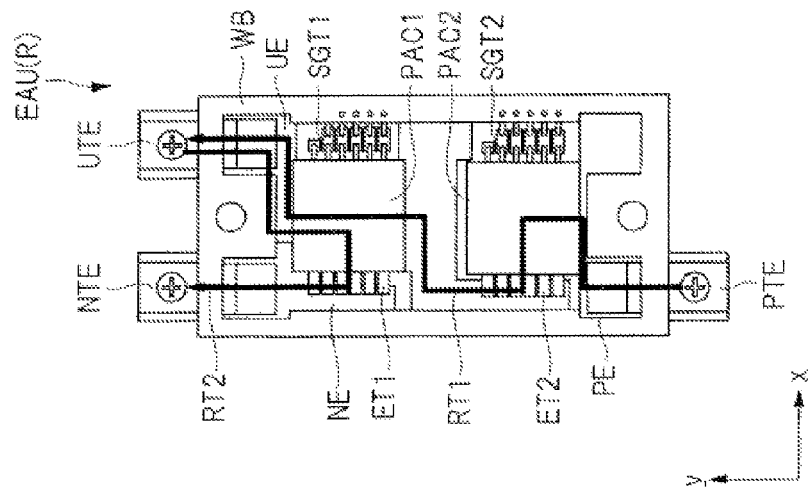

FIG. 38A is a schematic diagram showing the two-dimensional configuration of the electronic device unit EAU(R) in the related art technology. FIG. 38B is a schematic diagram showing a two-dimensional configuration of the electronic device unit EAU6 in Embodiment 3.

First, in FIG. 38A, in the related art technology, the semiconductor devices PAC1 and PAC2 mounted on the wiring board WB have the same orientations. That is, the emitter terminals ET1 and the signal terminals SGT1 of the semiconductor device PAC1 are arranged along the x-direction and the emitter terminals ET2 and the signal terminals SGT2 of the semiconductor device PAC2 are also arranged along the x-direction. In this case, as shown in FIG. 38A, the length of the current path RT2 between the U-terminal UTE and the N-terminal NTE is reduced, while the length of the current path RT1 between the P-terminal PTE and the U-terminal UTE is increased. Consequently, in the related art technology, the parasitic resistance between the P-terminal PTE and the U-terminal UTE undesirably increases. This means that, in the related art technology, the delay time in signal transmission defined by the product of the parasitic resistance and the parasitic capacitance in the current path RT1 increases. Thus, in the related art technology, there is a room for an improvement in terms of improving the performance of the electronic device represented by high-speed switching.

On the other hand, in the semiconductor device unit EAU6 in Embodiment 3 also, as shown in FIG. 38B, the semiconductor devices PAC2 and PAC1 have the same orientations. That is, in Embodiment 3, the emitter terminals and the signal terminals of the semiconductor device PAC1 are arranged along the y-direction and the emitter terminals and the signal terminals of the semiconductor device PAC2 are also arranged along the y-direction.

Thus, the electronic device unit EAU(R) in the related art technology and the electronic device unit EAU6 in Embodiment 3 are similar in that the semiconductor devices PAC2 and PAC1 have the same orientations. However, Embodiment 3 is different from the related art technology in that, as shown in FIG. 38B, the U-terminal UTE is provided at a position interposed between the P-terminal PTE and the N-terminal NTE in the y-direction orthogonal to the x-direction.

As a result, when FIGS. 38A and 38B are compared to each other, it can be seen that the current path RT1 between the P-terminal PTE and the U-terminal UTE shown in FIG. 38B is considerably shorter than the current path RT1 between the P-terminal PTE and the U-terminal UTE shown in FIG. 38A. That is, by providing the U-terminal UTE at a position interposed between the P-terminal PTE and the N-terminal NTE in the y-direction orthogonal to the x-direction as in Embodiment 3, in the electronic device unit EAU6 in Embodiment 3, the length of the current path RT1 can be reduced to be shorter than in the related art technology which is similar to Embodiment 3 in that the semiconductor devices PAC1 and PAC2 have the same orientations. As a result, according to Embodiment 3, the parasitic resistance between the P-terminal PTE and the U-terminal UTE can be reduced to be lower than in the related art technology. This means that, in the electronic device unit EAU6 in Embodiment 3, the delay time in signal transmission defined by the product of the parasitic resistance and the parasitic capacitance in the current path RT1 can be reduced to be shorter than in the related art technology. Therefore, with the electronic device unit EAU6 in Embodiment 3, the performance of the electronic device represented by high-speed switching can be improved. Also in Embodiment 3, as shown in FIG. 38B, the length of the current path RT1 between the P terminal PTE and the U terminal UTE is substantially equal to the length of the current path RT2 between the U-terminal UTE and the N-terminal NTE. This can provide the advantage of being able to reduce not only the length of the current path RT1, but also the length of the current path RT2.

<Modification>

Figure 39:
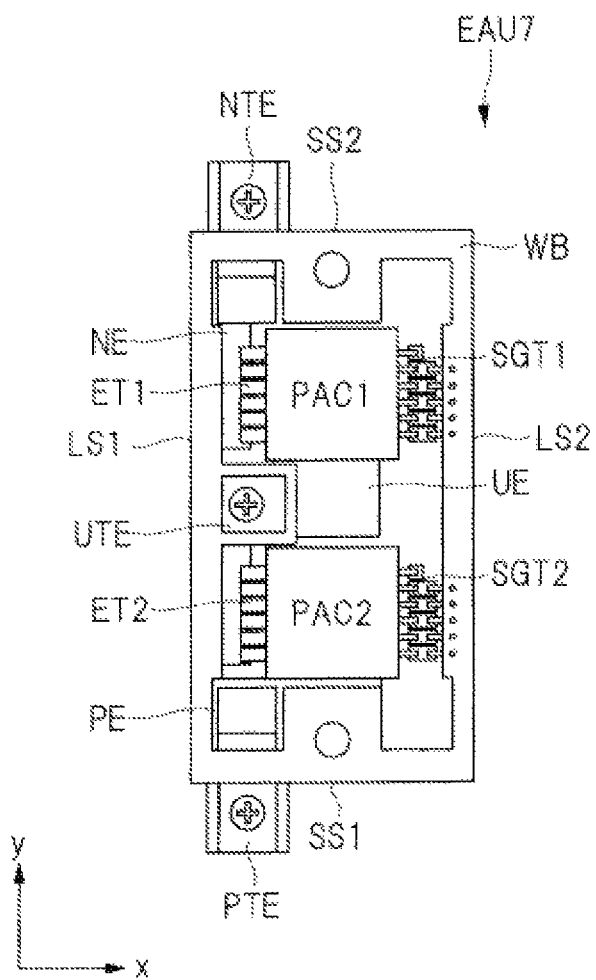
FIG. 39 is a schematic diagram showing a two-dimensional configuration of an electronic device unit in Modification of Embodiment 3.

Next, a description will be given of Modification of Embodiment 3. FIG. 39 is a schematic diagram showing a two-dimensional configuration of an electronic device unit EAU7 in Modification. In FIG. 39, the configuration of the electronic device unit EAU7 in Modification is substantially the same as the configuration of the electronic device unit EAU6 in Embodiment 3 shown in FIG. 37 so that a description will be given mainly of the difference therebetween.

The electronic device unit EAU7 in Modification is similar to the electronic device unit EAU6 in Embodiment 3 in that, in the same manner as in Embodiment 3, the semiconductor devices PAC1 and PAC2 have the same orientations. On the other hand, in Embodiment 3, as shown in FIG. 37, the emitter terminals and the signal terminals of the semiconductor device PAC1 are arranged along the y-direction of the wiring board WB and the emitter terminals and the signal terminals of the semiconductor device PAC2 are also arranged along the y-direction of the wiring board WB.

By contrast, in the electronic device unit EAU7 in Modification, as shown in FIG. 39, the emitter terminals and the signal terminals of the semiconductor device PAC1 are arranged along the x-direction of the wiring board WB and the emitter terminals and the signal terminals of the semiconductor device PAC2 are also arranged along the x-direction of the wiring board WB.

A specific description will be given below of the advantage of Modification, while comparing the electronic device unit EAU7 in Modification to the electronic device unit EAU(R) in the related art technology.

FIG. 40A is a schematic diagram showing the two-dimensional configuration of the electronic device unit EAU(R) in the related art technology. FIG. 40B is a schematic diagram showing a two-dimensional configuration of the electronic device unit EAU7 in Modification.

First, in FIG. 40A, in the related art technology, the semiconductor devices PAC1 and PAC2 mounted on the wiring board WB have the same orientations. That is, the emitter terminals ET1 and the signal terminals SGT1 of the semiconductor device PAC1 are arranged along the x-direction and the emitter terminals ET2 and the signal terminals SGT2 of the semiconductor device PAC2 are also arranged along the x-direction. In this case, as shown in FIG. 40A, the length of the current path RT2 between the U-terminal UTE and the N-terminal NTE is reduced, while the length of the current path RT1 between the P-terminal PTE and the U-terminal UTE is increased. Consequently, in the related art technology, the parasitic resistance between the P-terminal PTE and the U-terminal UTE undesirably increases. This means that, in the related art technology, the delay time in signal transmission defined by the product of the parasitic resistance and the parasitic capacitance in the current path RT1 increases. Thus, in the related art technology, there is a room for an improvement in terms of improving the performance of the electronic device represented by high-speed switching.

On the other hand, in the semiconductor device unit EAU7 in Modification also, as shown in FIG. 40B, the semiconductor devices PAC2 and PAC1 have the same orientations. That is, in Modification, the emitter terminals ET1 and the signal terminals SGT1 of the semiconductor device PAC1 are arranged along the x-direction of the wiring board WB and the emitter terminals ET2 and the signal terminals SGT2 of the semiconductor device PAC2 are also arranged along the x-direction.

Thus, the electronic device unit EAU(R) in the related art technology and the electronic device unit EAU7 in Modification are similar in that the semiconductor devices PAC2 and PAC1 have the same orientations. However, Modification is different from the related art technology in that, as shown in FIG. 40B, the U-terminal UTE is provided at a position interposed between the P-terminal PTE and the N-terminal NTE in the y-direction orthogonal to the x-direction.

As a result, when FIGS. 40A and 40B are compared to each other, it can be seen that the current path RT1 between the P-terminal PTE and the U-terminal UTE shown in FIG. 40B is considerably shorter than the current path RT1 between the P-terminal PTE and the U-terminal UTE shown in FIG. 40A. That is, by providing the U-terminal UTE at a position interposed between the P-terminal PTE and the N-terminal NTE in the y-direction orthogonal to the x-direction as in Modification, in the electronic device unit EAU7 in Modification, the length of the current path RT1 can be reduced to be shorter than in the related art technology which is similar to Modification in that the semiconductor devices PAC1 and PAC2 have the same orientations. As a result, according to Modification, the parasitic resistance between the P-terminal PTE and the U-terminal UTE can be reduced to be lower than in the related art technology. This means that, in the electronic device unit EAU7 in Embodiment 1, the delay time in signal transmission defined by the product of the parasitic resistance and the parasitic capacitance in the current path RT1 can be reduced to be shorter than in the related art technology. Therefore, with the electronic device unit EAU7 in Modification, the performance of the electronic device represented by high-speed switching can be improved.

Additionally, in Modification, the effect shown below can also be obtained. That is, as shown in FIG. 40B, in the semiconductor device PAC2, the current path RT1 is orthogonal to the signal terminals SGT2 including the gate terminal. As a result, in the electronic device unit EAU7 in Modification, it is possible to reduce the influence of electromagnetically induced noise resulting from the flow of a large current in the current path RT1. In other words, in the electronic device unit EAU7 in Modification, even when a large current is allowed to flow, the possibility of an erroneous operation of the electronic device unit EAU7 can be reduced. Thus, according to Modification, it is possible to improve the operation reliability of the electronic device unit EAU7.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

The embodiments described above include the aspects shown below.

(Note 1)

A method of manufacturing an electronic device, including the steps of: (a) providing a wiring board including a first surface, a first electrode formed on the first surface, a second electrode formed on the first surface, a third electrode formed on the first surface, a first external terminal electrically connected with the first electrode, a second external terminal electrically connected with the second electrode, a third external terminal electrically connected with the third electrode, and a second surface opposite to the first surface; (b)

providing first and second semiconductor devices each including first and second semiconductor chips, a first external connection terminal electrically connected with the first and second semiconductor chips, a second external connection terminal electrically connected with the first and second semiconductor chips, a third external connection terminal electrically connected with the first semiconductor chip, and a sealing body in which the first and second semiconductor chips are sealed; and (c) mounting the first and second semiconductor devices on the first surface of the wiring board, wherein, in the wiring board provided in the step (a), the first surface of the wiring board has a pair of longer sides and first and second shorter sides as a pair of shorter sides intersecting the pair of longer sides, wherein the first external terminal is provided beside either one of the pair of shorter sides, wherein the second external terminal is provided beside either one of the pair of shorter sides, wherein the third external terminal is provided beside either one of the pair of shorter sides, wherein the first shorter side is provided with at least one of the first, second, and third external terminals, wherein the second shorter side is provided with at least one of the first, second, and third external terminals other than the external terminal provided at the first shorter side, wherein, in each of the first and second semiconductor devices provided in the step (b), the first semiconductor chip is formed with a first insulated gate bipolar transistor including an emitter electrode, a collector electrode, and a gate electrode, the second semiconductor chip is formed with a diode including an anode electrode, and a cathode electrode, the first external connection terminal is electrically connected with the emitter electrode of the first semiconductor chip and the anode electrode of the second semiconductor chip, the second external connection terminal is electrically connected with the collector electrode of the first semiconductor chip and the cathode electrode of the second semiconductor chip, the third external connection terminal is electrically connected with the gate electrode of the first semiconductor chip, the sealing body has an upper surface, a lower surface opposite to the upper surface, a first side surface located between the upper surface and the lower surface, and a second side surface located between the upper surface and the lower surface and facing to the first side surface, the first external connection terminal is placed beside the first side surface of the sealing body, the second external connection terminal is placed on the lower surface of the sealing body, and the third external connection terminal is placed beside the second side surface of the sealing body, and wherein, in the step (c), the second semiconductor device is mounted on the first surface of the wiring board such that the first external connection terminal of the first semiconductor device is electrically connected with the third electrode of the wiring board, and such that the second external connection terminal of the first semiconductor device is electrically connected with the second electrode of the wiring board, the first semiconductor device is mounted on the first surface of the wiring board such that the first external connection terminal of the second semiconductor device is electrically connected with the second electrode of the wiring board, and such that the second external connection terminal of the second semiconductor device is electrically connected with the first electrode of the wiring board, and the second semiconductor device is mounted on the first surface of the wiring board such that, in plan view, an orientation of the second semiconductor device intersects an orientation of the first semiconductor device.

(Note 2)

An electronic device, including: (a) a wiring board having a first surface, a first electrode formed on the first surface, a second electrode formed on the first surface, a third electrode formed on the first surface, a fourth electrode formed on the first surface, a first external terminal electrically connected with the first electrode, a second external terminal electrically connected with the second electrode, a third external terminal electrically connected with the third electrode, a fourth external terminal electrically connected with the fourth electrode, and a second surface opposite to the first surface; (b) a first semiconductor device including first and second semiconductor chips, a first external connection terminal electrically connected with the first and second semiconductor chips, a second external connection terminal electrically connected with the first and second semiconductor chips, a third external connection terminal electrically connected with the first semiconductor chip, and a sealing body in which the first and second semiconductor chips are sealed; (c) a second semiconductor device formed to have the same structure as that of the first semiconductor device; (d) a third semiconductor device formed to have the same structure as that of the first semiconductor device; and (e) a fourth semiconductor device formed to have the same structure as that of the first semiconductor device, wherein the first surface of the wiring board has a first side extending in a first direction, and a second side extending in the first direction to face to the first side, wherein the first external terminal is provided beside the first side, wherein the second external terminal is provided beside the second side, wherein the third external terminal is provided beside the second side, wherein the fourth external terminal is provided beside the second side so as to be interposed between the second and third external terminals, wherein the first semiconductor chip is formed with a first insulated gate bipolar transistor including an emitter electrode, a collector electrode, and a gate electrode, wherein the second semiconductor chip is formed with a diode including an anode electrode, and a cathode electrode, wherein the first external connection terminal is electrically connected with the emitter electrode of the first semiconductor chip and the anode electrode of the second semiconductor chip, wherein the second external connection terminal is electrically connected with the collector electrode of the first semiconductor chip and the cathode electrode of the second semiconductor chip, wherein the third external connection terminal is electrically connected with the gate electrode of the first semiconductor chip, wherein the sealing body has an upper surface, a lower surface opposite to the upper surface, a first side surface located between the upper surface and the lower surface, and a second side surface located between the upper surface and the lower surface and facing to the first side surface, wherein the first external connection terminal is placed beside the first side surface of the sealing body, wherein the second external connection terminal is placed on the lower surface of the sealing body, wherein the third external connection terminal is placed beside the second side surface of the sealing body, wherein the first semiconductor device is mounted on the first surface of the wiring board such that the first external connection terminal of the second semiconductor device is electrically connected with the fourth electrode of the wiring board, and such that the second external connection terminal of the first semiconductor device is electrically connected with the second electrode of the wiring board, wherein the second semiconductor device is mounted on the first surface of the wiring board such that the first external connection terminal of the second semiconductor device is electrically connected with the second electrode of the wiring board, and such that the second external connection terminal of the second semiconductor device is electrically connected with the first electrode of the wiring board, wherein the third semiconductor device is mounted on the first surface of the wiring board such that the first external connection terminal of the third semiconductor device is electrically connected with the fourth electrode of the wiring board, and such that the second external connection terminal of the third semiconductor device is electrically connected with the third electrode of the wiring board, wherein the fourth semiconductor device is mounted on the first surface of the wiring board such that the first external connection terminal of the fourth semiconductor device is electrically connected with the third electrode of the wiring board, and such that the second external connection terminal of the fourth semiconductor device is electrically connected with the first electrode of the wiring board, wherein the second semiconductor device is mounted on the first surface of the wiring board such that, in plan view, an orientation of the second semiconductor device intersects an orientation of the first semiconductor device, and wherein the fourth semiconductor device is mounted on the first surface of the wiring board such that, in plan view, an orientation of the fourth semiconductor device intersects an orientation of the third semiconductor device.

(Note 3)

The electronic device recited in Note 2, wherein each of the first and fourth external terminals is placed on an imaginary line extending in a second direction orthogonal to the first direction, wherein the second and third external terminals are arranged at positions symmetrical with respect to the imaginary line, wherein the first and third semiconductor devices are arranged at positions symmetrical with respect to the imaginary line, and wherein the second and fourth semiconductor devices are arranged at positions symmetrical with respect to the imaginary line.

(Note 4)

An electronic device, including: (a) a wiring board having a first surface, a first electrode formed on the first surface, a second electrode formed on the first surface, a third electrode formed on the first surface, a first external terminal electrically connected with the first electrode, a second external terminal electrically connected with the second electrode, a third external terminal electrically connected with the third electrode, and a second surface opposite to the first surface; and (b) first and second semiconductor devices each including first and second semiconductor chips, a first external connection terminal electrically connected with the first and second semiconductor chips, a second external connection terminal electrically connected with the first and second semiconductor chips, a third external connection terminal electrically connected with the first semiconductor chip, and a sealing body in which the first and second semiconductor chips are sealed, wherein the first surface of the wiring board has a first side extending in a first direction, and a second side extending in the first direction to face to the first side, wherein the first external terminal is provided beside the first shorter side, wherein the third external terminal is provided beside the second shorter side, wherein the second external terminal is provided at a position interposed between the first and third external terminals in a second direction orthogonal to the first direction, wherein the first semiconductor chip is formed with a first insulated gate bipolar transistor including an emitter electrode, a collector electrode, and a gate electrode, wherein the second semiconductor chip is formed with a diode including an anode electrode, and a cathode electrode, wherein the first external connection terminal is electrically connected with the emitter electrode of the first semiconductor chip and the anode electrode of the second semiconductor chip, wherein the second external connection terminal is electrically connected with the collector electrode of the first semiconductor chip and the cathode electrode of the second semiconductor chip, wherein the third external connection terminal is electrically connected with the gate electrode of the first semiconductor chip, wherein the sealing body has an upper surface, a lower surface opposite to the upper surface, a first side surface located between the upper surface and the lower surface, and a second side surface located between the upper surface and the lower surface and facing to the first side surface, wherein the first external connection terminal is placed beside the first side surface of the sealing body, wherein the second external connection terminal is placed on the lower surface of the sealing body, wherein the third external connection terminal is placed beside the second side surface of the sealing body, wherein the first semiconductor device is mounted on the first surface of the wiring board such that the first external connection terminal of the first semiconductor device is electrically connected with the third electrode of the wiring board, and such that the second external connection terminal of the first semiconductor device is electrically connected with the second electrode of the wiring board, and wherein the second semiconductor device is mounted on the first surface of the wiring board such that the first external connection terminal of the second semiconductor device is electrically connected with the second electrode of the wiring board, and such that the second external connection terminal of the second semiconductor device is electrically connected with the first electrode of the wiring board.

What is claimed is:

1. An electronic device, comprising:
   (a) a wiring board having a first surface, a first electrode formed on the first surface, a second electrode formed on the first surface, a third electrode formed on the first surface, a first external terminal electrically connected with the first electrode, a second external terminal electrically connected with the second electrode, a third external terminal electrically connected with the third electrode, and a second surface opposite to the first surface; and
   (b) first and second semiconductor devices each including first and second semiconductor chips, a first external connection terminal electrically connected with the first and second semiconductor chips, a second external connection terminal electrically connected with the first and second semiconductor chips, a third external connection terminal electrically connected with the first semiconductor chip, and a sealing body in which the first and second semiconductor chips are sealed,
   wherein the first surface of the wiring board has a pair of longer sides, and first and second shorter sides as a pair of shorter sides intersecting the pair of longer sides,
   wherein the first external terminal is provided beside either one of the pair of shorter sides,
   wherein the second external terminal is provided beside either one of the pair of shorter sides,
   wherein the third external terminal is provided beside either one of the pair of shorter sides,
   wherein the first shorter side is provided with at least one of the first, second, and third external terminals,
   wherein the second shorter side is provided with at least one of the first, second, and third external terminals other than the external terminal provided at the first shorter side,
   wherein a first insulated gate bipolar transistor including an emitter electrode, a collector electrode, and a gate electrode is formed in the first semiconductor chip, wherein the second semiconductor chip is formed with a diode including an anode electrode, and a cathode electrode, wherein the first external connection terminal is electrically connected with the emitter electrode of the first semiconductor chip and the anode electrode of the second semiconductor chip, wherein the second external connection terminal is electrically connected with the collector electrode of the first semiconductor chip and the cathode electrode of the second semiconductor chip, wherein the third external connection terminal is electrically connected with the gate electrode of the first semiconductor chip, wherein the sealing body has an upper surface, a lower surface opposite to the upper surface, a first side surface located between the upper surface and the lower surface, and a second side surface located between the upper surface and the lower surface and facing to the first side surface, wherein the first external connection terminal is placed beside the first side surface of the sealing body, wherein the second external connection terminal is placed on the lower surface of the sealing body, wherein the third external connection terminal is placed beside the second side surface of the sealing body, wherein the first semiconductor device is mounted over the first surface of the wiring board such that the first external connection terminal of the first semiconductor device is electrically connected with the third electrode of the wiring board, and such that the second external connection terminal of the first semiconductor device is electrically connected with the second electrode of the wiring board, wherein the second semiconductor device is mounted over the first surface of the wiring board such that the first external connection terminal of the second semiconductor device is electrically connected with the second electrode of the wiring board, and such that the second external connection terminal of the second semiconductor device is electrically connected with the first electrode of the wiring board, and wherein the second semiconductor device is mounted over the first surface of the wiring board such that, in plan view, an orientation of the second semiconductor device intersects an orientation of the first semiconductor device.

2. An electronic device according to claim 1,
wherein the first external terminal is provided beside the first shorter side, and
wherein the third external terminal is provided beside the second shorter side.

3. An electronic device according to claim 2,
wherein the wiring board over which the first and second semiconductor devices are mounted includes a plurality of the wiring boards, and
wherein the wiring boards are arranged to be aligned in a first direction in which the pair of shorter sides extend.

4. An electronic device according to claim 3,
wherein the first external terminals individually provided over the wiring boards are electrically connected with each other by a first connection member extending in the first direction, and
wherein the third external terminals individually provided over the wiring boards are electrically connected with each other by a second connection member extending in the first direction.

5. An electronic device according to claim 4,
wherein, between the first and second connection members, a capacitor element is connected.

6. An electronic device according to claim 1,
wherein the first external terminal is provided beside the first shorter side,
wherein the second external terminal is provided beside the second shorter side, and
wherein the third external terminal is provided beside the first shorter side.

7. An electronic device according to claim 6,
wherein the wiring board over which the first and second semiconductor devices are mounted includes a plurality of the wiring boards, and
wherein the wiring boards are arranged to be aligned in a first direction in which the pair of shorter sides extend.

8. An electronic device according to claim 7,
wherein, between the first and third external terminals provided over each of the wiring boards, a capacitor element is connected.

9. An electronic device according to claim 1,
wherein each of the first and second semiconductor devices further includes a plurality of fourth external connection terminals electrically connected with the first semiconductor chip, and
wherein the fourth external connection terminals are arranged beside the second side surface of the sealing body.

10. An electronic device according to claim 9,
wherein the first semiconductor chip is further formed with a temperature sensing diode which senses a temperature of the first semiconductor chip, and a second insulated gate bipolar transistor which senses an overcurrent in the first insulated gate bipolar transistor, and
wherein the fourth external connection terminals include a terminal electrically connected with the temperature sensing diode, a terminal electrically connected with the second insulated gate bipolar transistor, and a terminal electrically connected with the emitter electrode of the first insulated gate bipolar transistor.

11. An electronic device according to claim 1,
wherein the first external connection terminal protrudes from the first side surface of the sealing body,
wherein the second external connection terminal is exposed from the lower surface of the sealing body, and
wherein the third external connection terminal protrudes from the second side surface of the sealing body.

12. An electronic device according to claim 1,
wherein the first external connection terminal is electrically connected with each of the emitter electrode of the first semiconductor chip and the anode electrode of the second semiconductor chip via a plate-like member.

13. An electronic device according to claim 1,
wherein the third external connection terminal is electrically connected with the gate electrode of the first semiconductor chip via a conductive wire.

14. An electronic device according to claim 1,
wherein the first external connection terminal is divided into a plurality of portions.

15. An electronic device according to claim 1,
wherein the electronic device is a component of an inverter circuit.

16. An electronic device, comprising:
(a) a wiring board having a first surface, a first electrode formed over the first surface, a second electrode formed over the first surface, a third electrode formed over the first surface, a first external terminal electrically connected with the first electrode, a second external terminal electrically connected with the second electrode, a third external terminal electrically connected with the third electrode, and a second surface opposite to the first surface; and (b) first and second semiconductor devices each including first and second semiconductor chips, a first external connection terminal electrically connected with the first and second semiconductor chips, a second external connection terminal electrically connected with the first and second semiconductor chips, a third external connection terminal electrically connected with the first semiconductor chip, and a sealing body in which the first and second semiconductor chips are sealed, wherein the first surface of the wiring board has a pair of longer sides and first and second shorter sides as a pair of shorter sides intersecting the pair of longer sides, wherein the first external terminal is provided beside either one of the pair of shorter sides, wherein the second external terminal is provided beside either one of the pair of shorter sides, wherein the third external terminal is provided beside either one of the pair of shorter sides, wherein the first shorter side is provided with at least one of the first, second, and third external terminals, wherein the second shorter side is provided with at least one of the first, second, and third external terminals other than the external terminal provided at the first shorter side, wherein the first semiconductor chip is formed with a first insulated gate bipolar transistor including an emitter electrode, a collector electrode, and a gate electrode, wherein the second semiconductor chip is formed with a diode including an anode electrode, and a cathode electrode, wherein the first external connection terminal is electrically connected with the emitter electrode of the first semiconductor chip and the anode electrode of the second semiconductor chip, wherein the second external connection terminal is electrically connected with the collector electrode of the first semiconductor chip and the cathode electrode of the second semiconductor chip, wherein the third external connection terminal is electrically connected with the gate electrode of the first semiconductor chip, wherein the sealing body has an upper surface, a lower surface opposite to the upper surface, a first side surface located between the upper surface and the lower surface, and a second side surface located between the upper surface and the lower surface and facing to the first side surface, wherein the first external connection terminal is placed beside the first side surface of the sealing body, wherein the second external connection terminal is placed over the lower surface of the sealing body, wherein the third external connection terminal is placed beside the second side surface of the sealing body, wherein the first semiconductor device is mounted over the first surface of the wiring board such that the first external connection terminal of the first semiconductor device is electrically connected with the third electrode of the wiring board, and such that the second external connection terminal of the first semiconductor device is electrically connected with the second electrode of the wiring board, wherein the second semiconductor device is mounted over the first surface of the wiring board such that the first external connection terminal of the second semiconductor device is electrically connected with the second electrode of the wiring board, and such that the second external connection terminal of the second semiconductor device is electrically connected with the first electrode of the wiring board, wherein the first semiconductor device is mounted over the first surface of the wiring board such that the first and third external connection terminals of the first semiconductor device are arranged along a first direction in which the pair of shorter sides of the wiring board extend, and wherein the second semiconductor device is mounted over the first surface of the wiring board such that the first and third external connection terminals of the second semiconductor device are arranged along a second direction in which the pair of longer sides of the wiring board extend.

17. An electronic device, comprising:

(a) a wiring board having a first surface, a first electrode formed over the first surface, a second electrode formed over the first surface, a third electrode formed over the first surface, a first external terminal electrically connected with the first electrode, a second external terminal electrically connected with the second electrode, a third external terminal electrically connected with the third electrode, and a second surface opposite to the first surface; and (b) first and second semiconductor devices each including first and second semiconductor chips, a first external connection terminal electrically connected with the first and second semiconductor chips, a second external connection terminal electrically connected with the first and second semiconductor chips, a third external connection terminal electrically connected with the first semiconductor chip, and a sealing body in which the first and second semiconductor chips are sealed, wherein the first surface of the wiring board has a pair of longer sides and first and second shorter sides as a pair of shorter sides intersecting the pair of longer sides, wherein the first external terminal is provided beside either one of the pair of shorter sides, wherein the second external terminal is provided beside either one of the pair of shorter sides, wherein the third external terminal is provided beside either one of the pair of shorter sides, wherein the first shorter side is provided with at least one of the first, second, and third external terminals, wherein the second shorter side is provided with at least one of the first, second, and third external terminals other than the external terminal provided at the first shorter side, wherein the first semiconductor chip is formed with a first insulated gate bipolar transistor including an emitter electrode, a collector electrode, and a gate electrode, wherein the second semiconductor chip is formed with a diode including an anode electrode, and a cathode electrode, wherein the first external connection terminal is electrically connected with the emitter electrode of the first semiconductor chip and the anode electrode of the second semiconductor chip, wherein the second external connection terminal is electrically connected with the collector electrode of the first semiconductor chip and the cathode electrode of the second semiconductor chip, wherein the third external connection terminal is electrically connected with the gate electrode of the first semiconductor chip, wherein the sealing body has an upper surface, a lower surface opposite to the upper surface, a first side surface located between the upper surface and the lower surface, and a second side surface located between the upper surface and the lower surface and facing to the first side surface, wherein the first external connection terminal is placed beside the first side surface of the sealing body, wherein the second external connection terminal is placed over the lower surface of the sealing body, wherein the third external connection terminal is placed beside the second side surface of the sealing body, wherein the first semiconductor device is mounted over the first surface of the wiring board such that the first external connection terminal of the first semiconductor device is electrically connected with the third electrode of the wiring board, and such that the second external connection terminal of the first semiconductor device is electrically connected with the second electrode of the wiring board, wherein the second semiconductor device is mounted over the first surface of the wiring board such that the first external connection terminal of the second semiconductor device is electrically connected with the second electrode of the wiring board, and such that the second external connection terminal of the second semiconductor device is electrically connected with the first electrode of the wiring board, wherein the first semiconductor device is mounted over the first surface of the wiring board such that the first and third external connection terminals of the first semiconductor device are arranged along a first direction in which the pair of shorter sides of the wiring board extend, wherein the second semiconductor device is mounted over the first surface of the wiring board such that the first and third external connection terminals of the second semiconductor device are arranged along the first direction in which the pair of shorter sides of the wiring board extend, and wherein, when a straight line passing through a tip portion of the first external connection terminal of the first semiconductor device and extending in a second direction parallel with the pair of longer sides of the wiring board is a first imaginary line and a straight line passing through a tip portion of the first external connection terminal of the second semiconductor device and extending in the second direction is a second imaginary line, a position of the first imaginary line in the first direction is different from a position of the second imaginary line in the first direction.

18. An electronic device according to claim 17, wherein, when a straight line passing through a center of the first semiconductor device in the first direction is a center line, a position of the center line in the first direction coincides with a position of the second imaginary line in the first direction.

* * * * *